United States Patent
Tanaka

(10) Patent No.: US 11,204,367 B2
(45) Date of Patent: Dec. 21, 2021

(54) PHYSICAL QUANTITY SENSOR, PHYSICAL QUANTITY SENSOR DEVICE, COMPLEX SENSOR DEVICE, INERTIAL MEASUREMENT UNIT, AND VEHICLE

(71) Applicant: Seiko Epson Corporation, Tokyo (JP)

(72) Inventor: Satoru Tanaka, Chino (JP)

(73) Assignee: Seiko Epson Corporation

( * ) Notice: Subject to any disclaimer, the term of this patent is extended or adjusted under 35 U.S.C. 154(b) by 355 days.

(21) Appl. No.: 16/201,198

(22) Filed: Nov. 27, 2018

(65) Prior Publication Data

US 2019/0162754 A1 May 30, 2019

(30) Foreign Application Priority Data

Nov. 28, 2017 (JP) .............................. JP2017-228264

(51) Int. Cl.
*G01P 15/125* (2006.01)
*G01P 15/08* (2006.01)
*B81B 5/00* (2006.01)
*G01P 15/18* (2013.01)
*G01P 3/00* (2006.01)

(52) U.S. Cl.
CPC .............. *G01P 15/125* (2013.01); *B81B 5/00* (2013.01); *G01P 15/0802* (2013.01); *G01P 15/18* (2013.01); *G01P 3/00* (2013.01); *G01P 2015/0814* (2013.01); *G01P 2015/0831* (2013.01); *G01P 2015/0882* (2013.01)

(58) Field of Classification Search
CPC .............................................. G01P 2015/0814
See application file for complete search history.

(56) References Cited

U.S. PATENT DOCUMENTS

| | | | | |
|---|---|---|---|---|
| 2007/0272017 A1* | 11/2007 | LaFond | ................. | G01P 15/131 |
| | | | | 73/514.01 |
| 2011/0083506 A1* | 4/2011 | Classen | ................. | G01P 15/125 |
| | | | | 73/504.12 |
| 2015/0301075 A1* | 10/2015 | Yamanaka | ............ | B81B 3/0072 |
| | | | | 73/1.38 |
| 2016/0257557 A1* | 9/2016 | Wu | ....................... | G01P 15/125 |
| 2016/0264401 A1* | 9/2016 | Liukku | ................ | B81B 3/0086 |
| 2016/0356806 A1* | 12/2016 | Malvern | ............... | G01P 15/125 |
| 2017/0219620 A1* | 8/2017 | Jeong | ...................... | G01P 15/08 |
| 2017/0343579 A1* | 11/2017 | Leinfelder | ............. | G01P 21/00 |
| 2018/0156839 A1* | 6/2018 | Tanaka | ............ | B60G 17/01941 |
| 2019/0041422 A1* | 2/2019 | Malvern | ............... | G01P 15/131 |

FOREIGN PATENT DOCUMENTS

JP 2007-139505 A 6/2007

* cited by examiner

*Primary Examiner* — Alexander A Mercado
(74) *Attorney, Agent, or Firm* — Harness, Dickey & Pierce, P.L.C.

(57) ABSTRACT

A physical quantity sensor includes a substrate, a support portion fixed to the substrate, a movable body which is displaceable in a first direction with respect to the support portion and has a movable electrode provided therein, and a fixed electrode fixed to the substrate. The fixed electrode includes first and second fixed electrode fingers positioned on one side of the support portion, third and fourth fixed electrode fingers positioned on the other side thereof. The movable electrode includes first to fourth movable electrode fingers which face the first to fourth fixed electrode fingers in the first direction, respectively.

15 Claims, 34 Drawing Sheets ations.

PHYSICAL QUANTITY SENSOR, PHYSICAL QUANTITY SENSOR DEVICE, COMPLEX SENSOR DEVICE, INERTIAL MEASUREMENT UNIT, AND VEHICLE

CROSS-REFERENCE TO RELATED APPLICATION

This nonprovisional application claims the benefit of Japanese Patent Application No. 2017-228264 filed Nov. 28, 2017, the entire disclosure of which is incorporated herein by reference.

BACKGROUND

1. Technical Field

The present invention relates to a physical quantity sensor, a physical quantity sensor device, a complex sensor device, an inertial measurement unit, a vehicle positioning device, a portable electronic device, an electronic device, and a vehicle.

2. Related Art

For example, an acceleration sensor disclosed in JP-A-2007-139505 includes a fixation portion fixed to a substrate (first silicon substrate), a movable unit which is supported by the fixation portion and is displaceable in an X-axis direction with respect to the fixation portion, a first movable electrode, a second movable electrode, a first fixed electrode, and a second fixed electrode. The first movable electrode and the second movable electrode are connected to the movable unit. The first fixed electrode and the second fixed electrode are fixed to the second silicon substrate.

The first movable electrode includes a first movable electrode finger extending toward a positive side in a Y-axis direction from a portion of the movable unit on a negative side of the Y-axis direction. The second movable electrode includes a second movable electrode finger extending toward the negative side in the Y-axis direction from a portion of the movable unit on the positive side of the Y-axis direction.

The first fixed electrode includes a fixation portion fixed to the substrate, a support portion extending from the fixation portion toward the positive side of the X-axis direction, and a first fixed electrode finger extending from the support portion toward the negative side of the Y-axis direction. The first movable electrode finger and the first fixed electrode finger face each other in the X-axis direction, and electrostatic capacitance is formed between the first movable electrode finger and the first fixed electrode finger.

Similarly, the second fixed electrode includes a fixation portion fixed to the substrate, a support portion extending from the fixation portion toward the positive side of the X-axis direction, and a second fixed electrode finger extending from the support portion toward the negative side of the Y-axis direction. The second movable electrode finger and the second fixed electrode finger face each other in the X-axis direction, and electrostatic capacitance is formed between the second movable electrode finger and the second fixed electrode finger.

In such an acceleration sensor, if the movable unit is displaced by an applied acceleration, the electrostatic capacitance between the first movable electrode finger and the first fixed electrode finger and the electrostatic capacitance between the second movable electrode finger and the second fixed electrode finger change, and thus the received acceleration can be detected based on the change of the electrostatic capacitance.

However, for example, when a large impact is received by falling or the like, the movable unit is largely displaced in the X-axis direction. Thus, the electrode finger may be damaged by the first and second movable electrode fingers colliding with the first and second fixed electrode fingers.

SUMMARY

An advantage of some aspects of the invention is to provide a physical quantity sensor, a physical quantity sensor device, a complex sensor device, an inertial measurement unit, a vehicle positioning device, a portable electronic device, an electronic device, and a vehicle which have excellent impact resistance (mechanical strength).

The invention can be implemented as the following configurations.

A physical quantity sensor includes a substrate, a support portion fixed to the substrate, a movable body which is displaceable in a first direction with respect to the support portion and has a movable electrode provided therein, and a fixed electrode fixed to the substrate. The fixed electrode includes a first fixed electrode, a second fixed electrode, a third fixed electrode, and a fourth fixed electrode. The first fixed electrode is positioned on one side of a second direction orthogonal to the first direction with respect to the support portion and has a first fixed electrode finger provided therein. The second fixed electrode is provided to be separated from the first fixed electrode and has a second fixed electrode finger provided therein. The third fixed electrode is positioned on the other side of the second direction with respect to the support portion and has a third fixed electrode finger provided therein. The fourth fixed electrode is provided to be separated from the third fixed electrode and has a fourth fixed electrode finger provided therein. The movable electrode includes a first movable electrode, a second movable electrode, a third movable electrode, and a fourth movable electrode. The first movable electrode has a first movable electrode finger provided to face the first fixed electrode finger in the first direction. The second movable electrode has a second movable electrode finger provided to face the second fixed electrode finger in the first direction. The third movable electrode has a third movable electrode finger provided to face the third fixed electrode finger in the first direction. The fourth movable electrode has a fourth movable electrode finger provided to face the fourth fixed electrode finger in the first direction.

With this configuration, it is possible to reduce the length of each electrode finger in comparison to that in the related art. Accordingly, the deflection amount of the electrode finger being bent is reduced, and an occurrence in which the electrode finger is damaged by collision between the electrode fingers occurs less frequently. Thus, it is possible to realize a physical quantity sensor having excellent impact resistance (mechanical strength).

It is preferable that the physical quantity sensor further includes a spring that connects the support portion and the movable body.

With this configuration, it is possible to enable the movable body to be displaced in the first direction with respect to the support portion, with a simple configuration.

In the physical quantity sensor, it is preferable that the first movable electrode finger faces the first fixed electrode finger on one side of the first direction, the second movable electrode finger faces the second fixed electrode finger on the other side of the first direction, the third movable electrode finger faces the third fixed electrode finger on the one side of the first direction, and the fourth movable electrode finger faces the fourth fixed electrode finger on the other side of the first direction.

With this configuration, when an acceleration in the first direction is applied, electrostatic capacitance formed between the first movable electrode finger and the first fixed electrode finger and between the third movable electrode finger and the third fixed electrode finger and electrostatic capacitance formed between the second movable electrode finger and the second fixed electrode finger and between the fourth movable electrode finger and the fourth fixed electrode finger change in phases which are opposite to each other. Thus, it is possible to cancel noise and to detect a physical quantity with higher accuracy. Even though the length of the electrode finger is short, detection sensitivity of the physical quantity is not deteriorated.

In the physical quantity sensor, it is preferable that the first fixed electrode and the third fixed electrode are disposed symmetrically with respect to the support portion, and the second fixed electrode and the fourth fixed electrode are disposed symmetrically with respect to the support portion.

With this configuration, for example, it is possible to improve insensitivity to unnecessary vibration (displacement in directions other than the first direction) of the movable body, and to detect the physical quantity with higher accuracy.

In the physical quantity sensor, it is preferable that the first movable electrode and the third movable electrode are disposed symmetrically with respect to the support portion, and the second movable electrode and the fourth movable electrode are disposed symmetrically with respect to the support portion.

With this configuration, for example, it is possible to improve insensitivity to unnecessary vibration (displacement in directions other than the first direction) of the movable body, and to detect the physical quantity with higher accuracy.

In the physical quantity sensor, it is preferable that the first fixed electrode finger and the third fixed electrode finger are electrically connected to each other, and the second fixed electrode finger and the fourth fixed electrode finger are electrically connected to each other.

When the acceleration in the first direction is applied, the electrostatic capacitance formed between the first movable electrode finger and the first fixed electrode finger and between the third movable electrode finger and the third fixed electrode finger, and the electrostatic capacitance formed between the second movable electrode finger and the second fixed electrode finger and between the fourth movable electrode finger and the fourth fixed electrode finger change in phases which are opposite to each other. Thus, it is possible to cancel noise and to detect the acceleration in the first direction with higher accuracy. Even though the length of the electrode finger is short, detection sensitivity of the physical quantity is not deteriorated.

In the physical quantity sensor, it is preferable that the first fixed electrode includes a first fixation portion fixed to the substrate and a first trunk portion provided in the first fixation portion, the first fixed electrode finger is provided in the first trunk portion such that a longitudinal direction thereof is directed along the second direction, and the second fixed electrode includes a second fixation portion fixed to the substrate and a second trunk portion provided in the second fixation portion, the second fixed electrode finger is provided in the second trunk portion such that a longitudinal direction thereof is directed along the second direction, the second trunk portion is positioned closer to the support portion side than the first trunk portion but, the first fixed electrode finger is provided in the first trunk portion on an opposite side of the support portion, and the second fixed electrode finger is provided in the second trunk portion on the support portion side.

With this configuration, it is easy to arrange the first fixation portion and the second fixation portion to be close to each other. Therefore, it is possible to more effectively have an influence of heat deflection or warpage due to residual stress of a substrate on the first and second fixed electrodes equally.

In the physical quantity sensor, it is preferable that the first fixation portion and the second fixation portion are disposed to be adjacent to each other in the second direction.

With this configuration, it is easy to arrange the first and second fixation portions.

In the physical quantity sensor, it is preferable that the third fixed electrode includes a third fixation portion fixed to the substrate and a third trunk portion provided in the third fixation portion, the third fixed electrode finger is provided in the third trunk portion such that a longitudinal direction thereof is directed along the second direction, the fourth fixed electrode includes a fourth fixation portion fixed to the substrate and a fourth trunk portion provided in the fourth fixation portion, and the fourth fixed electrode finger is provided in the fourth trunk portion such that a longitudinal direction thereof is directed along the second direction, the fourth trunk portion is positioned closer to the support portion side than the third trunk portion side, the third fixed electrode finger is provided in the third trunk portion on an opposite side of the support portion, and the fourth fixed electrode finger is provided in the fourth trunk portion on the support portion side.

With this configuration, it is easy to arrange the third fixation portion and the fourth fixation portion to be close to each other. Therefore, it is possible to more effectively have an influence of heat deflection or warpage due to residual stress of a substrate on the third and fourth fixed electrodes equally.

In the physical quantity sensor, it is preferable that the third fixation portion and the fourth fixation portion are disposed to be adjacent to each other in the second direction.

With this configuration, it is easy to arrange the third and fourth fixation portions.

In the physical quantity sensor, it is preferable that the physical quantity sensor is a sensor capable of detecting an acceleration.

With this configuration, a physical quantity sensor having high convenience is obtained.

A physical quantity sensor device includes a physical quantity sensor and a circuit element.

With this configuration, a physical quantity sensor device which is capable of exhibiting the effect of the physical quantity sensor and has high reliability is obtained.

It is preferable that the physical quantity sensor device further includes a base substrate and a lid bonded to the base substrate so as to form a storage space between the lid and the base substrate, and the physical quantity sensor and the circuit element are stored in the storage space.

With this configuration, it is possible to protect the physical quantity sensor and the circuit element.

In the physical quantity sensor device, it is preferable that the physical quantity sensor is mounted on the base substrate, and the circuit element is mounted on the physical quantity sensor.

For example, in a case where the planar size of the circuit element is smaller than the planar size of the physical quantity sensor, if such an arrangement is performed, it is possible to arrange the physical quantity sensor and the circuit element with high balance.

In the physical quantity sensor device, it is preferable that the circuit element is mounted on the base substrate, and the physical quantity sensor is mounted on the circuit element.

For example, in a case where the planar size of the physical quantity sensor is smaller than the planar size of the circuit element, if such an arrangement is performed, it is possible to arrange the physical quantity sensor and the circuit element with high balance.

A complex sensor device includes a first physical quantity sensor being the physical quantity sensor, and a second physical quantity sensor that detects a physical quantity different from that detected by the first physical quantity sensor.

With this configuration, a complex sensor device which is capable of exhibiting the effect of the physical quantity sensor and has high reliability is obtained.

In the complex sensor device, it is preferable that the first physical quantity sensor is a sensor capable of detecting an acceleration, and the second physical quantity sensor is a sensor capable of detecting an angular rate.

With this configuration, a complex sensor device having high convenience is obtained.

An inertial measurement unit includes a physical quantity sensor and a control circuit that controls driving of the physical quantity sensor.

With this configuration, an inertial measurement unit which is capable of exhibiting the effect of the physical quantity sensor and has high reliability is obtained.

A vehicle positioning device includes an inertial measurement unit, a receiving unit (receiver), an acquisition unit, a computation unit, and a calculation unit. The receiving unit (receiver) receives a satellite signal on which position information is superimposed, from a positioning satellite. The acquisition unit acquires the position information in the receiving unit (receiver) based on the received satellite signal. The computation unit computes an attitude of a vehicle based on inertial data output from the inertial measurement unit. The calculation unit calculates the position of the vehicle by correcting the position information based on the computed attitude.

With this configuration, a vehicle positioning device which is capable of exhibiting the effect of the inertial measurement unit and has high reliability is obtained.

A portable electronic device includes a physical quantity sensor, a case in which the physical quantity sensor is accommodated, a processing unit (processor) which is accommodated in the case and processes output data from the physical quantity sensor, a display unit which is accommodated in the case, and a translucent cover that closes an opening portion of the case.

With this configuration, a portable electronic device which is capable of exhibiting the effect of the physical quantity sensor and has high reliability is obtained.

It is preferable that the portable electronic device further includes a satellite positioning system, and measures a distance of a user moving or a movement trajectory.

With this configuration, a portable electronic device having higher convenience is obtained.

An electronic device includes a physical quantity sensor and a control unit (controller) that performs a control based on a detection signal output from the physical quantity sensor.

With this configuration, an electronic device which is capable of exhibiting the effect of the physical quantity sensor and has high reliability is obtained.

A vehicle includes a physical quantity sensor and a control unit (controller) that performs a control based on a detection signal output from the physical quantity sensor.

With this configuration, a vehicle which is capable of exhibiting the effect of the physical quantity sensor and has high reliability is obtained.

It is preferable that the vehicle further includes at least one of an engine system, a brake system, and a keyless entry system, and the control unit (controller) controls the system based on the detection signal.

With this configuration, it is possible to control the system with high precision.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a physical quantity sensor, a physical quantity sensor device, a complex sensor device, an inertial measurement unit, a vehicle positioning device, a portable electronic device, an electronic device, and a vehicle will be described in detail based on embodiments illustrated in the accompanying drawings.

First Embodiment

Firstly, a physical quantity sensor according to a first embodiment will be described.

Figure 1:
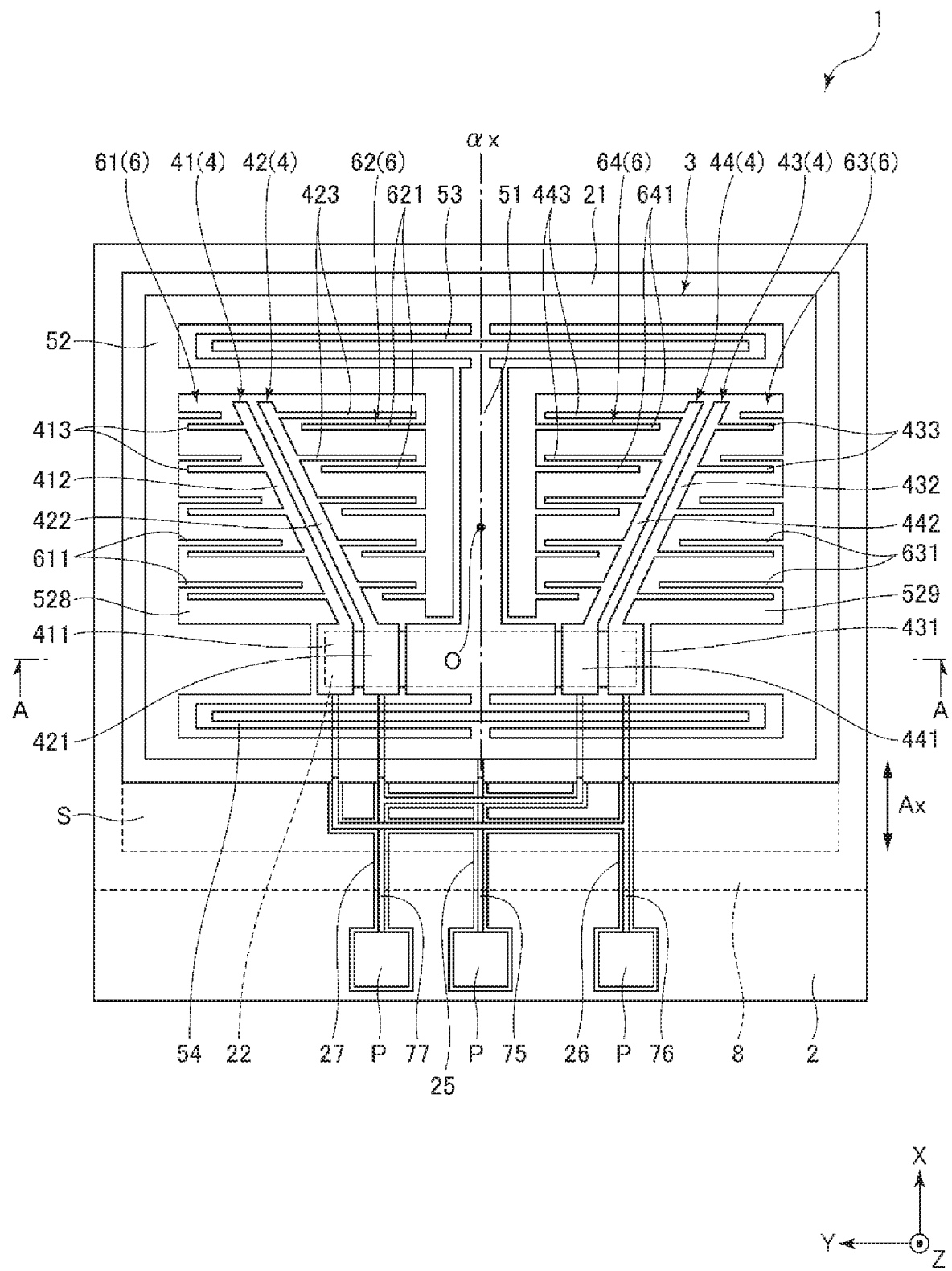
FIG. 1 is a plan view illustrating a physical quantity sensor according to a first embodiment.
Figure 2:
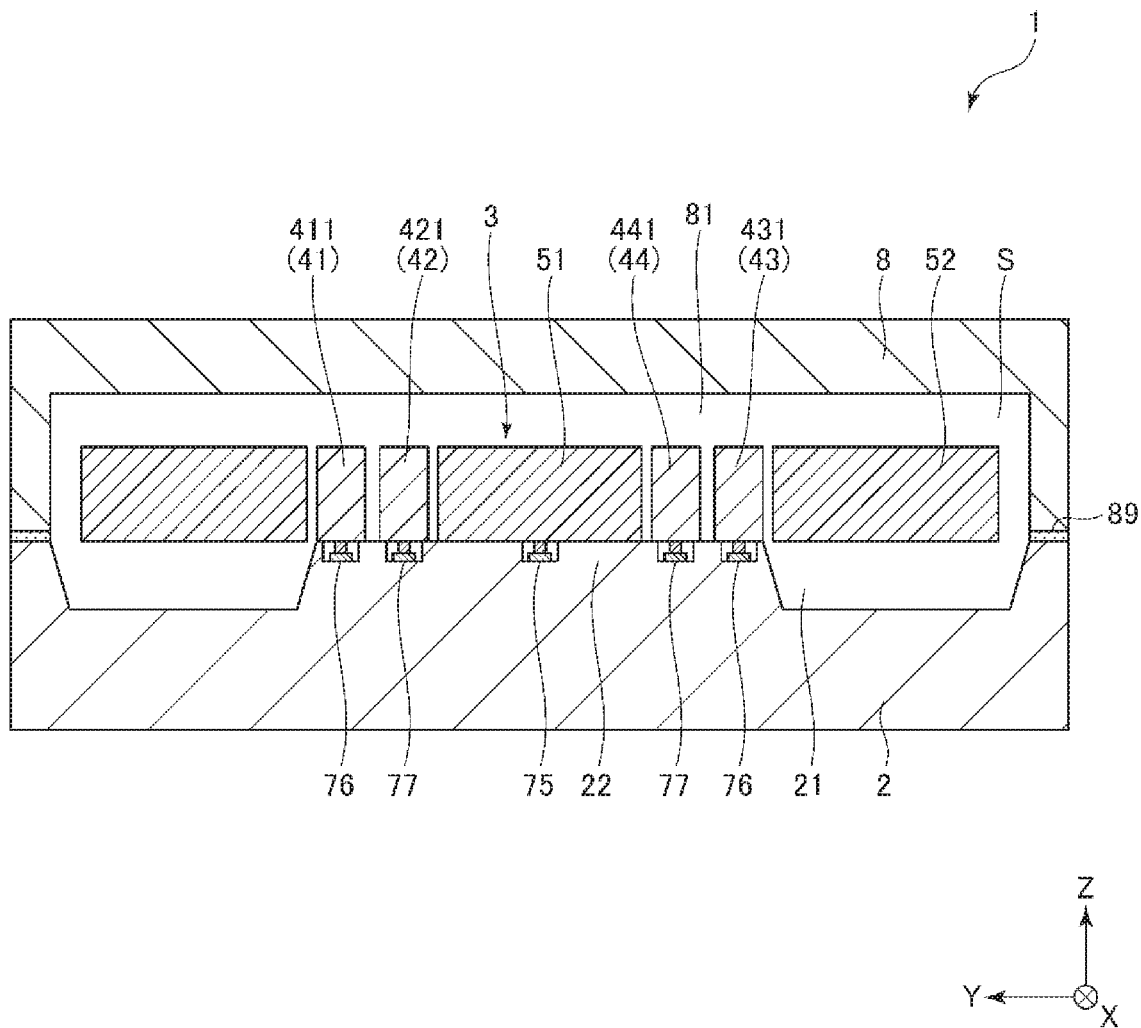
FIG. 2 is a sectional view taken along line A-A in FIG. 1.
Figure 3:
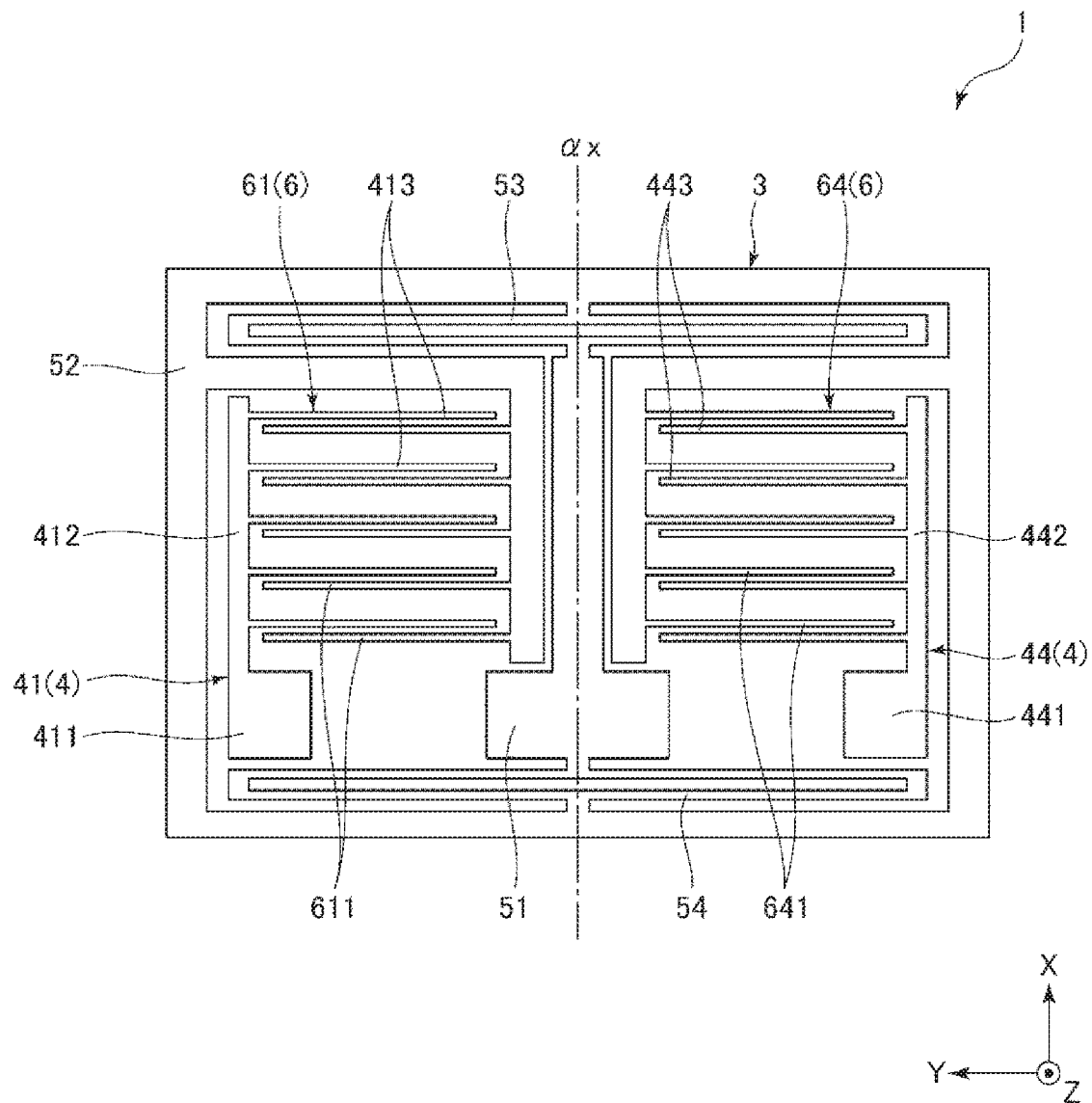
FIG. 3 is a plan view illustrating a configuration of an element unit in the related art.
Figure 4:
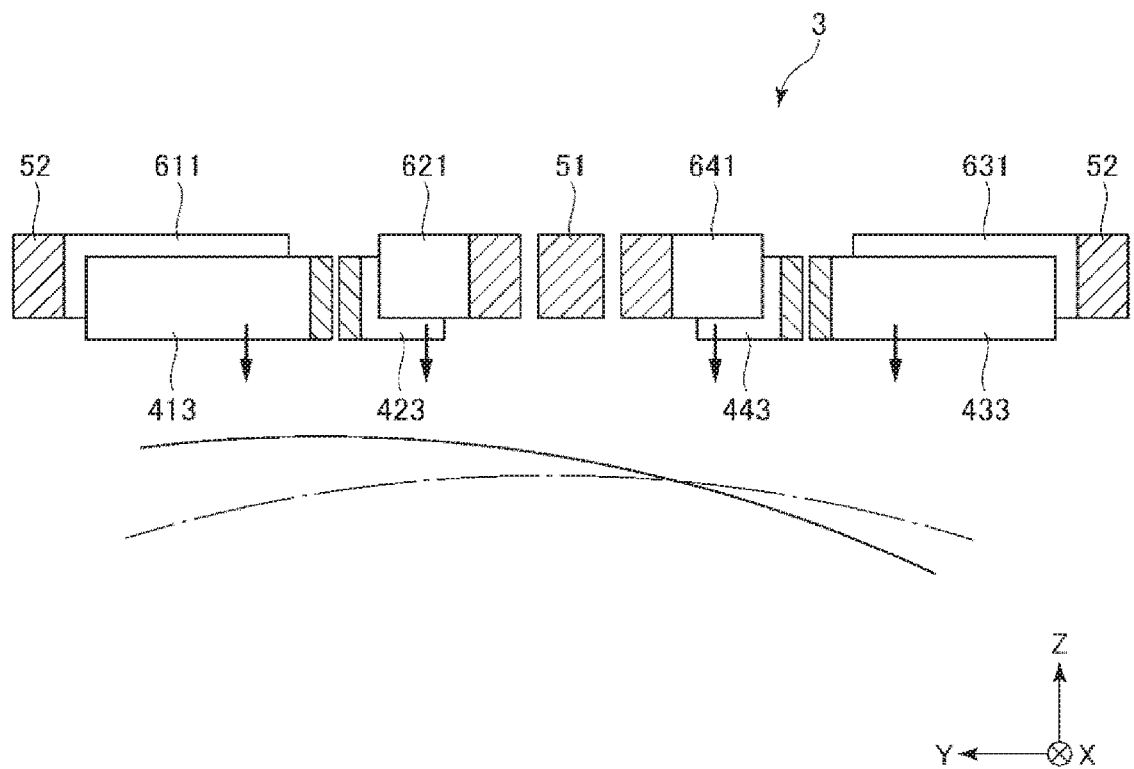
FIG. 4 is a sectional view illustrating an influence of heat deflection on a substrate.

FIG. 1 is a plan view illustrating the physical quantity sensor according to the first embodiment. FIG. 2 is a sectional view taken along line A-A in FIG. 1. FIG. 3 is a plan view illustrating a configuration of an element unit in the related art. FIG. 4 is a sectional view illustrating an influence of heat deflection on a substrate. For simple descriptions, an X axis, a Y axis, and a Z axis as three axes orthogonal to each other are illustrated in the drawings. A direction parallel to the X axis is referred to as "an X-axis direction. A direction parallel to the Y axis is referred to as "a Y-axis direction. A direction parallel to the Z axis is referred to as "a Z-axis direction". A tip side of an arrow indicating each axis is referred to as "a positive side", and an opposite side thereof is referred to as "a negative side". A positive side of the Z-axis direction is referred to as "being up", and a negative side of the Z-axis direction is referred to as "being down".

A physical quantity sensor 1 illustrated in FIG. 1 is an acceleration sensor capable of detecting an acceleration Ax in the X-axis direction. Such a physical quantity sensor 1 includes a substrate 2, an element unit 3 disposed on the substrate 2, and a lid 8 bonded to the substrate 2 so as to cover the element unit 3.

As illustrated in FIG. 1, the substrate 2 has a plate shape having a rectangular shape in plan view. The substrate 2 includes a recess portion 21 opening to the upper surface side. In plan view in the Z-axis direction, the recess portion 21 is formed to be larger than the element unit 3 such that the recess portion 21 encloses the element unit 3. The recess portion 21 functions as a clearance portion that prevents a contact of the element unit 3 and the substrate 2.

As illustrated in FIG. 2, the substrate 2 includes a mount 22 which is provided on the bottom surface of the recess portion 21 and has a protrusion-like shape. The element unit 3 is bonded to the upper surface of the mount 22. Thus, it is possible to support the element unit 3 in a state where the element unit 3 floats from the bottom surface of the recess portion 21. As illustrated in FIG. 1, the substrate 2 includes groove portions 25, 26, and 27 opening to the upper surface side.

As the substrate 2, a glass substrate made of a glass material (for example, borosilicate glass such as Tempax glass (registered trademark) or Pyrex glass (registered trademark)) containing alkali metal ions (Na+) can be used. The material for forming the substrate 2 is not particularly limited, and a silicon substrate, a ceramic substrate, and the like can be used.

As illustrated in FIG. 1, wirings 75, 76, and 77 are disposed in the groove portions 25, 26, and 27, respectively. Each of the wirings 75, 76, and 77 is lead onto the mount 22 and is electrically connected to the element unit 3 on the mount 22. One end portion of each of the wirings 75, 76, and 77 is exposed to the outside of the lid 8, and thus functions as an electrode pad P that is electrically connected to an external device.

As illustrated in FIG. 1, the lid 8 has a plate shape having a rectangular shape in plan view. As illustrated in FIG. 2, the lid 8 includes a recess portion 81 opening to the lower surface. The lid 8 is bonded to the upper surface of the substrate 2 so as to store the element unit 3 in the recess portion 81. Thus, a storage space S in which the element unit 3 is stored is formed by the lid 8 and the substrate 2. The storage space S is an airtight space. It is preferable that the storage space is filled with an inert gas such as nitrogen, helium, and argon and is at a use temperature (about −40° C. to 120° C.) at the substantially atmospheric pressure. Thus, viscous resistance increases, and thus a damping effect is exhibited. Accordingly, it is possible to rapidly converge (stop) the vibration of the element unit 3. Therefore, it is possible to improve detection accuracy of the acceleration Ax in the physical quantity sensor 1.

As the lid 8, for example, a silicon substrate can be used. The lid 8 is not particularly limited. For example, a glass substrate or a ceramic substrate may be used. A method of bonding the substrate 2 and the lid 8 to each other is not particularly limited, and may be appropriately selected in accordance with the materials of the substrate 2 and the lid 8. For example, anodic bonding, activated bonding in which bonding surfaces activated by irradiation with plasma are bonded to each other, bonding with a bonding material such as glass frit, and diffusion bonding in which metal films formed on the upper surface of the substrate 2 and the lower surface of the lid 8 are bonded to each other are exemplified. In the embodiment, the substrate 2 and the lid 8 are bonded to each other with glass frit (low-melting glass) 89.

The element unit 3 is disposed in the storage space S and is bonded to the upper surface of the mount 22. The element unit 3 can be formed in a manner that a conductive silicon substrate in which impurities such as phosphorus (P), boron (B), and arsenic (As) have been doped is patterned by using a dry etching method (silicon deep etching: Bosch method). The element unit 3 is bonded to the upper surface of the mount 22 by anodic bonding. A method of bonding the element unit 3 and the substrate 2 to each other is not particularly limited. The element unit 3 will be described below in detail. In the following descriptions, for easy descriptions, in plan view in the Z-axis direction, a straight line which intersects the center O of the element unit 3 and extends in the X-axis direction is also referred to as "a central axis αx".

As illustrated in FIG. 1, the element unit 3 includes a fixed electrode 4 fixed to the mount 22, a support portion 51 fixed to the mount 22, a movable body 52 which is displaceable in the X-axis direction with respect to the support portion 51, springs 53 and 54 that connect the support portion 51 and the movable body 52, and a movable electrode 6 provided in the movable body 52. The fixed electrode 4 includes a first fixed electrode 41, a second fixed electrode 42, a third fixed electrode 43, and a fourth fixed electrode 44. The movable electrode 6 includes a first movable electrode 61, a second movable electrode 62, a third movable electrode 63, and a fourth movable electrode 64.

The support portion 51 has a long shape extending in the X-axis direction. The support portion 51 is disposed along the central axis αx. As described above, since the support portion 51 is disposed at the center portion of the element unit 3, it is possible to stably support the movable body 52. The support portion 51 is bonded to the upper surface of the mount 22 at an end portion of the support portion on the negative side of the X-axis direction. The support portion 51 is electrically connected to the wiring at a portion of the support portion, which has been bonded to the mount 22. In this embodiment, the support portion 51 has a long shape extending in the X-axis direction. However, the shape of the support portion 51 is not particularly limited so long as the support portion exhibits the function.

As illustrated in FIG. 1, the movable body 52 has a frame shape in plan view in the Z-axis direction, and surrounds the support portion 51, the springs 53 and 54, and the fixed electrode 4. As described above, since the movable body 52 is configured to have a frame shape, it is possible to increase the mass of the movable body 52. Therefore, it is possible to improve sensitivity more and to detect the acceleration Ax with higher accuracy. The movable body 52 includes a first opening portion 528 and a second opening portion 529. The first opening portion 528 is positioned on one side of the support portion 51 (on the positive side of the Y-axis direction) and has first and second fixed electrodes 41 and 42 disposed therein. The second opening portion 529 is positioned on the other side of the support portion 51 (on the negative side of the Y-axis direction) and has third and fourth fixed electrodes 43 and 44 disposed therein.

The springs 53 and 54 are capable of elastically deforming. The movable body 52 can be displaced in the X-axis direction with respect to the support portion 51, by the springs 53 and 54 elastically deforming. As illustrated in FIG. 1, the spring 53 joins the end portion of the support portion 51 on the positive side of the X-axis direction to the movable body 52. The spring 54 joins the end portion of the support portion 51 on the negative side of the X-axis direction to the movable body 52. Thus, the movable body 52 can be supported on both sides of the X-axis direction, and thus the attitude and the movement of the movable body 52 are stabilized. Therefore, unnecessary vibration is reduced, and it is possible to detect the acceleration Ax with higher accuracy.

The fixed electrode 4 includes the first and second fixed electrodes 41 and 42 positioned in the first opening portion 528, and the third and fourth fixed electrodes 43 and 44 positioned in the second opening portion 529. The first and second fixed electrodes 41 and 42 are positioned on the one side of the support portion 51 (on the positive side of the Y-axis direction). The third and fourth fixed electrodes 43 and 44 are positioned on the other side of the support portion 51 (on the negative side of the Y-axis direction).

The first fixed electrode 41 includes a fixation portion 411 fixed to the upper surface of the mount 22, a trunk portion 412 supported on the fixation portion 411, and a plurality of fixed electrode fingers 413 extending from the trunk portion 412. The first fixed electrode 41 is electrically connected to the wiring 76 at the fixation portion 411.

The trunk portion 412 has a long rod-like shape. One end of the trunk portion 412 (end thereof on the negative side in the X-axis direction) is connected to the fixation portion 411. The trunk portion 412 extends in a direction inclined from each of the X axis and the Y axis in plan view in the Z-axis direction. Specifically, the trunk portion 412 is inclined such that a distance from the central axis αx increases toward the tip side of the trunk portion 412. The inclination of the trunk portion 412 from the X axis is not particularly limited. The inclination thereof is preferably from 10° to 45°, and more preferably from 10° to 30°. Thus, it is possible to reduce the expansion of the first fixed electrode 41 in the Y-axis direction and to reduce the size of the element unit 3.

The fixed electrode finger 413 extends from the trunk portion 412 toward the positive side (one side) of the Y-axis direction. The plurality of fixed electrode fingers 413 is provided to be separated from each other at an equal interval in the X-axis direction. The lengths of the plurality of fixed electrode fingers 413 (length in the Y-axis direction) gradually decrease toward the positive side of the X-axis direction. Tips of the plurality of fixed electrode fingers 413 are positioned on the same straight line along the X-axis direction.

The second fixed electrode 42 includes a fixation portion 421 fixed to the upper surface of the mount 22, a trunk portion 422 supported on the fixation portion 421, and a plurality of fixed electrode fingers 423 extending from the trunk portion 422. The second fixed electrode 42 is electrically connected to the wiring 77 at the fixation portion 421.

The fixation portion 421 is positioned on a side of the fixation portion 411 on the negative side of the Y-axis direction, and is disposed side by side with the fixation portion 411 in the Y-axis direction. In other words, the fixation portion 421 is positioned between the support portion 51 and the fixation portion 411.

The trunk portion 422 has a long rod-like shape. One end of the trunk portion 422 (end thereof on the negative side in the X-axis direction) is connected to the fixation portion 421. The trunk portion 422 extends in a direction inclined from each of the X axis and the Y axis in plan view in the Z-axis direction. The trunk portion 422 is positioned on a side of the trunk portion 412 on the negative side of the Y-axis direction and is disposed to be parallel to the trunk portion 412.

The fixed electrode finger 423 extends from the trunk portion 422 toward the negative side (one side) of the Y-axis direction. The plurality of fixed electrode fingers 423 is provided to be separated from each other at an equal interval in the X-axis direction. The lengths of the plurality of fixed electrode fingers 423 (length in the Y-axis direction) gradually increase toward the positive side of the X-axis direction.

Tips of the plurality of fixed electrode fingers 423 are positioned on the same straight line along the X-axis direction.

The third fixed electrode 43 includes a fixation portion 431 fixed to the upper surface of the mount 22, a trunk portion 432 supported on the fixation portion 431, and a plurality of fixed electrode fingers 433 extending from the trunk portion 432. Such a third fixed electrode is disposed to be symmetrical with the first fixed electrode 41 with respect to the central axis αx. The third fixed electrode 43 is electrically connected to the wiring 76 at the fixation portion 431, similar to the first fixed electrode 41.

The trunk portion 432 has a long rod-like shape. One end of the trunk portion 432 (end thereof on the negative side in the X-axis direction) is connected to the fixation portion 431. The trunk portion 432 extends in a direction inclined from each of the X axis and the Y axis in plan view in the Z-axis direction. Specifically, the trunk portion 432 is inclined such that a distance from the central axis αx increases toward the tip side of the trunk portion 432.

The fixed electrode finger 433 extends from the trunk portion 432 toward the negative side (one side) of the Y-axis direction. The plurality of fixed electrode fingers 433 is provided to be separated from each other at an equal interval in the X-axis direction. The lengths of the plurality of fixed electrode fingers 433 (length in the Y-axis direction) gradually decrease toward the positive side of the X-axis direction. Tips of the plurality of fixed electrode fingers 433 are positioned on the same straight line along the X-axis direction.

The fourth fixed electrode 44 includes a fixation portion 441 fixed to the upper surface of the mount 22, a trunk portion 442 supported on the fixation portion 441, and a plurality of fixed electrode fingers 443 extending from the trunk portion 442. Such a fourth fixed electrode is disposed to be symmetrical with the second fixed electrode 42 with respect to the central axis αx. The fourth fixed electrode 44 is electrically connected to the wiring 77 at the fixation portion 441, similar to the second fixed electrode 42.

The fixation portion 441 is positioned on a side of the fixation portion 431 on the positive side of the Y-axis direction, and is disposed side by side with the fixation portion 431 in the Y-axis direction. In other words, the fixation portion 441 is positioned between the support portion 51 and the fixation portion 431.

The trunk portion 442 has a long rod-like shape. One end of the trunk portion 442 (end thereof on the negative side in the X-axis direction) is connected to the fixation portion 441. The trunk portion 442 extends in a direction inclined from each of the X axis and the Y axis in plan view in the Z-axis direction. The trunk portion 442 is positioned on a side of the trunk portion 432 on the positive side of the Y-axis direction and is disposed to be parallel to the trunk portion 432.

The fixed electrode finger 443 extends from the trunk portion 442 toward the positive side (one side) of the Y-axis direction. The plurality of fixed electrode fingers 443 is provided to be separated from each other at an equal interval in the X-axis direction. The lengths of the plurality of fixed electrode fingers 443 (length in the Y-axis direction) gradually increase toward the positive side of the X-axis direction. Tips of the plurality of fixed electrode fingers 443 are positioned on the same straight line along the X-axis direction.

The first fixed electrode 41 (trunk portion 412) and the second fixed electrode 42 (trunk portion 422) are disposed to be separated from each other with a gap. The third fixed electrode 43 (trunk portion 432) and the fourth fixed electrode 44 (trunk portion 442) are disposed to be separated from each other with a gap (face each other).

The configurations of the first to fourth fixed electrodes 41 to 44 are described above. As described above, the first and second fixed electrodes 41 and 42 are disposed on the one side of the central axis αx, and the third and fourth fixed electrodes 43 and 44 are disposed on the other side of the central axis αx. Thus, it is possible to reduce the lengths of the fixed electrode fingers 413, 423, 433, and 443 to about the half without deteriorating detection characteristics of the acceleration Ax, in comparison to, for example, a configuration as illustrated in FIG. 3, in which only the first fixed electrode 41 is disposed on one side of the central axis αx, and only the fourth fixed electrode 44 is disposed on the other side of the central axis αx. As described above, according to the physical quantity sensor 1, it is possible to reduce the lengths of the fixed electrode fingers 413, 423, 433, and 443 in comparison to those in the related art. In addition, since the mechanical strength of the fixed electrode fingers 413, 423, 433, and 443 increases, the fixed electrode finger is damaged less frequently. Each of the fixed electrode fingers 413, 423, 433, and 443 is an elongated portion, and thus is a portion which is particularly easily damaged in the element unit 3. As described above, since each of the fixed electrode fingers 413, 423, 433, and 443 being portions which are easily damaged is configured to be damaged less frequently, mechanical strength of the entirety of the element unit 3 is significantly improved.

As described above, each of the trunk portions 412, 422, 432, and 442 is inclined from the central axis αx. Thus, the fixation portions 411, 421, 431, and 441 can be arranged to be close to the portion of the support portion 51, which is bonded to the mount 22. Therefore, it is possible to reduce the shift in, particularly, the Z-axis direction among the X-axis direction, the Y-axis direction, and the Z-axis direction, between the movable body 52 and the fixed electrode 4 (the shift occurs by residual stress of the substrate 2 or heat deflection). In particular, in this embodiment, the fixation portions 411, 421, 431, and 441 are arranged side by side in the Y-axis direction. Therefore, the fixation portions 411, 421, 431, and 441 are easily arranged to be close to the portion of the support portion 51, which is bonded to the mount 22.

As illustrated in FIG. 1, the movable electrode 6 includes first and second movable electrodes 61 and 62 positioned in the first opening portion 528 and third and fourth movable electrodes 63 and 64 positioned in the second opening portion 529.

The first movable electrode 61 is an electrode which forms a pair with the first fixed electrode 41, and is provided in the movable body 52. Such a first movable electrode 61 includes a plurality of plurality of movable electrode fingers 611 which extends in the Y-axis direction to fit with the plurality of fixed electrode fingers 413 and to form a comb teeth shape. The plurality of movable electrode fingers 611 is arranged to be separated from each other at an equal interval in the X-axis direction. Each of the movable electrode fingers 611 is positioned on a side of the corresponding fixed electrode finger 413 on the positive side of the X-axis direction, and faces the fixed electrode finger 413 with a gap. The lengths of the plurality of movable electrode fingers 611 (length in the Y-axis direction) decrease toward the positive side of the X-axis direction, similar to the plurality of fixed electrode fingers 413.

The second movable electrode 62 is an electrode which forms a pair with the second fixed electrode 42, and is provided in the movable body 52. Such a second movable electrode 62 includes a plurality of movable electrode fingers 621 which extends in the Y-axis direction to fit with the plurality of fixed electrode fingers 423 and to form a comb teeth shape. The plurality of movable electrode fingers 621 is arranged to be separated from each other at an equal interval in the X-axis direction. Each of the movable electrode fingers 621 is positioned on a side of the corresponding fixed electrode finger 423 on the negative side of the X-axis direction, and faces the fixed electrode finger 423 with a gap. The lengths of the plurality of movable electrode fingers 621 (length in the Y-axis direction) gradually increase toward the positive side of the X-axis direction, similar to the plurality of fixed electrode fingers 423.

The third movable electrode 63 is an electrode which forms a pair with the third fixed electrode 43, and is provided in the movable body 52. Such a third movable electrode 63 includes a plurality of movable electrode fingers 631 which extends in the Y-axis direction to fit with the plurality of fixed electrode fingers 433 and to form a comb teeth shape. The plurality of movable electrode fingers 631 is arranged to be separated from each other at an equal interval in the X-axis direction. Each of the movable electrode fingers 631 is positioned on a side of the corresponding fixed electrode finger 433 on the positive side of the X-axis direction, and faces the fixed electrode finger 433 with a gap. The lengths of the plurality of movable electrode fingers 631 (length in the Y-axis direction) gradually decrease toward the positive side of the X-axis direction, similar to the plurality of fixed electrode fingers 433. Such a third movable electrode 63 is disposed to be symmetrical with the first movable electrode 61 with respect to the central axis αx.

The fourth movable electrode 64 is an electrode which forms a pair with the fourth fixed electrode 44, and is provided in the movable body 52. Such a fourth movable electrode 64 includes a plurality of movable electrode fingers 641 which extends in the Y-axis direction to fit with the plurality of fixed electrode fingers 443 and to form a comb teeth shape. The plurality of movable electrode fingers 641 is arranged to be separated from each other at an equal interval in the X-axis direction. Each of the movable electrode fingers 641 is positioned on a side of the corresponding fixed electrode finger 443 on the negative side of the X-axis direction, and faces the fixed electrode finger 443 with a gap. The lengths of the plurality of movable electrode fingers 641 (length in the Y-axis direction) gradually increase toward the positive side of the X-axis direction, similar to the plurality of fixed electrode fingers 443. Such a fourth movable electrode 64 is disposed to be symmetrical with the second movable electrode 62 with respect to the central axis αx.

The configurations of the first to fourth movable electrodes 61, 62, 63, and 64 are described above. As described above, the first and second movable electrodes 61 and 62 are disposed on the one side of the central axis αx, and the third and fourth movable electrodes 63 and 64 are disposed on the other side of the central axis αx. Thus, it is possible to reduce the lengths of the movable electrode fingers 611, 621, 631, and 641 to about the half without deteriorating detection characteristics of the acceleration Ax, in comparison to, for example, a configuration as illustrated in FIG. 3, in which only the first movable electrode 61 is disposed on one side of the central axis αx, and only the fourth movable electrode 64 disposed on the other side of the central axis αx. As described above, according to the physical quantity sensor 1, it is possible to reduce the lengths of the movable electrode fingers 611, 621, 631, and 641 in comparison to those in the related art. In addition, since the mechanical strength of the movable electrode fingers 611, 621, 631, and 641 increases, the movable electrode finger is damaged less frequently. Each of the movable electrode fingers 611, 621, 631, and 641 is an elongated portion, and thus is a portion which is particularly easily damaged in the element unit 3. As described above, since each of the movable electrode fingers 611, 621, 631, and 641 being portions which are easily damaged is configured to be damaged less frequently, mechanical strength of the entirety of the element unit 3 is significantly improved.

The configuration of the physical quantity sensor 1 is described above in detail. When the physical quantity sensor 1 operates, for example, the first and third fixed electrodes 41 and 43 are connected to a QV amplifier (charge/voltage conversion circuit) via the wiring 76. The second and fourth fixed electrodes 42 and 44 are connected to the QV amplifier via the wiring 77. Thus, if a driving voltage is applied to the movable electrode 6 via the wiring 75, electrostatic capacitance Ca is formed between the movable electrode finger 611 and the fixed electrode finger 413 and between the movable electrode finger 631 and the fixed electrode finger 433. In addition, electrostatic capacitance Cb is formed between the movable electrode finger 621 and the fixed electrode finger 423 and between the movable electrode finger 641 and the fixed electrode finger 443.

If the acceleration Ax is applied to the physical quantity sensor 1 toward the positive side of the X-axis direction, the movable body 52 is displaced in the X-axis direction with respect to the support portion 51, based on the magnitude of the acceleration Ax, while causing the springs 53 and 54 to elastically deform. Therefore, each of a gap between the movable electrode finger 611 and the fixed electrode finger 413, a gap between the movable electrode finger 621 and the fixed electrode finger 423, a gap between the movable electrode finger 631 and the fixed electrode finger 433, and a gap between the movable electrode finger 641 and the fixed electrode finger 443 changes. With the changes, the electrostatic capacitance Ca and Cb changes with each of the gaps changing. Therefore, the acceleration Ax can be obtained based on the change of the electrostatic capacitance Ca and Cb.

Here, as described above, in the first and third movable electrodes 61 and 63, the movable electrode fingers 611 and 631 are positioned on a side of the fixed electrode fingers 413 and 433 on the positive side of the X-axis direction. However, in the second and fourth movable electrodes 62 and 64, the movable electrode fingers 621 and 641 are positioned on a side of the fixed electrode fingers 423 and 443 on the negative side of the X-axis direction. Therefore, if the electrostatic capacitance Ca increases, the electrostatic capacitance Cb decreases. On the contrary, if the electrostatic capacitance Ca decreases, the electrostatic capacitance Cb increases. Thus, if a differential operation (subtraction processing: Ca-Cb) is performed on a detection signal (signal depending on the magnitude of the electrostatic capacitance Ca) output from the wiring 76 and a detection signal (signal depending on the magnitude of the electrostatic capacitance Cb) output from the wiring 77, it is possible to cancel noise and to detect the acceleration Ax with higher accuracy.

In particular, in this embodiment, arrangement is performed in a manner that the first and second fixed electrodes 41 and 42 having different polarities are adjacent to one side of the central axis αx (on the positive side of the Y-axis direction), and the third and fourth fixed electrodes 43 and 44 having different polarities are adjacent to the other side of the central axis αx (on the negative side of the Y-axis direction). Therefore, the influence of heat deflection or warpage due to residual stress of the substrate 2 is substantially equal between the first and second fixed electrodes 41 and 42, and is also substantially equal between the third and fourth fixed electrodes 43 and 44. Thus, the shift of the detection signal occurring by the influence is canceled by the first fixed electrode 41 and the second fixed electrode 42, and by the third fixed electrode 43 and the fourth fixed electrode 44. As a result, it is possible to detect the acceleration Ax with higher accuracy.

Examples of the influence of heat deflection or warpage due to residual stress of the substrate 2 include the shift of the first to fourth fixed electrodes 41, 42, 43, and 44 from the movable body 52 in the Z-axis direction, as illustrated in FIG. 4. Since the first and second fixed electrodes 41 and 42 are disposed to be adjacent to each other, the shift from the movable body 52 in the Z-axis direction occurs substantially equally between the first and second fixed electrodes. Similarly, since the third and fourth fixed electrodes 43 and 44 are disposed to be adjacent to each other, the shift from the movable body 52 in the Z-axis direction occurs substantially equally between the third and fourth fixed electrodes. Therefore, the amount of the electrostatic capacitance Ca changing due to displacement of the first fixed electrode 41 is substantially equal to the amount of the electrostatic capacitance Cb changing due to displacement of the second fixed electrode 42. In addition, the amount of the electrostatic capacitance Ca changing due to displacement of the third fixed electrode 43 is substantially equal to the amount of the electrostatic capacitance Cb changing due to displacement of the fourth fixed electrode 44. Accordingly, the amounts of the electrostatic capacitance Ca and Cb changing are substantially equal to each other in total. Thus, it is possible to cancel the amount of the electrostatic capacitance Ca and Cb by performing a differential operation on the electrostatic capacitance Ca and Cb. Accordingly, according to such a configuration, it is possible to detect the acceleration Ax with higher accuracy. In particular, the degree of the heat deflection of the substrate 2 changes depending on an environmental temperature, and this may cause deterioration of temperature characteristics. On the contrary, as described above, in the physical quantity sensor 1, it is possible to reduce the influence of the heat deflection of the substrate 2. Thus, it is possible to exhibit excellent temperature characteristics.

That is, regarding the features of the structure of the physical quantity sensor 1 according to the invention, even in a case, in practice, the amount of warpage changes depending on a place due to not warpage (indicated by a one dot chain line in FIG. 4) of the substrate 2, but shape asymmetry of the lid 8 and the like, for example, like a case of warpage of the substrate 2, which is indicated by a solid line in FIG. 4 (warpage of the fixation portions 411, 421, 431, and 441 of the fixed electrode 4 is not symmetrical with respect to the support portion 51 of the movable body 52), the amount of the electrostatic capacitance Ca and Cb changing of warpage is canceled, and thus it is possible to significantly exhibit the effect.

The physical quantity sensor 1 is described above in detail. As described above, such a physical quantity sensor 1 includes the substrate 2, the support portion 51 fixed to the substrate 2, the movable body 52 which is displaceable in the X-axis direction (first direction) with respect to the support portion 51 and has the movable electrode 6 provided therein, and the fixed electrode 4 fixed to the substrate 2. The fixed electrode 4 includes the first fixed electrode 41 which is positioned on one side of the support portion 51 in the Y-axis direction (second direction) orthogonal to the X-axis direction and has the fixed electrode finger (first fixed electrode finger) 413 provided therein, the second fixed electrode 42 which is provided to be separated from the first fixed electrode 41 and has the fixed electrode finger (second fixed electrode finger) 423 provided therein, the third fixed electrode 43 which is positioned on the other side of the support portion in the Y-axis direction and has the fixed electrode finger (third fixed electrode finger) 433 provided therein, and the fourth fixed electrode 44 which is provided to be separated from the third fixed electrode 43 and has the fixed electrode finger (fourth fixed electrode finger) 443 provided therein. The movable electrode 6 includes the first movable electrode 61 having the movable electrode finger (first movable electrode finger) 611 provided to face the fixed electrode finger 413 in the X-axis direction, the second movable electrode 62 having the movable electrode finger (second movable electrode finger) 621 provided to face the fixed electrode finger 423 in the X-axis direction, the third movable electrode 63 having the movable electrode finger (third movable electrode finger) 631 provided to face the fixed electrode finger 433 in the X-axis direction, and the fourth movable electrode 64 having the movable electrode finger (fourth movable electrode finger) 641 provided to face the fixed electrode finger 443 in the X-axis direction. According to such a configuration, for example, it is possible to reduce the length of each of the electrode fingers 413, 423, 433, 443, 611, 621, 631, and 641 to about the half without deteriorating the detection characteristics (magnitude of electrostatic capacitance Ca and Cb) of the acceleration Ax, in comparison to the configuration as illustrated in FIG. 3. Therefore, the mechanical strength of the electrode fingers 413, 423, 433, 443, 611, 621, 631, and 641 increases, and thus the electrode fingers are damaged less frequently. Accordingly, the physical quantity sensor 1 has excellent impact resistance (mechanical strength).

As described above, the physical quantity sensor 1 includes the springs 53 and 54 that connect the support portion 51 and the movable body 52. Thus, it is possible to enable the movable body 52 to be displaced in the X-axis direction with respect to the support portion 51, with a simple configuration. The configuration of the springs 53 and 54 is not particularly limited. For example, any one of the springs 53 and 54 may be omitted.

As described above, the movable electrode finger 611 faces the fixed electrode finger 413 on the positive side (one side) of the X-axis direction. The movable electrode finger 621 faces the fixed electrode finger 423 on the negative side (the other side) of the X-axis direction. The movable electrode finger 631 faces the fixed electrode finger 433 on the positive side (one side) of the X-axis direction. The movable electrode finger 641 faces the fixed electrode finger 443 on the negative side (the other side) of the X-axis direction. Thus, when the acceleration Ax is applied, the electrostatic capacitance Ca formed between the movable electrode finger 611 and the fixed electrode finger 413 and between the movable electrode finger 631 and the fixed electrode finger 433 and the electrostatic capacitance Cb formed between the movable electrode finger 621 and the fixed electrode finger 423 and between the movable electrode finger 641 and the fixed electrode finger 443 change in phases which are opposite to each other. Thus, it is possible to cancel noise and to detect the acceleration Ax with higher accuracy. Detection sensitivity of the physical quantity is not deteriorated even though the length of the electrode finger is reduced. Further, according to such a configuration, the influence of heat deflection or warpage due to residual stress of the substrate 2 is substantially equal between the first and second fixed electrodes 41 and 42 having different polarities, and is substantially equal between the third and fourth fixed electrodes 43 and 44 having different polarities. Thus, the shift between the electrostatic capacitance Ca and Cb, which occurs by the influence is canceled. As a result, it is possible to detect the acceleration Ax with higher accuracy.

As described above, in the physical quantity sensor 1, the first fixed electrode 41 and the third fixed electrode 43 are disposed symmetrically with respect to the support portion 51 (central axis αx). The second fixed electrode 42 and the fourth fixed electrode 44 are disposed symmetrically with respect to the support portion 51 (central axis αx). The first movable electrode 61 and the third movable electrode 63 are disposed symmetrically with respect to the support portion 51 (central axis αx), and the second movable electrode 62 and the fourth movable electrode 64 are disposed symmetrically with respect to the support portion 51 (central axis αx). According to such a configuration, for example, it is possible to improve insensitivity to unnecessary vibration of the movable body 52 around the Z axis, and to detect the acceleration Ax with higher accuracy. That is, according to such a configuration, for example, in a case where the movable body 52 unintentionally rotates about the center O, if the gap between the movable electrode finger 611 and the fixed electrode finger 413 decreases, the gap between the movable electrode finger 631 and the fixed electrode finger 433 increases. Conversely, if the gap between the movable electrode finger 611 and the fixed electrode finger 413 increases, the gap between the movable electrode finger 631 and the fixed electrode finger 433 decreases. Therefore, the amount of changing the electrostatic capacitance between the movable electrode finger 611 and the fixed electrode finger 413 and the amount of changing the electrostatic capacitance between the movable electrode finger 631 and the fixed electrode finger 433 are canceled, and thus it is possible to reduce fluctuation of the electrostatic capacitance Ca. Similarly, if the gap between the movable electrode finger 621 and the fixed electrode finger 423 decreases, the gap between the movable electrode finger 641 and the fixed electrode finger 443 increases. Conversely, if the gap between the movable electrode finger 621 and the fixed electrode finger 423 increases, the gap between the movable electrode finger 641 and the fixed electrode finger 443 decreases. Therefore, the amount of changing the electrostatic capacitance between the movable electrode finger 621 and the fixed electrode finger 423 and the amount of changing the electrostatic capacitance between the movable electrode finger 641 and the fixed electrode finger 443 are canceled, and thus it is possible to reduce the fluctuation of the electrostatic capacitance Cb. Accordingly, the physical quantity sensor 1 has high insensitivity to unnecessary vibration of the movable body about the Z axis and is capable of detecting the acceleration Ax with higher accuracy.

As described above, the fixed electrode finger 413 and the fixed electrode finger 433 are electrically connected to each other, and the fixed electrode finger 423 and the fixed electrode finger 443 are electrically connected to each other. Thus, as described above, when the acceleration Ax is applied, the electrostatic capacitance Ca formed between the movable electrode finger 611 and the fixed electrode finger 413 and between the movable electrode finger 631 and the fixed electrode finger 433, and the electrostatic capacitance Cb formed between the movable electrode finger 621 and the fixed electrode finger 423 and between the movable electrode finger 641 and the fixed electrode finger 443 change in phases which are opposite to each other. Thus, it is possible to cancel noise and to detect the acceleration Ax with higher accuracy. The detection sensitivity of the physical quantity is not deteriorated even though the length of the electrode finger is reduced.

As described above, the first fixed electrode 41 includes the fixation portion (first fixation portion) 411 fixed to the substrate 2 and the trunk portion (first trunk portion) 412 provided in the fixation portion 411. The fixed electrode finger 413 is provided in the trunk portion 412 such that the longitudinal direction thereof is directed along the Y-axis direction. Similarly, the second fixed electrode 42 includes the fixation portion (second fixation portion) 421 fixed to the substrate 2 and the trunk portion (second trunk portion) 422 provided in the fixation portion 421. The fixed electrode finger 423 is provided in the trunk portion 422 such that the longitudinal direction thereof is directed along the Y-axis direction. The trunk portion 422 is positioned closer to the support portion 51 (central axis αx) side than the trunk portion 412 side. The fixed electrode finger 413 is provided in the trunk portion 412 on an opposite side of the support portion 51 (central axis αx). The fixed electrode finger 423 is provided in the trunk portion 422 on the support portion 51 (central axis αx) side. With such a configuration, the fixation portion 411 and the fixation portion 421 are easily arranged to be near to each other. Therefore, it is possible to more effectively have an influence of heat deflection or warpage due to residual stress of the substrate 2 on the first and second fixed electrodes 41 and 42 equally.

As described above, the fixation portion 411 and the fixation portion 421 are disposed to be adjacent to each other in the Y-axis direction. Thus, it is easy to arrange the fixation portions 411 and 421. The phrase of "being disposed to be adjacent" means, for example, that the fixation portions 411 and 421 are arranged side by side without another structural member (for example, a portion of the element unit 3) being positioned between the fixation portions 411 and 421.

As described above, the third fixed electrode 43 includes the fixation portion (third fixation portion) 431 fixed to the substrate 2 and the trunk portion (third trunk portion) 432 provided in the fixation portion 431. The fixed electrode finger 433 is provided in the trunk portion 432 such that the longitudinal direction thereof is directed along the Y-axis direction. Similarly, the fourth fixed electrode 44 includes the fixation portion (fourth fixation portion) 441 fixed to the substrate 2 and the trunk portion (fourth trunk portion) 442 provided in the fixation portion 441. The fixed electrode finger 443 is provided in the trunk portion 442 such that the longitudinal direction thereof is directed along the Y-axis direction. The trunk portion 442 is positioned closer to the support portion 51 (central axis αx) side than the trunk portion 432 side. The fixed electrode finger 433 is provided in the trunk portion 432 on an opposite side of the support portion 51 (central axis αx). The fixed electrode finger 443 is provided in the trunk portion 442 on the support portion 51 (central axis αx) side. With such a configuration, the fixation portion 431 and the fixation portion 441 are easily arranged to be near to each other. Therefore, it is possible to more effectively have an influence of heat deflection or warpage due to residual stress of a substrate 2 on the third and fourth fixed electrodes 43 and 44 equally.

As described above, the fixation portion 431 and the fixation portion 441 are disposed to be adjacent to each other in the Y-axis direction. Thus, it is easy to arrange the fixation portions 431 and 441. The phrase of "being disposed to be adjacent" means, for example, that the fixation portions 431 and 441 are arranged side by side without another structural member (for example, a portion of the element unit 3) being positioned between the fixation portions 431 and 441.

Second Embodiment

Next, a physical quantity sensor according to a second embodiment will be described.

Figure 5:
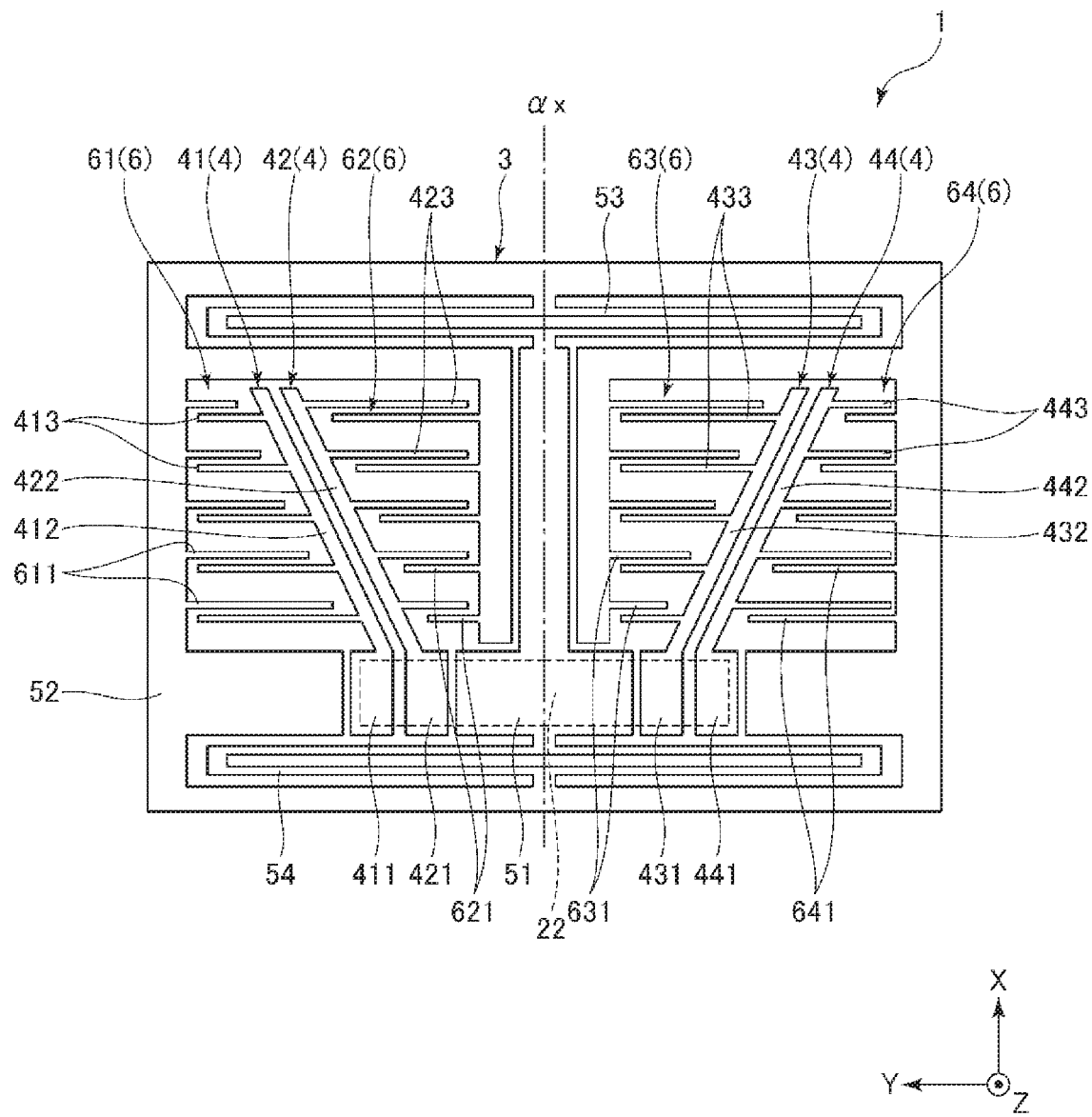
FIG. 5 is a plan view illustrating a physical quantity sensor according to a second embodiment.

FIG. 5 is a plan view illustrating the physical quantity sensor according to the second embodiment. For easy descriptions, in FIG. 5, illustrations of the substrate 2 and the lid 8 are omitted, and only the element unit 3 is illustrated.

A physical quantity sensor 1 in this embodiment is similar to the above-described physical quantity sensor 1 according to the first embodiment except that, mainly, a configuration of the element unit 3 is different from that in the first embodiment. In the following descriptions, the physical quantity sensor 1 in the second embodiment will be described focusing on a difference from the above-described first embodiment, and descriptions of the similar items will not be repeated. In FIG. 5, the same components as those in the above-described first embodiment are denoted by the same reference signs.

As illustrated in FIG. 5, in the physical quantity sensor 1 in this embodiment, the arrangement of the third fixed electrode 43, the third movable electrode 63, the fourth fixed electrode 44, and the fourth movable electrode 64 is reversed in comparison to that in the above-described first embodiment. That is, in comparison to the above-described first embodiment, the first fixed electrode 41 and the third fixed electrode 43 are not symmetrical, and the second fixed electrode 42 and the fourth fixed electrode are not symmetrical. Similarly, the first movable electrode 61 and the third movable electrode 63 are not symmetrical, and the second movable electrode 62 and the fourth movable electrode 64 are not symmetrical.

With such a second embodiment, it is also possible to exhibit effects similar to those in the above-described first embodiment.

Third Embodiment

Next, a physical quantity sensor according to a third embodiment will be described.

Figure 6:
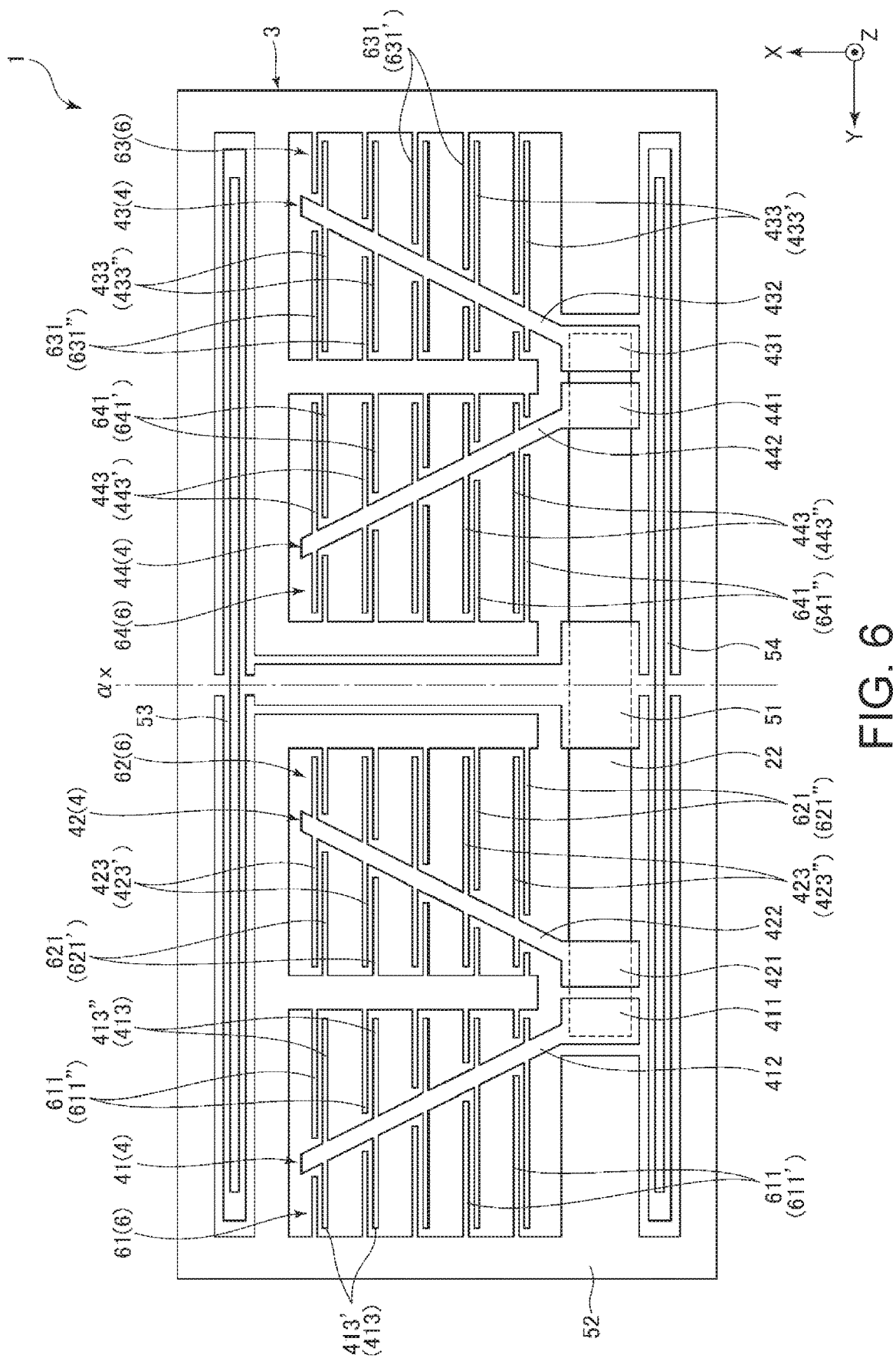
FIG. 6 is a plan view illustrating a physical quantity sensor according to a third embodiment.

FIG. 6 is a plan view illustrating the physical quantity sensor according to the third embodiment. For easy descriptions, in FIG. 6, illustrations of the substrate 2 and the lid 8 are omitted, and only the element unit 3 is illustrated.

A physical quantity sensor 1 in this embodiment is similar to the above-described physical quantity sensor 1 according to the first embodiment except that, mainly, a configuration of the element unit 3 is different from that in the first embodiment. In the following descriptions, the physical quantity sensor 1 in the third embodiment will be described focusing on a difference from the above-described first embodiment, and descriptions of the similar items will not be repeated. In FIG. 6, the same components as those in the above-described first embodiment are denoted by the same reference signs.

As illustrated in FIG. 6, in the first and second fixed electrodes 41 and 42, the trunk portions 412 and 422 are inclined from the X axis in reverse directions, and a distance between the trunk portions 412 and 422 gradually increases toward the positive side of the X-axis direction. Each of the plurality of fixed electrode fingers 413 extends from the trunk portion 412 toward both sides of the Y-axis direction. That is, the fixed electrode fingers 413 include a plurality of fixed electrode fingers 413' extending from the trunk portion 412 toward the positive side of the Y-axis direction and a plurality of fixed electrode fingers 413" extending from the trunk portion 412 toward the negative side of the Y-axis direction. Similarly, each of the plurality of fixed electrode fingers 423 extends from the trunk portion 422 toward both sides of the Y-axis direction. That is, the fixed electrode fingers 423 include a plurality of fixed electrode fingers 423' extending from the trunk portion 422 toward the positive side of the Y-axis direction and a plurality of fixed electrode fingers 423" extending from the trunk portion 422 toward the negative side of the Y-axis direction.

In order to correspond to such fixed electrode fingers 413, the movable electrode fingers 611 include a plurality of movable electrode fingers 611' arranged to fit with the plurality of fixed electrode fingers 413' and a plurality of movable electrode fingers 611" arranged to fit with the plurality of fixed electrode fingers 413". Similarly, in order to correspond to the fixed electrode fingers 423, the movable electrode fingers 621 include a plurality of movable electrode fingers 621' arranged to fit with the plurality of fixed electrode fingers 423' and a plurality of movable electrode fingers 621" arranged to fit with the plurality of fixed electrode fingers 423".

In the third and fourth fixed electrodes 43 and 44, the trunk portions 432 and 442 are inclined from the X axis in reverse directions, and a distance between the trunk portions 432 and 442 gradually increases toward the positive side of the X-axis direction. Each of the plurality of fixed electrode fingers 433 extends from the trunk portion 432 toward both sides of the Y-axis direction. That is, the fixed electrode fingers 433 include a plurality of fixed electrode fingers 433' extending from the trunk portion 432 toward the negative side of the Y-axis direction and a plurality of fixed electrode fingers 433" extending from the trunk portion 432 toward the positive side of the Y-axis direction. Similarly, each of the plurality of fixed electrode fingers 443 extends from the trunk portion 442 toward both sides of the Y-axis direction. That is, the fixed electrode fingers 443 include a plurality of fixed electrode fingers 443' extending from the trunk portion 442 toward the negative side of the Y-axis direction and a plurality of fixed electrode fingers 443" extending from the trunk portion 442 toward the positive side of the Y-axis direction.

In order to correspond to such fixed electrode fingers 433, the movable electrode fingers 631 include a plurality of movable electrode fingers 631' arranged to fit with the plurality of fixed electrode fingers 433' and a plurality of movable electrode fingers 631" arranged to fit with the plurality of fixed electrode fingers 433". Similarly, in order to correspond to the fixed electrode fingers 443, the movable electrode fingers 641 include a plurality of movable electrode fingers 641' arranged to fit with the plurality of fixed electrode fingers 443' and a plurality of movable electrode fingers 641" arranged to fit with the plurality of fixed electrode fingers 443".

With such a third embodiment, it is also possible to exhibit effects similar to those in the above-described first embodiment. In particular, in this embodiment, it is possible to reduce the length of each of the electrode fingers 413, 423, 433, 443, 611, 621, 631, and 641 to about the half of that in the above-described first embodiment. Thus, the physical quantity sensor 1 having more excellent impact resistance is obtained.

Fourth Embodiment

Next, a physical quantity sensor according to a fourth embodiment will be described.

Figure 7:
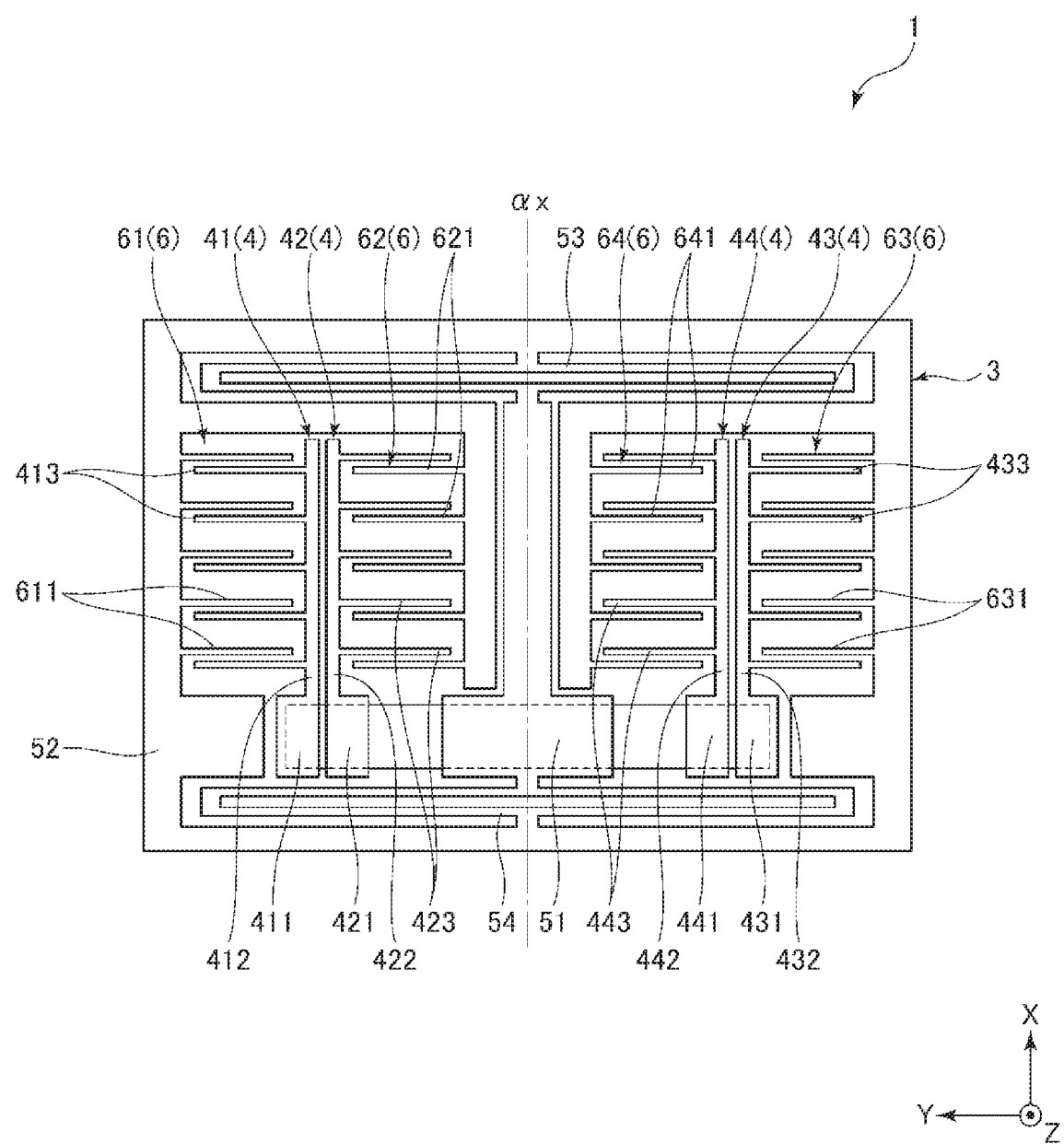
FIG. 7 is a plan view illustrating a physical quantity sensor according to a fourth embodiment.

FIG. 7 is a plan view illustrating the physical quantity sensor according to the fourth embodiment. For easy descriptions, in FIG. 7, illustrations of the substrate 2 and the lid 8 are omitted, and only the element unit 3 is illustrated.

A physical quantity sensor 1 in this embodiment is similar to the above-described physical quantity sensor 1 according to the first embodiment except that, mainly, a configuration of the element unit 3 is different from that in the first embodiment. In the following descriptions, the physical quantity sensor 1 in the fourth embodiment will be described focusing on a difference from the above-described first embodiment, and descriptions of the similar items will not be repeated. In FIG. 7, the same components as those in the above-described first embodiment are denoted by the same reference signs.

As illustrated in FIG. 7, in the physical quantity sensor 1 in this embodiment, each of the trunk portions 412, 422, 432, and 442 extends in the X-axis direction. The lengths of the plurality of fixed electrode fingers 413 supported by the trunk portion 412 are substantially equal to each other. The lengths of the plurality of movable electrode fingers 611 arranged to fit with the plurality of fixed electrode fingers 413 are also substantially equal to each other. Similarly, the lengths of the plurality of fixed electrode fingers 423 supported by the trunk portion 422 are substantially equal to each other. The lengths of the plurality of movable electrode fingers 621 arranged to fit with the plurality of fixed electrode fingers 423 are also substantially equal to each other. The lengths of the plurality of fixed electrode fingers 433 supported by the trunk portion 432 are substantially equal to each other. The lengths of the plurality of movable electrode fingers 631 arranged to fit with the plurality of fixed electrode fingers 433 are also substantially equal to each other. The lengths of the plurality of fixed electrode fingers 443 supported by the trunk portion 442 are substantially equal to each other. The lengths of the plurality of movable electrode fingers 641 arranged to fit with the plurality of fixed electrode fingers 443 are also substantially equal to each other.

With such a fourth embodiment, it is also possible to exhibit effects similar to those in the above-described first embodiment.

Fifth Embodiment

Next, a physical quantity sensor according to a fifth embodiment will be described.

Figure 8:
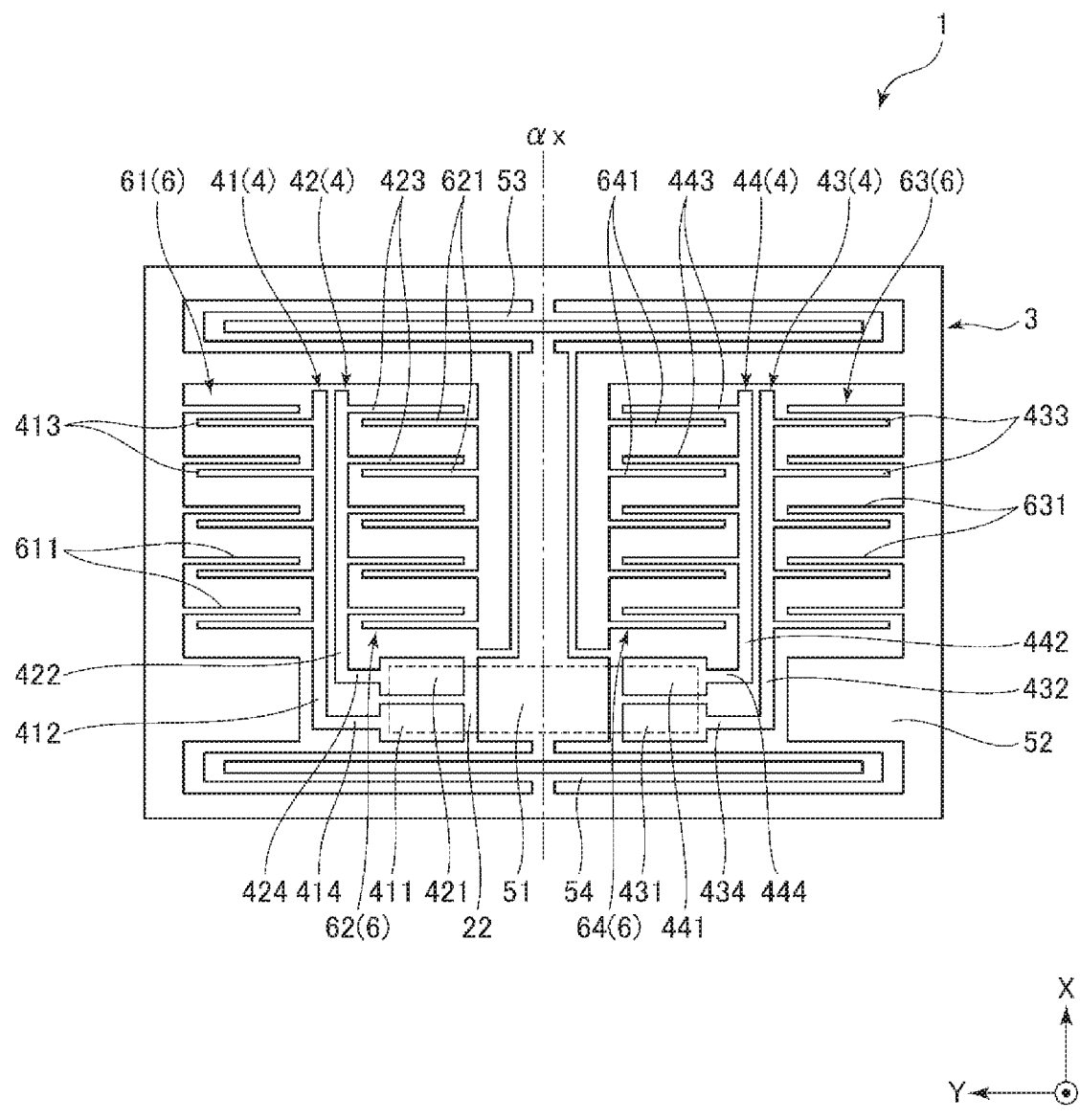
FIG. 8 is a plan view illustrating a physical quantity sensor according to a fifth embodiment.

FIG. 8 is a plan view illustrating the physical quantity sensor according to the fifth embodiment. For easy descriptions, in FIG. 8, illustrations of the substrate 2 and the lid 8 are omitted, and only the element unit 3 is illustrated.

A physical quantity sensor 1 in this embodiment is similar to the above-described physical quantity sensor 1 according to the fourth embodiment except that, mainly, a configuration of the element unit 3 is different from that in the fourth embodiment. In the following descriptions, the physical quantity sensor 1 in the fifth embodiment will be described focusing on a difference from the above-described fourth embodiment, and descriptions of the similar items will not be repeated. In FIG. 8, the same components as those in the above-described fourth embodiment are denoted by the same reference signs.

As illustrated in FIG. 8, the first fixed electrode 41 further includes a joining portion (first joining portion) 414 that joins the fixation portion 411 and the trunk portion 412, in addition to the fixation portion 411, the trunk portion 412, and the fixed electrode finger 413. The joining portion 414 extends from the fixation portion 411 toward the positive side of the Y-axis direction, and is connected to the end portion of the trunk portion 412 on the negative side of the X-axis direction. Similarly, the second fixed electrode 42 further includes a joining portion (second joining portion) 424 that joins the fixation portion 421 and the trunk portion 422, in addition to the fixation portion 421, the trunk portion 422, and the fixed electrode finger 423. The joining portion 424 extends from the fixation portion 421 toward the positive side of the Y-axis direction, and is connected to the end portion of the trunk portion 422 on the negative side of the X-axis direction. In such first and second fixed electrodes 41 and 42, the fixation portions 411 and 421 are arranged side by side so as to be adjacent to each other in the X-axis direction. Further, the fixation portions 411 and 421 are disposed to be adjacent to the support portion 51 in the Y-axis direction.

The third fixed electrode 43 further includes a joining portion (third joining portion) 434 that joins the fixation portion 431 and the trunk portion 432, in addition to the fixation portion 431, the trunk portion 432, and the fixed electrode finger 433. The joining portion 434 extends from the fixation portion 431 toward the negative side of the Y-axis direction, and is connected to the end portion of the trunk portion 432 on the negative side of the X-axis direction. Similarly, the fourth fixed electrode 44 further includes a joining portion (fourth joining portion) 444 that joins the fixation portion 441 and the trunk portion 442, in addition to the fixation portion 441, the trunk portion 442, and the fixed electrode finger 443. The joining portion 444 extends from the fixation portion 441 toward the negative side of the Y-axis direction, and is connected to the end portion of the trunk portion 442 on the negative side of the X-axis direction. In such third and fourth fixed electrodes 43 and 44, the fixation portions 431 and 441 are disposed to be adjacent to each other in the X-axis direction. Further, the fixation portions 431 and 441 are disposed to be adjacent to the support portion 51 in the Y-axis direction.

With such a fifth embodiment, it is also possible to exhibit effects similar to those in the above-described fourth embodiment. In particular, in this embodiment, the joining portions 414, 424, 434, and 444 are provided. Thus, the fixation portions 411, 421, 431, and 441 can be arranged to be closer to the portion of the support portion 51, which is bonded to the mount 22. Therefore, it is possible to effectively reduce the shift in, particularly, the Z-axis direction among the X-axis direction, the Y-axis direction, and the Z-axis direction, between the movable body 52 and the fixed electrode 4 (the shift occurs by residual stress of the substrate 2 or heat deflection). Accordingly, it is possible to detect the acceleration Ax with higher accuracy.

Sixth Embodiment

Next, a physical quantity sensor according to a sixth embodiment will be described.

Figure 9:
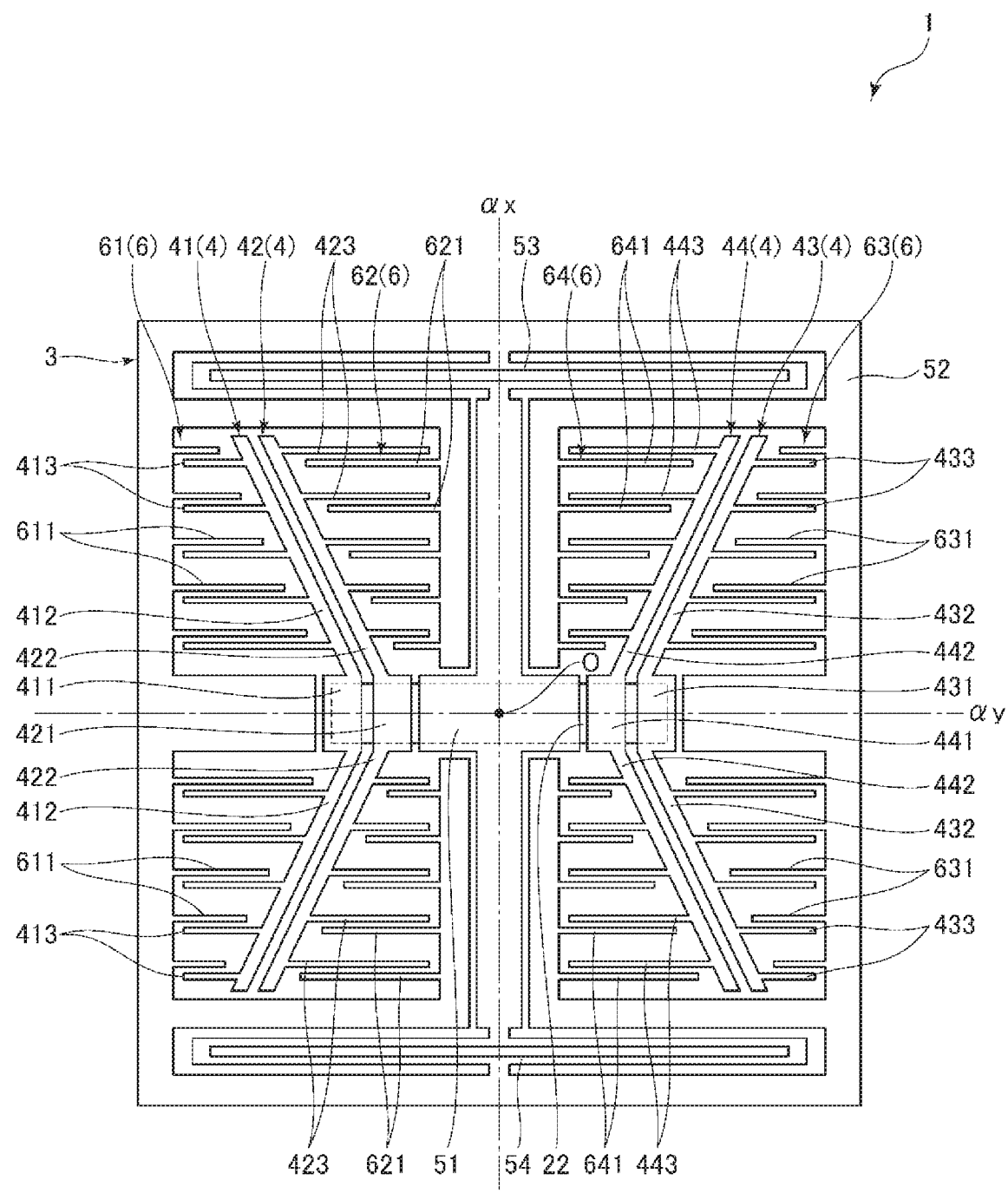
FIG. 9 is a plan view illustrating a physical quantity sensor according to a sixth embodiment.

FIG. 9 is a plan view illustrating the physical quantity sensor according to the sixth embodiment. For easy descriptions, in FIG. 9, illustrations of the substrate 2 and the lid 8 are omitted, and only the element unit 3 is illustrated.

A physical quantity sensor 1 in this embodiment is similar to the above-described physical quantity sensor 1 according to the first embodiment except that, mainly, a configuration of the element unit 3 is different from that in the first embodiment. In the following descriptions, the physical quantity sensor 1 in the sixth embodiment will be described focusing on a difference from the above-described first embodiment, and descriptions of the similar items will not be repeated. In FIG. 9, the same components as those in the above-described first embodiment are denoted by the same reference signs.

As illustrated in FIG. 9, the first fixed electrode 41 includes a pair of trunk portions 412 extending in a direction inclined from each of the X axis and the Y axis. The pair of trunk portions 412 are positioned on both sides of the fixation portion 411 in the X-axis direction. That is, one trunk portion 412 extends from the fixation portion 411 toward the positive side of the X-axis direction in a direction inclined from the X axis. The other trunk portion 412 extends from the fixation portion 411 toward the negative side of the X-axis direction in the direction inclined from the X-axis. The pair of trunk portions 412 are symmetrically arranged with respect to a central axis αy which intersects the center O of the element unit 3 and extends in the Y-axis direction. The plurality of fixed electrode fingers 413 is provided in each of the trunk portions 412. The plurality of movable electrode fingers 611 fit with the plurality of fixed electrode fingers 413 is provided in the movable body 52.

Similarly, the second fixed electrode 42 includes a pair of trunk portions 422 extending in a direction inclined from each of the X axis and the Y axis. The pair of trunk portions 422 are positioned on both sides of the fixation portion 421 in the X-axis direction and are symmetrically arranged with respect to the central axis αy. The plurality of fixed electrode fingers 423 is provided in each of the trunk portions 422. The plurality of movable electrode fingers 621 fit with the plurality of fixed electrode fingers 423 is provided in the movable body 52.

Similarly, the third fixed electrode 43 includes a pair of trunk portions 432 extending in a direction inclined from each of the X axis and the Y axis. The pair of trunk portions 432 are positioned on both sides of the fixation portion 431 in the X-axis direction and are symmetrically arranged with respect to the central axis αy. The plurality of fixed electrode fingers 433 is provided in each of the trunk portions 432. The plurality of movable electrode fingers 631 fit with the plurality of fixed electrode fingers 433 is provided in the movable body 52.

Similarly, the fourth fixed electrode 44 includes a pair of trunk portions 442 extending in a direction inclined from each of the X axis and the Y axis. The pair of trunk portions 442 are positioned on both sides of the fixation portion 441 in the X-axis direction and are symmetrically arranged with respect to the central axis αy. The plurality of fixed electrode fingers 443 is provided in each of the trunk portions 442. The plurality of movable electrode fingers 641 fit with the plurality of fixed electrode fingers 443 is provided in the movable body 52.

According to such a configuration, it is possible to increase the number of fixed electrode fingers 413, 423, 433, and 443 and the movable electrode fingers 611, 621, 631, and 641 to about twice, for example, in comparison to the above-described first embodiment. Therefore, for example, if the length of each of the electrode fingers is equal to that in the above-described first embodiment, it is possible to increase the electrostatic capacitance Ca and Cb. Thus, when the acceleration Ax is applied, the amount of the electrostatic capacitance Ca and Cb changing also increases. Accordingly, the sensitivity is improved, and it is possible to detect the acceleration Ax with higher accuracy. From another viewpoint, for example, if the magnitude of the electrostatic capacitance Ca and Cb is equal to that in the above-described first embodiment, it is possible to shorten the fixed electrode fingers 413, 423, 433, and 443 and the movable electrode fingers 611, 621, 631, and 641 as much as the magnitude thereof is equal. Thus, each of the electrode fingers 413, 423, 433, 443, 611, 621, 631, and 641 is damaged much less frequently.

The support portion 51 is bonded to the upper surface of the mount 22 at the center portion of the mount 22 in the longitudinal direction, corresponding to such a configuration.

With such a sixth embodiment, it is also possible to exhibit effects similar to those in the above-described first embodiment.

Seventh Embodiment

Next, a physical quantity sensor according to a seventh embodiment will be described.

Figure 10:
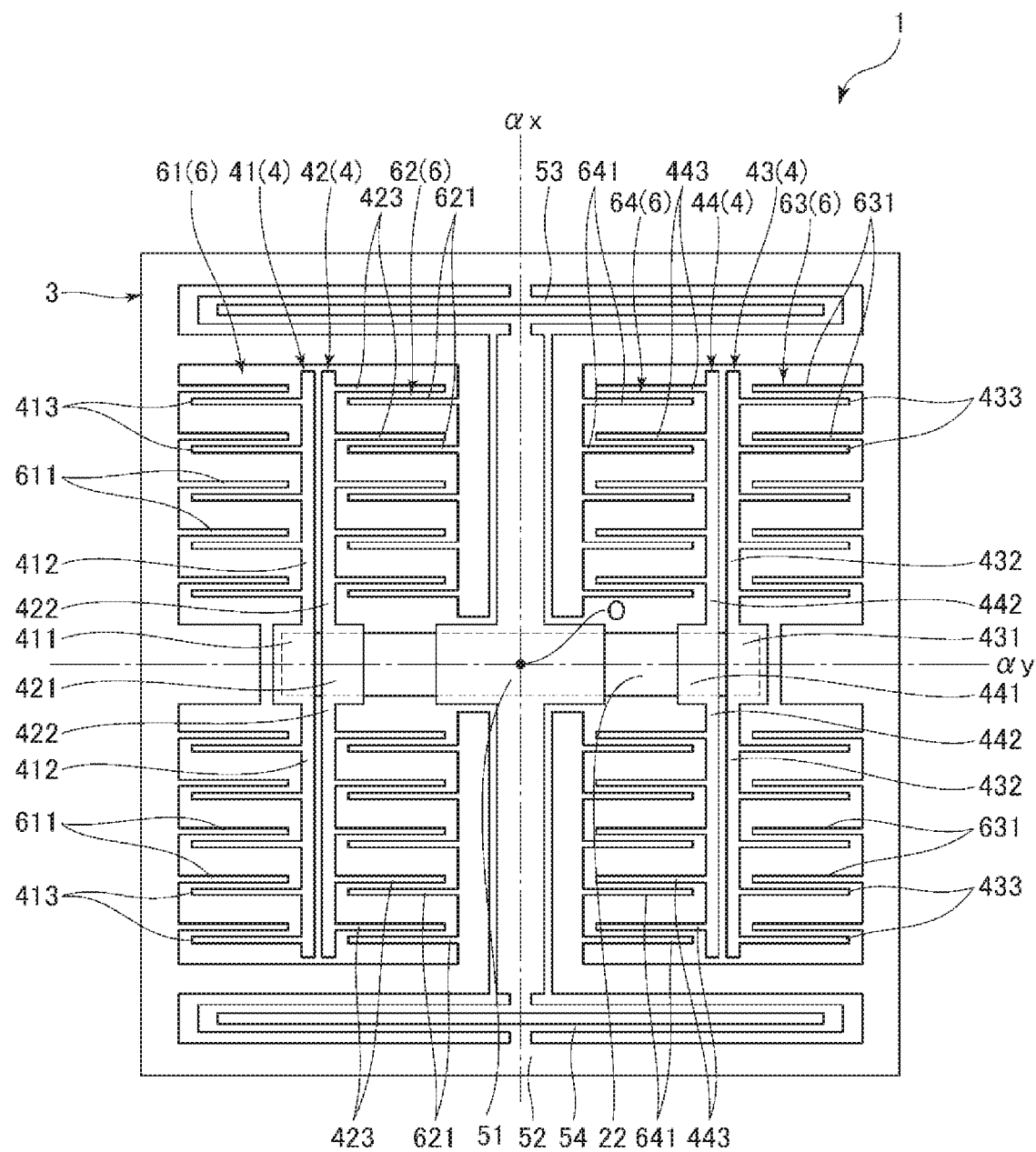
FIG. 10 is a plan view illustrating a physical quantity sensor according to a seventh embodiment.
Figure 10:
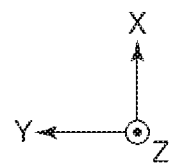

FIG. 10 is a plan view illustrating the physical quantity sensor according to the seventh embodiment. For easy descriptions, in FIG. 10, illustrations of the substrate 2 and the lid 8 are omitted, and only the element unit 3 is illustrated.

A physical quantity sensor 1 in this embodiment is similar to the above-described physical quantity sensor 1 according to the fourth embodiment except that, mainly, a configuration of the element unit 3 is different from that in the fourth embodiment. In the following descriptions, the physical quantity sensor 1 in the seventh embodiment will be described focusing on a difference from the above-described fourth embodiment, and descriptions of the similar items will not be repeated. In FIG. 10, the same components as those in the above-described fourth embodiment are denoted by the same reference signs.

As illustrated in FIG. 10, the first fixed electrode 41 includes a pair of trunk portions 412 extending in the X-axis direction. The pair of trunk portions 412 are positioned on both sides of the fixation portion 411 in the X-axis direction. That is, one trunk portion 412 extends from the fixation portion 411 toward the positive side of the X-axis direction. The other trunk portion 412 extends from the fixation portion 411 toward the negative side of the X-axis direction. The plurality of fixed electrode fingers 413 is provided in each of the trunk portions 412. The plurality of movable electrode fingers 611 fit with the plurality of fixed electrode fingers 413 is provided in the movable body 52.

Similarly, the second fixed electrode 42 includes a pair of trunk portions 422 extending in the X-axis direction. The pair of trunk portions 422 are positioned on both sides of the fixation portion 421 in the X-axis direction. The plurality of fixed electrode fingers 423 is provided in each of the trunk portions 422. The plurality of movable electrode fingers 621 fit with the plurality of fixed electrode fingers 423 is provided in the movable body 52.

Similarly, the third fixed electrode 43 includes a pair of trunk portions 432 extending in the X-axis direction. The pair of trunk portions 432 are positioned on both sides of the fixation portion 431 in the X-axis direction. The plurality of fixed electrode fingers 433 is provided in each of the trunk portions 432. The plurality of movable electrode fingers 631 fit with the plurality of fixed electrode fingers 433 is provided in the movable body 52.

Similarly, the fourth fixed electrode 44 includes a pair of trunk portions 442 extending in the X-axis direction. The pair of trunk portions 442 are positioned on both sides of the fixation portion 441 in the X-axis direction. The plurality of fixed electrode fingers 443 is provided in each of the trunk portions 442. The plurality of movable electrode fingers 641 fit with the plurality of fixed electrode fingers 443 is provided in the movable body 52.

According to such a configuration, it is possible to increase the number of fixed electrode fingers 413, 423, 433, and 443 and the movable electrode fingers 611, 621, 631, and 641, for example, in comparison to the above-described fourth embodiment. Therefore, for example, if the lengths of the electrode fingers are equal to those in the above-described fourth embodiment, it is possible to increase the electrostatic capacitance Ca and Cb. Thus, when the acceleration Ax is applied, the amount of the electrostatic capacitance Ca and Cb changing also increases. Accordingly, the sensitivity is improved, and it is possible to detect the acceleration Ax with higher accuracy. From another viewpoint, for example, if the magnitude of the electrostatic capacitance Ca and Cb is equal to that in the above-described fourth embodiment, it is possible to shorten the fixed electrode fingers 413, 423, 433, and 443 and the movable electrode fingers 611, 621, 631, and 641 as much as the magnitude thereof is equal. Thus, each of the electrode fingers 413, 423, 433, 443, 611, 621, 631, and 641 is damaged much less frequently.

The support portion 51 is bonded to the upper surface of the mount 22 at the center portion of the mount 22 in the longitudinal direction, corresponding to such a configuration.

With such a seventh embodiment, it is also possible to exhibit effects similar to those in the above-described first embodiment.

Eighth Embodiment

Next, a physical quantity sensor according to an eighth embodiment will be described.

Figure 11:
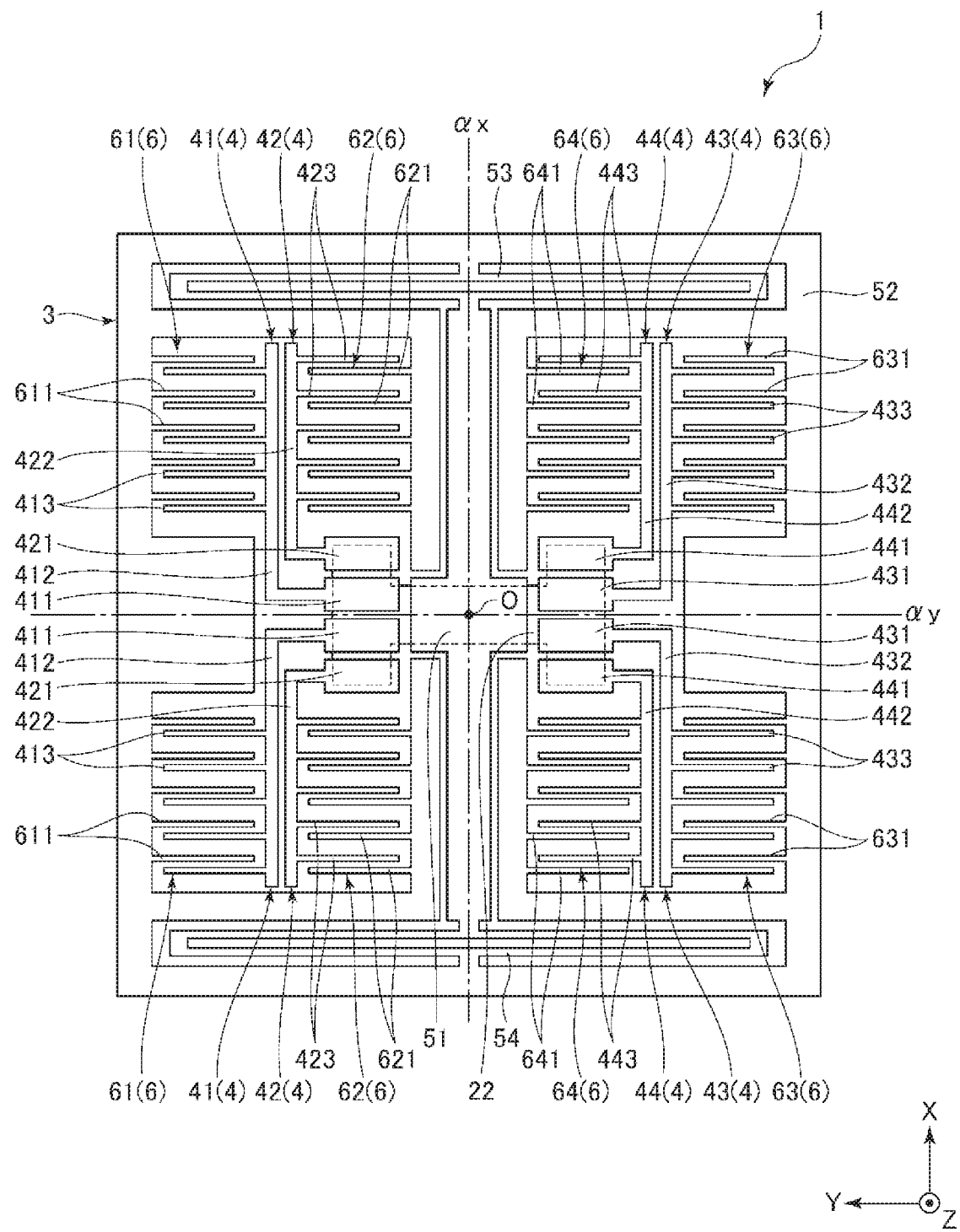
FIG. 11 is a plan view illustrating a physical quantity sensor according to an eighth embodiment.
Figure 12:
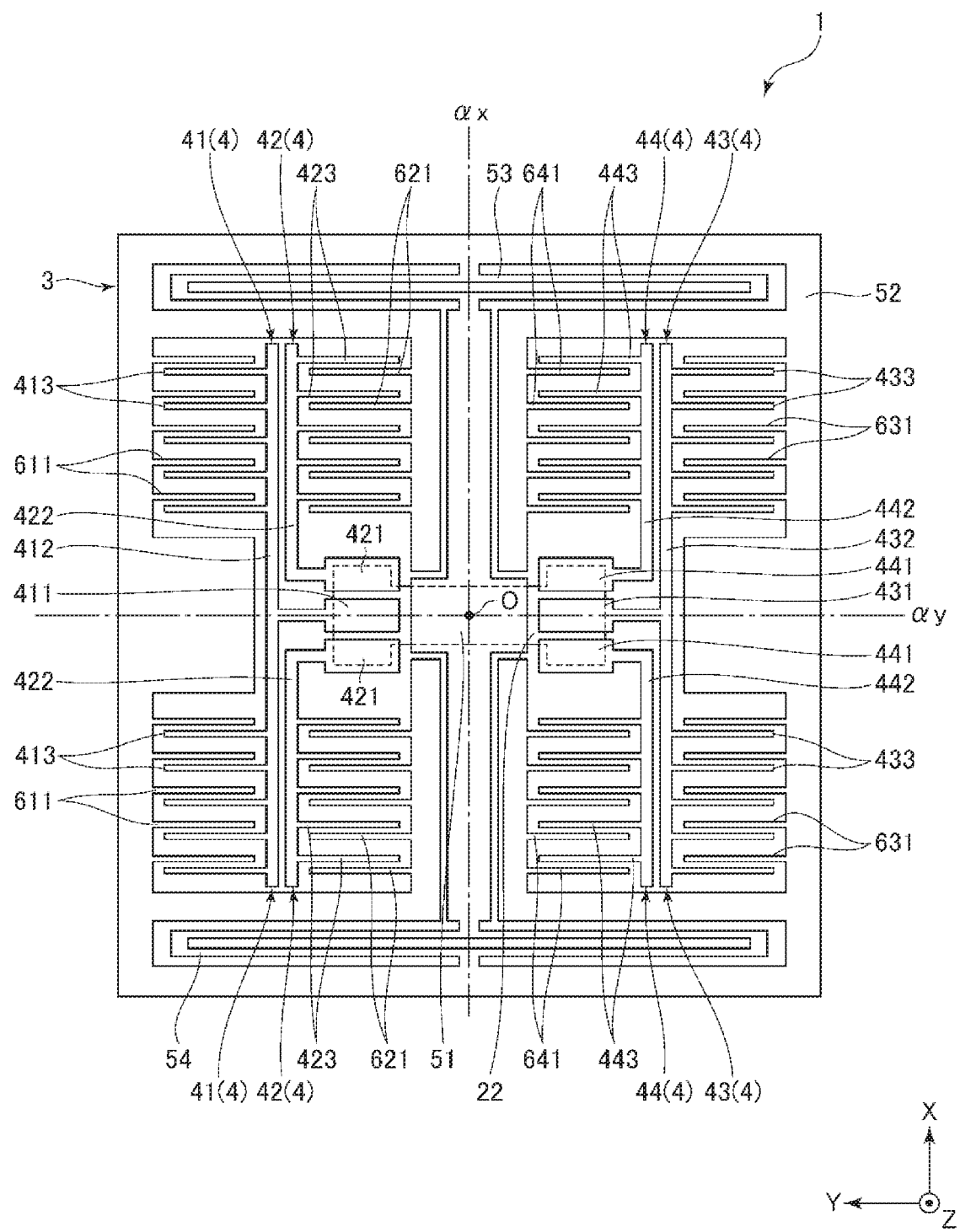
FIG. 12 is a plan view illustrating a modification example of an element unit illustrated in FIG. 11.

FIG. 11 is a plan view illustrating the physical quantity sensor according to the eighth embodiment. FIG. 12 is a plan view illustrating a modification example of an element unit illustrated in FIG. 11. For easy descriptions, in FIGS. 11 and 12, illustrations of the substrate 2 and the lid 8 are omitted, and only the element unit 3 is illustrated.

A physical quantity sensor 1 in this embodiment is similar to the above-described physical quantity sensor 1 according to the fifth embodiment except that, mainly, a configuration of the element unit 3 is different from that in the fifth embodiment. In the following descriptions, the physical quantity sensor 1 in the eighth embodiment will be described focusing on a difference from the above-described fifth embodiment, and descriptions of the similar items will not be repeated. In FIG. 11, the same components as those in the above-described fifth embodiment are denoted by the same reference signs.

As illustrated in FIG. 11, in the physical quantity sensor 1 in this embodiment, a pair of fixed electrodes 4 are provided side by side in the X-axis direction. The pair of fixed electrodes 4 are substantially symmetrically arranged with respect to the central axis αy. According to such a configuration, it is possible to increase the number of fixed electrode fingers 413, 423, 433, and 443 and the movable electrode fingers 611, 621, 631, and 641, in comparison to the above-described fifth embodiment. Therefore, for example, if the lengths of the electrode fingers are equal to those in the above-described fifth embodiment, it is possible to increase the electrostatic capacitance Ca and Cb. Thus, when the acceleration Ax is applied, the amount of the electrostatic capacitance Ca and Cb changing also increases. Accordingly, the sensitivity is improved, and it is possible to detect the acceleration Ax with higher accuracy. From another viewpoint, for example, if the magnitude of the electrostatic capacitance Ca and Cb is equal to that in the above-described fifth embodiment, it is possible to shorten the fixed electrode fingers 413, 423, 433, and 443 and the movable electrode fingers 611, 621, 631, and 641 as much as the magnitude thereof is equal. Thus, each of the electrode fingers 413, 423, 433, 443, 611, 621, 631, and 641 is damaged much less frequently.

The support portion 51 is bonded to the upper surface of the mount 22 at the center portion of the mount 22 in the longitudinal direction, corresponding to such a configuration.

With such an eighth embodiment, it is also possible to exhibit effects similar to those in the above-described first embodiment. For example, as illustrated in FIG. 12, fixation portions 411 of the pair of first fixed electrodes 41 may be integrated, and trunk portions 412 thereof may be integrated. Similarly, fixation portions 431 of a pair of third fixed electrodes 43 may be integrated, and trunk portions 432 of the pair of third fixed electrodes may be integrated.

Ninth Embodiment

Next, a physical quantity sensor according to a ninth embodiment will be described.

Figure 13:
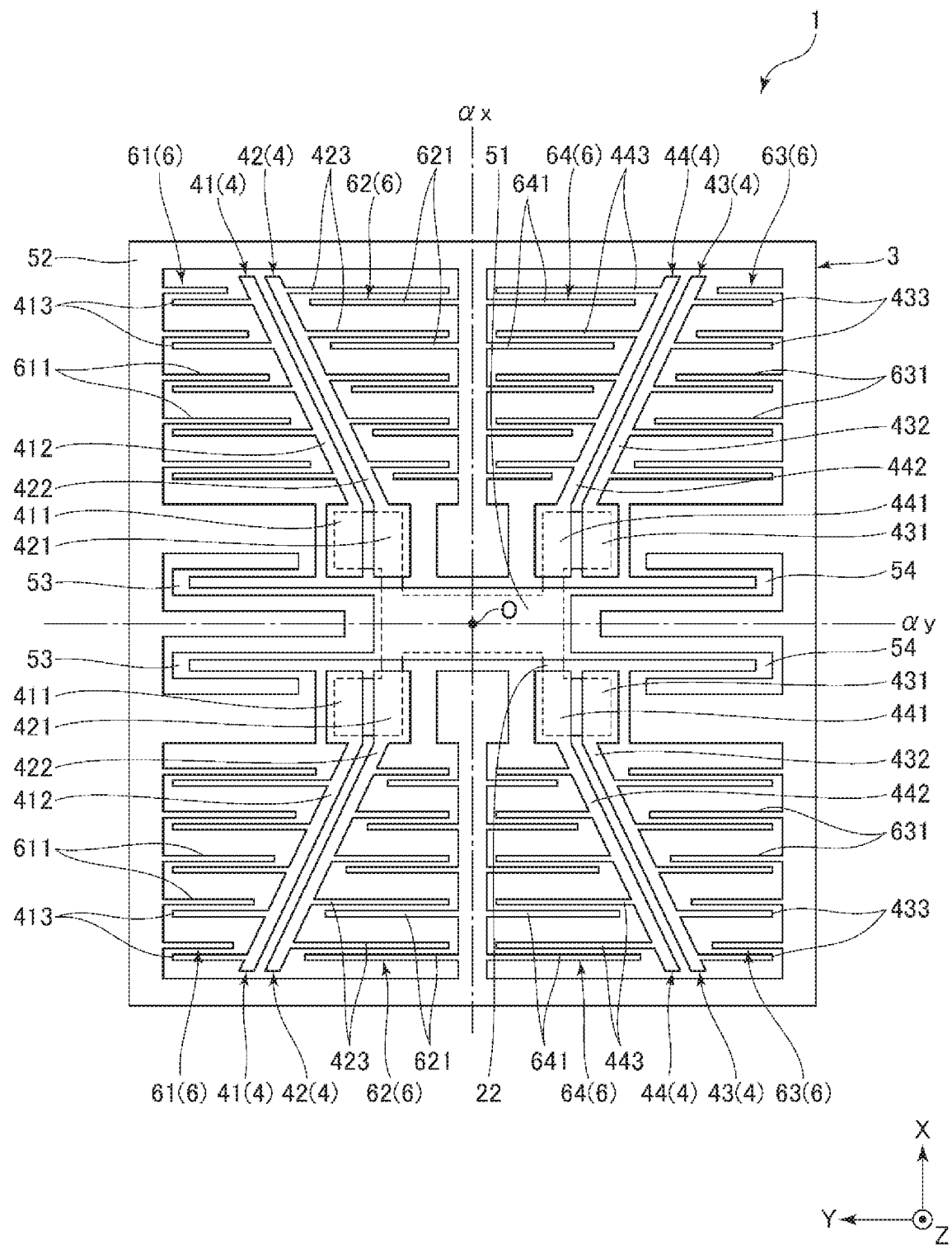
FIG. 13 is a plan view illustrating a physical quantity sensor according to a ninth embodiment.

FIG. 13 is a plan view illustrating the physical quantity sensor according to the ninth embodiment. For easy descriptions, in FIG. 13, illustrations of the substrate 2 and the lid 8 are omitted, and only the element unit 3 is illustrated.

A physical quantity sensor 1 in this embodiment is similar to the above-described physical quantity sensor 1 according to the first embodiment except that, mainly, a configuration of the element unit 3 is different from that in the first embodiment. In the following descriptions, the physical quantity sensor 1 in the ninth embodiment will be described focusing on a difference from the above-described first embodiment, and descriptions of the similar items will not be repeated. In FIG. 13, the same components as those in the above-described first embodiment are denoted by the same reference signs.

As illustrated in FIG. 13, in the physical quantity sensor 1 in this embodiment, a pair of fixed electrodes 4 are provided side by side in the X-axis direction. The pair of fixed electrodes 4 are substantially symmetrically arranged with respect to the central axis αy. According to such a configuration, it is possible to increase the number of fixed electrode fingers 413, 423, 433, and 443 and the movable electrode fingers 611, 621, 631, and 641, in comparison to the above-described first embodiment. Therefore, for example, if the lengths of the electrode fingers are equal to those in the above-described first embodiment, it is possible to increase the electrostatic capacitance Ca and Cb. Thus, when the acceleration Ax is applied, the amount of the electrostatic capacitance Ca and Cb changing also increases. Accordingly, the sensitivity is improved, and it is possible to detect the acceleration Ax with higher accuracy. From another viewpoint, for example, if the magnitude of the electrostatic capacitance Ca and Cb is equal to that in the above-described first embodiment, it is possible to shorten the fixed electrode fingers 413, 423, 433, and 443 and the movable electrode fingers 611, 621, 631, and 641 as much as the magnitude thereof is equal. Thus, each of the electrode fingers 413, 423, 433, 443, 611, 621, 631, and 641 is damaged much less frequently.

The support portion 51 is positioned between the pair of fixed electrodes 4. Specifically, the support portion 51 is positioned between the fixation portions 411, 421, 431, and 441 of one fixed electrode 4 and the fixation portions 411, 421, 431, and 441 of the other fixed electrode 4, and extends in the Y-axis direction. Thus, the end portion of the support portion 51 on the positive side of the Y-axis direction is connected to the movable body 52 by a pair of springs 53. The end portion of the support portion on the negative side of the Y-axis direction is connected to the movable body 52 by a pair of springs 54. If such an arrangement is performed, the fixation portions 411, 421, 431, and 441 can be arranged to be close to the portion of the support portion 51, which is bonded to the mount 22.

With such a ninth embodiment, it is also possible to exhibit effects similar to those in the above-described first embodiment.

Tenth Embodiment

Next, a physical quantity sensor according to a tenth embodiment will be described.

Figure 14:
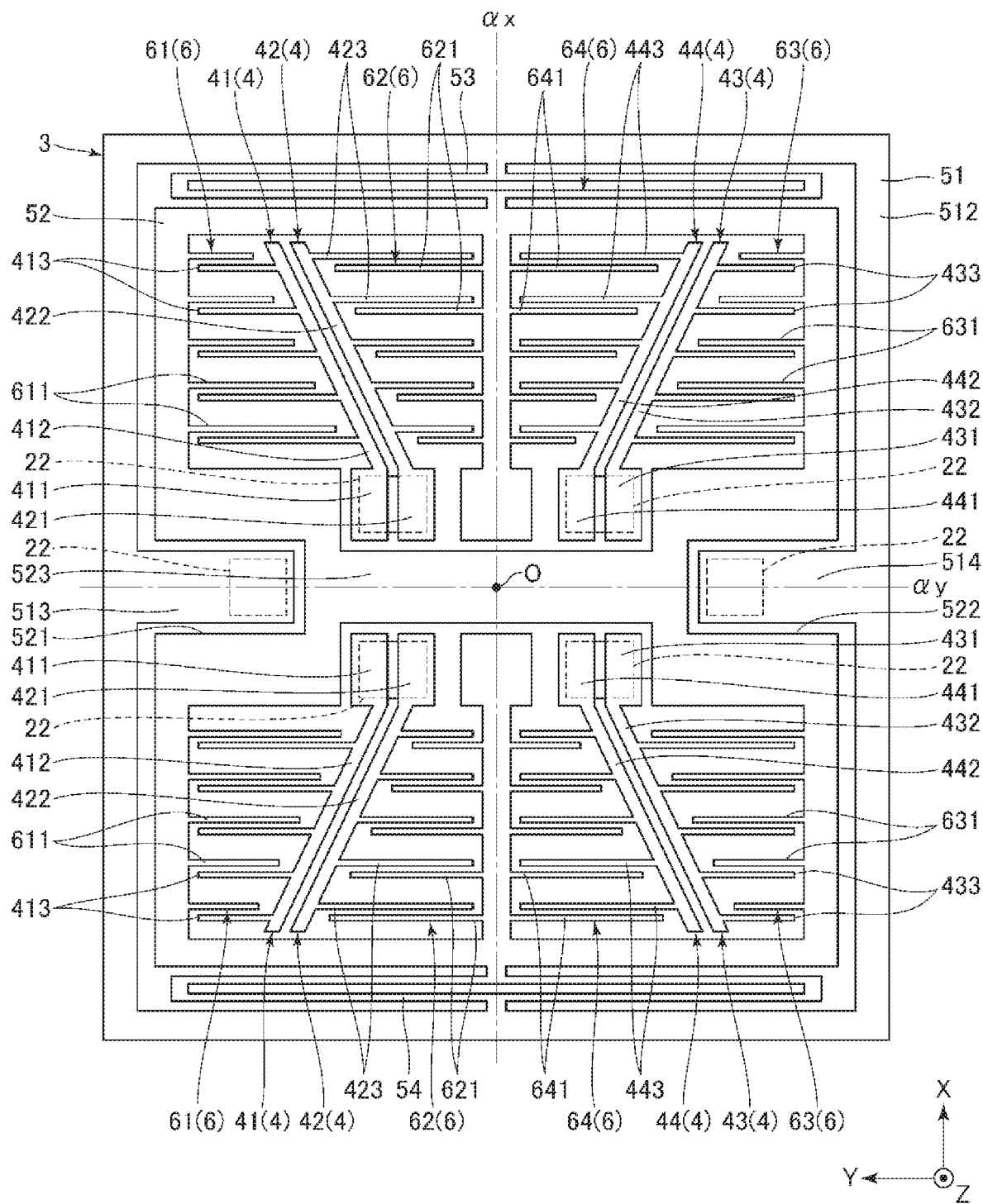
FIG. 14 is a plan view illustrating a physical quantity sensor according to a tenth embodiment.

FIG. 14 is a plan view illustrating the physical quantity sensor according to the tenth embodiment. For easy descriptions, in FIG. 14, illustrations of the substrate 2 and the lid 8 are omitted, and only the element unit 3 is illustrated.

A physical quantity sensor 1 in this embodiment is similar to the above-described physical quantity sensor 1 according to the ninth embodiment except that, mainly, a configuration of the element unit 3 is different from that in the first embodiment. In the following descriptions, the physical quantity sensor 1 in the eleventh embodiment will be described focusing on a difference from the above-described ninth embodiment, and descriptions of the similar items will not be repeated. In FIG. 14, the same components as those in the above-described ninth embodiment are denoted by the same reference signs.

As illustrated in FIG. 14, the movable body 52 includes notches 521 and 522 formed on both sides of the Y-axis direction. The movable body 52 includes a beam 523 which is connected to the notches 521 and 522 and is disposed to distinguish the fixed electrode 4 positioned on the positive side of the X-axis direction from the fixed electrode 4 positioned on the negative side of the X-axis direction, as a partition.

The support portion 51 is provided on the outside of the movable body 52. The support portion 51 has a frame shape and is provided to surround the movable body 52. The support portion 51 includes a base portion 512 having a frame shape and a pair of protruding portions 513 and 514 which respectively protrude from the base portion 512 toward the insides of the notches 521 and 522. Tip portions (end portions on the center O side) of the protruding portions 513 and 514 are bonded to the mount 22.

Each of the springs 53 and 54 is positioned between the movable body 52 and the support portion 51. The spring 53 joins the end portion of the movable body 52 on the positive side of the X-axis direction and the end portion of the support portion 51 on the positive side of the X-axis direction. The spring 54 joins the end portion of the movable body 52 on the negative side of the X-axis direction and the end portion of the support portion 51 on the negative side of the X-axis direction. Thus, the movable body 52 can be supported on both sides of the X-axis direction, and thus the attitude and the movement of the movable body 52 are stabilized. Therefore, it is possible to reduce unnecessary vibration and to detect the acceleration Ax with higher accuracy.

With such a tenth embodiment, it is also possible to exhibit effects similar to those in the above-described first embodiment.

Eleventh Embodiment

Next, a physical quantity sensor according to an eleventh embodiment will be described.

Figure 15:
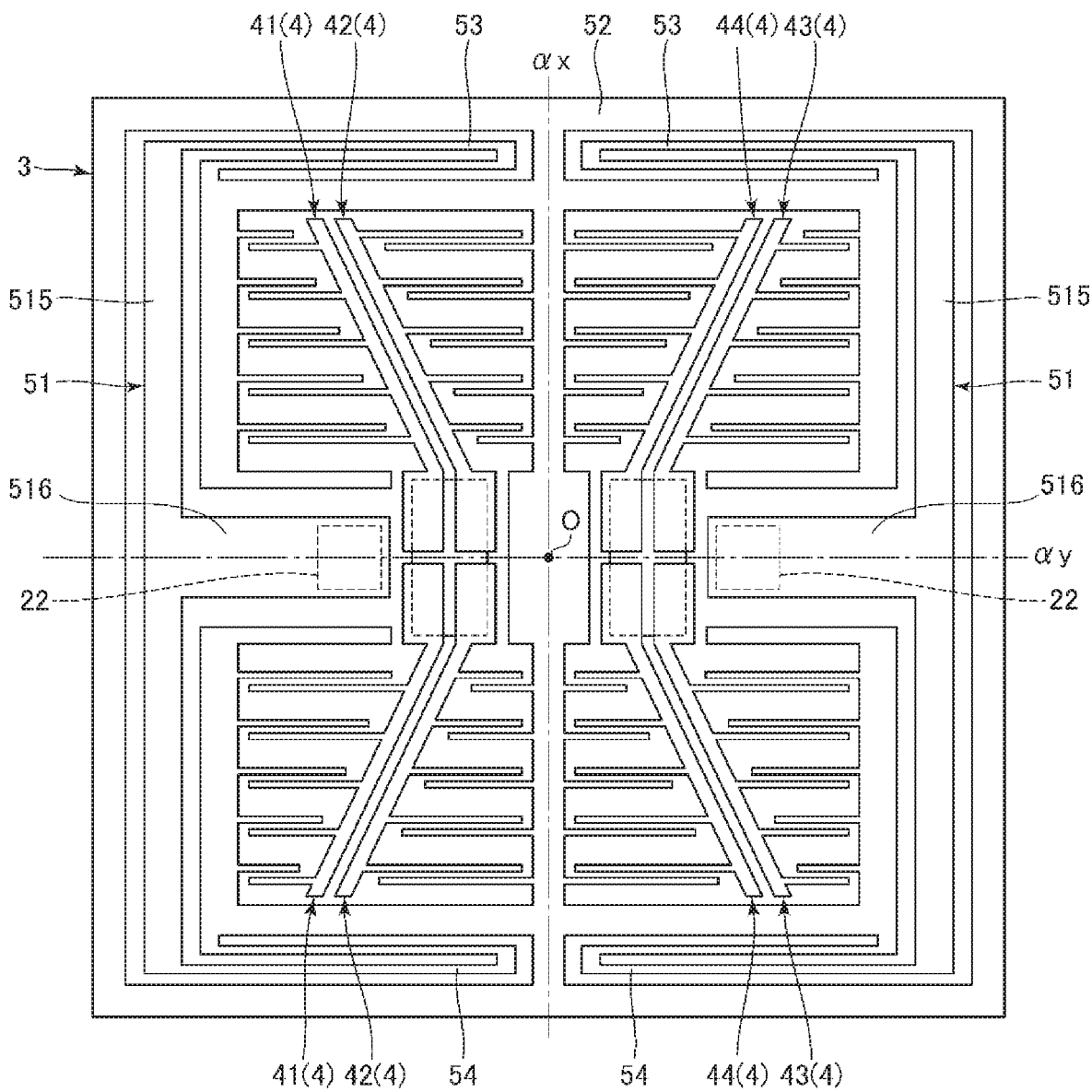
FIG. 15 is a plan view illustrating a physical quantity sensor according to an eleventh embodiment.

FIG. 15 is a plan view illustrating the physical quantity sensor according to the eleventh embodiment. For easy descriptions, in FIG. 15, illustrations of the substrate 2 and the lid 8 are omitted, and only the element unit 3 is illustrated.

A physical quantity sensor 1 in this embodiment is similar to the above-described physical quantity sensor 1 according to the ninth embodiment except that, mainly, a configuration of the element unit 3 is different from that in the first embodiment. In the following descriptions, the physical quantity sensor 1 in the eleventh embodiment will be described focusing on a difference from the above-described ninth embodiment, and descriptions of the similar items will not be repeated. In FIG. 15, the same components as those in the above-described ninth embodiment are denoted by the same reference signs.

As illustrated in FIG. 15, a pair of support portions 51 are provided on the inner side of the movable body 52. One support portion 51 is positioned on the positive side of the central axis αx in the Y-axis direction. The other support portion 51 is positioned on the negative side of the central axis αx in the Y-axis direction. Each of the support portions 51 includes a base portion 515 extending in the X-axis direction and an extension portion 516 which extends from the center portion of the base portion 515 toward the center O of the element unit 3 in the Y-axis direction. Each of the support portions 51 has a T-like shape. Tip portions (end portions on the center O side) of the extension portions 516 are bonded to the mount 22.

With such an eleventh embodiment, it is also possible to exhibit effects similar to those in the above-described ninth embodiment.

Twelfth Embodiment

Next, a physical quantity sensor according to a twelfth embodiment will be described.

Figure 16:
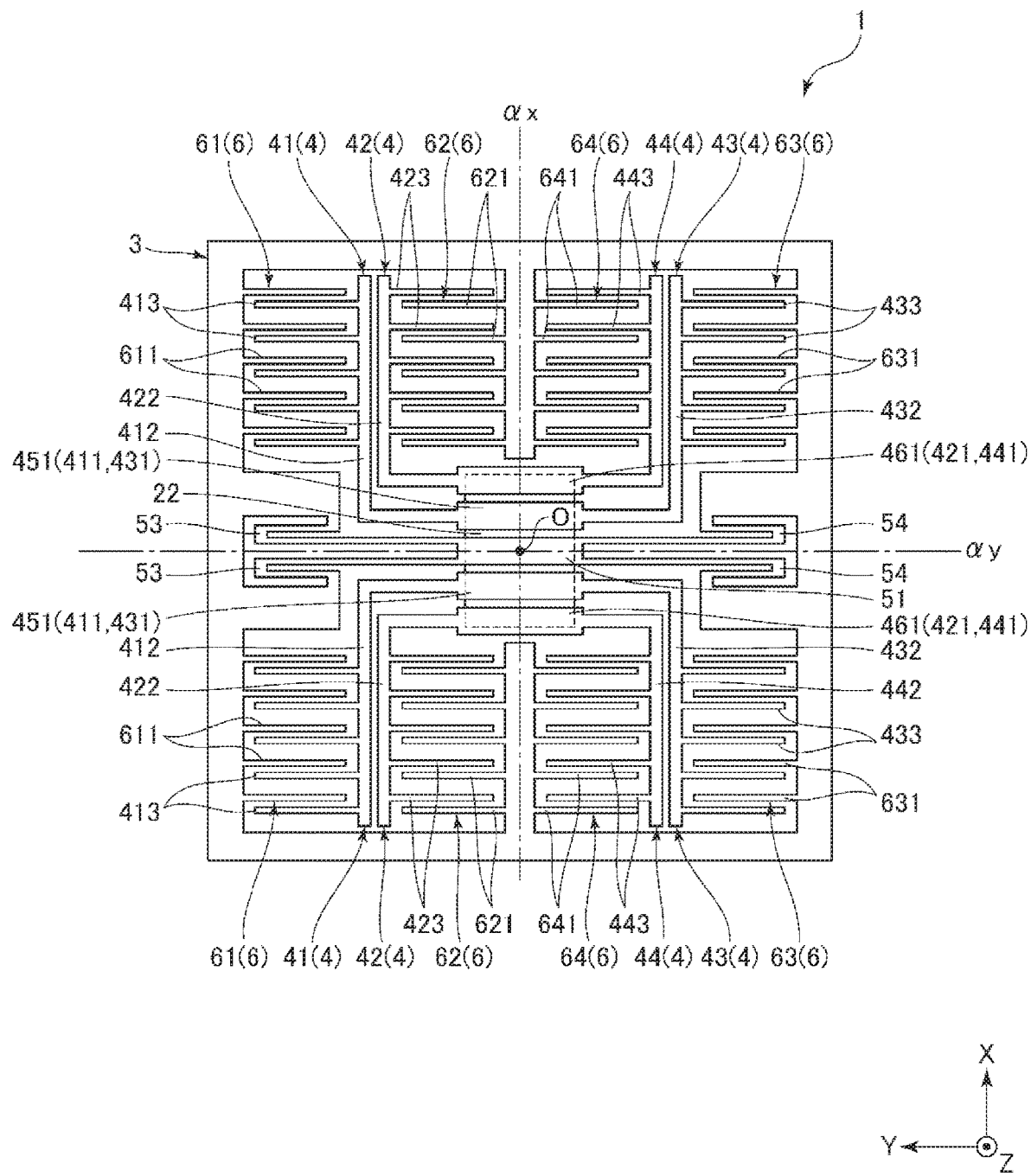
FIG. 16 is a plan view illustrating a physical quantity sensor according to a twelfth embodiment.

FIG. 16 is a plan view illustrating the physical quantity sensor according to the twelfth embodiment. For easy descriptions, in FIG. 16, illustrations of the substrate 2 and the lid 8 are omitted, and only the element unit 3 is illustrated.

A physical quantity sensor 1 in this embodiment is similar to the above-described physical quantity sensor 1 according to the eighth embodiment except that, mainly, a configuration of the element unit 3 is different from that in the eighth embodiment. In the following descriptions, the physical quantity sensor 1 in the twelfth embodiment will be described focusing on a difference from the above-described eighth embodiment, and descriptions of the similar items will not be repeated. In FIG. 16, the same components as those in the above-described eighth embodiment are denoted by the same reference signs.

As illustrated in FIG. 16, in the pair of fixed electrodes 4, a fixation portion 451 is formed by integrating the fixation portion 411 of the first fixed electrode 41 and the fixation portion 431 of the third fixed electrode 43, and a fixation portion 461 is formed by integrating the fixation portion 421 of the second fixed electrode 42 and the fixation portion 441 of the fourth fixed electrode 44. The fixation portions 451 and 461 are disposed along the central axis αx.

The support portion 51 is positioned between the pair of fixed electrodes 4. Specifically, the support portion 51 is positioned between the fixation portion 451 of one fixed electrode 4 and the fixation portion 451 of the other fixed electrode 4, and extends in the Y-axis direction. Thus, the end portion of the support portion 51 on the positive side of the Y-axis direction is connected to the movable body 52 by a pair of springs 53. The end portion of the support portion on the negative side of the Y-axis direction is connected to the movable body 52 by a pair of springs 54.

With such a twelfth embodiment, it is also possible to exhibit effects similar to those in the above-described first embodiment.

Thirteenth Embodiment

Next, a physical quantity sensor according to a thirteenth embodiment will be described.

Figure 17:
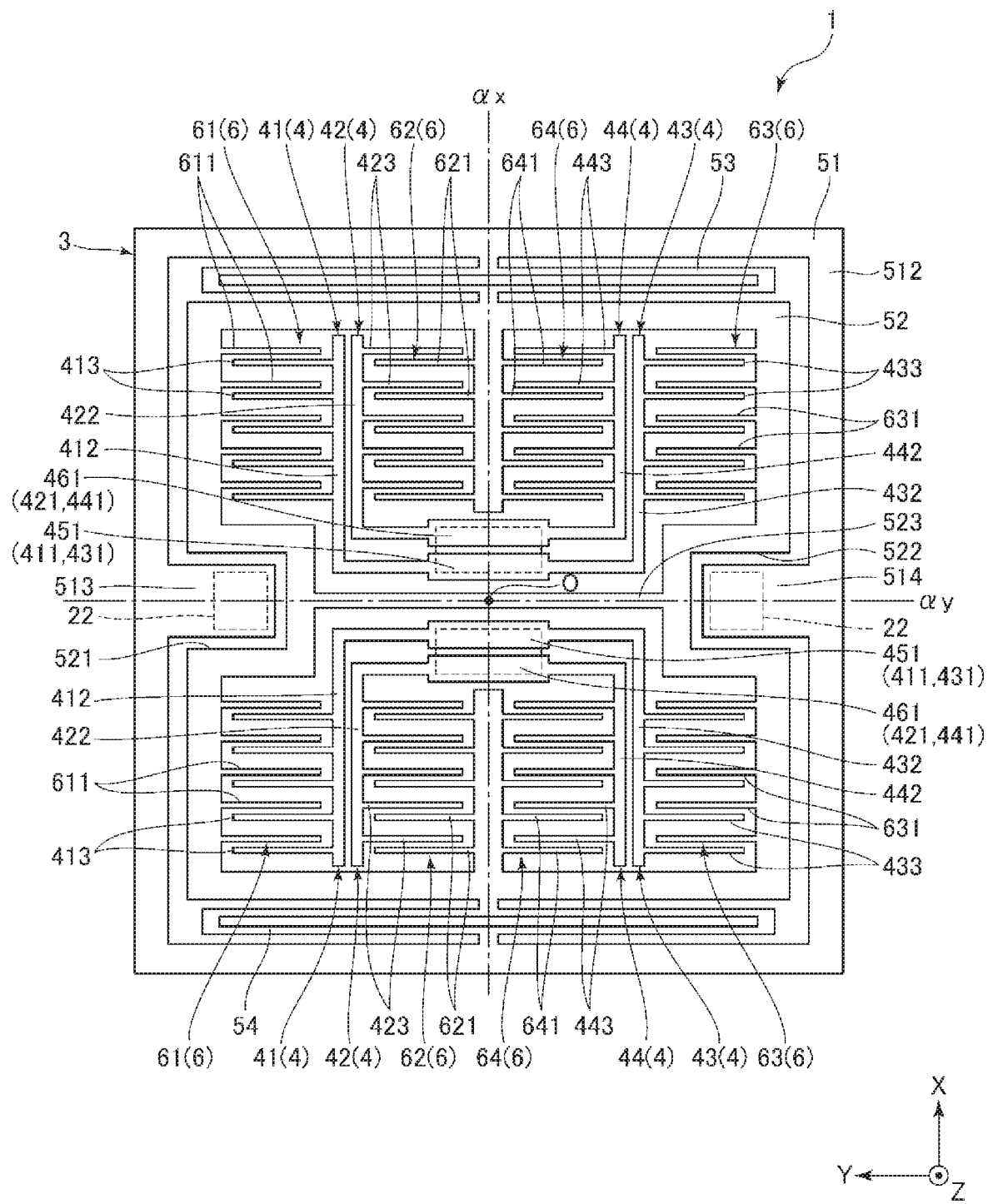
FIG. 17 is a plan view illustrating a physical quantity sensor according to a thirteenth embodiment.

FIG. 17 is a plan view illustrating the physical quantity sensor according to the thirteenth embodiment. For easy descriptions, in FIG. 17, illustrations of the substrate 2 and the lid 8 are omitted, and only the element unit 3 is illustrated.

A physical quantity sensor 1 in this embodiment is similar to the above-described physical quantity sensor 1 according to the twelfth embodiment except that, mainly, a configuration of the element unit 3 is different from that in the twelfth embodiment. In the following descriptions, the physical quantity sensor 1 in the thirteenth embodiment will be described focusing on a difference from the above-described twelfth embodiment, and descriptions of the similar items will not be repeated. In FIG. 17, the same components as those in the above-described twelfth embodiment are denoted by the same reference signs.

As illustrated in FIG. 17, the movable body 52 includes notches 521 and 522 formed on both sides of the Y-axis direction. The movable body 52 includes a beam 523 which is connected to the notches 521 and 522 and is disposed to distinguish the fixed electrode 4 positioned on the positive side of the X-axis direction from the fixed electrode 4 positioned on the negative side of the X-axis direction, as a partition.

The support portion 51 is provided on the outside of the movable body 52. The support portion 51 has a frame shape and is provided to surround the movable body 52. The support portion 51 includes a base portion 512 having a frame shape and a pair of protruding portions 513 and 514 which respectively protrude from the base portion 512 toward the insides of the notches 521 and 522. Tip portions (end portions on the center O side) of the protruding portions 513 and 514 are bonded to the mount 22.

Each of the springs 53 and 54 is positioned between the movable body 52 and the support portion 51. The spring 53 joins the end portion of the movable body 52 on the positive side of the X-axis direction and the end portion of the support portion 51 on the positive side of the X-axis direction. The spring 54 joins the end portion of the movable body 52 on the negative side of the X-axis direction and the end portion of the support portion 51 on the negative side of the X-axis direction.

With such a thirteenth embodiment, it is also possible to exhibit effects similar to those in the above-described first embodiment.

Fourteenth Embodiment

Next, a physical quantity sensor according to a fourteenth embodiment will be described.

Figure 18:
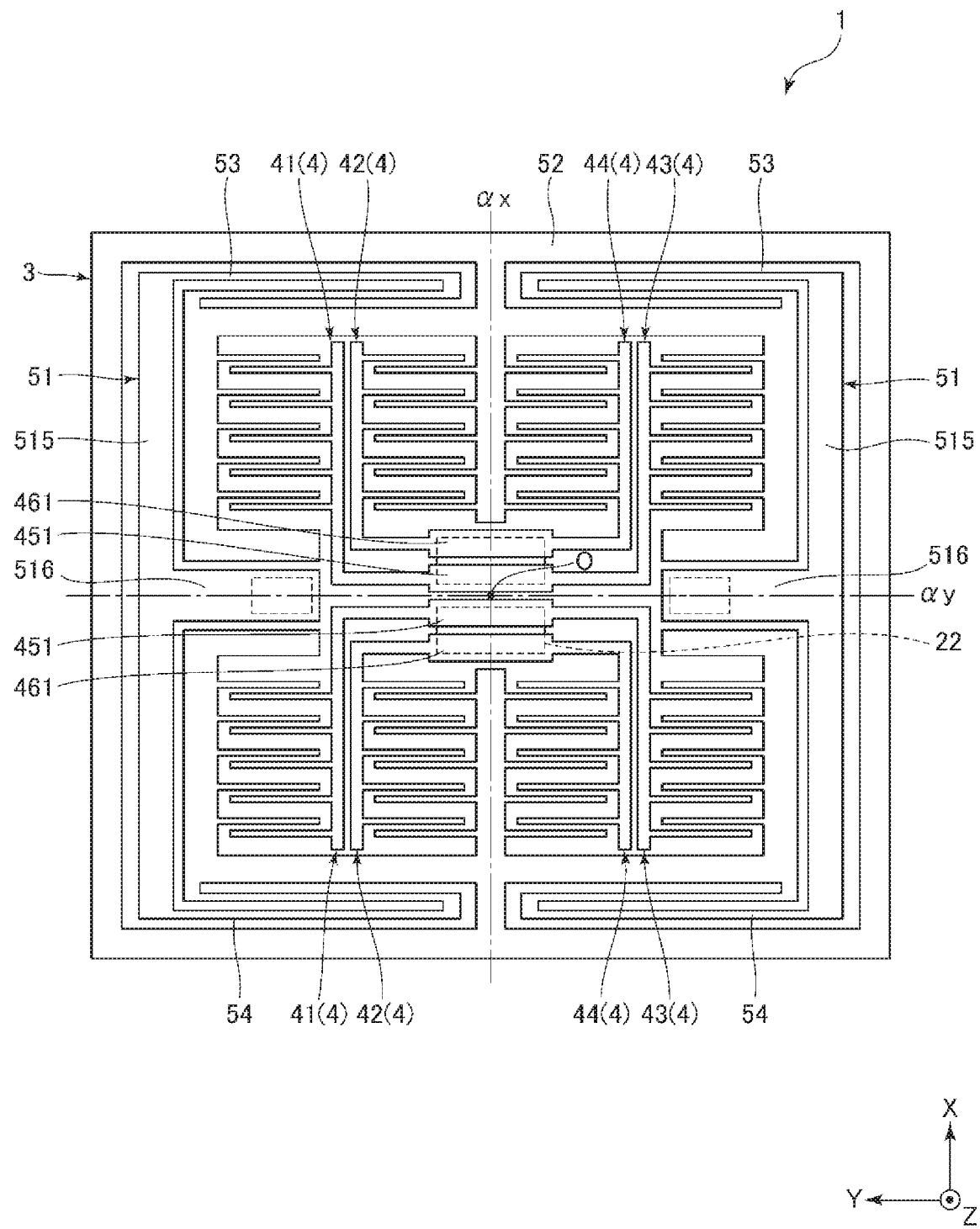
FIG. 18 is a plan view illustrating a physical quantity sensor according to a fourteenth embodiment.
Figure 19:
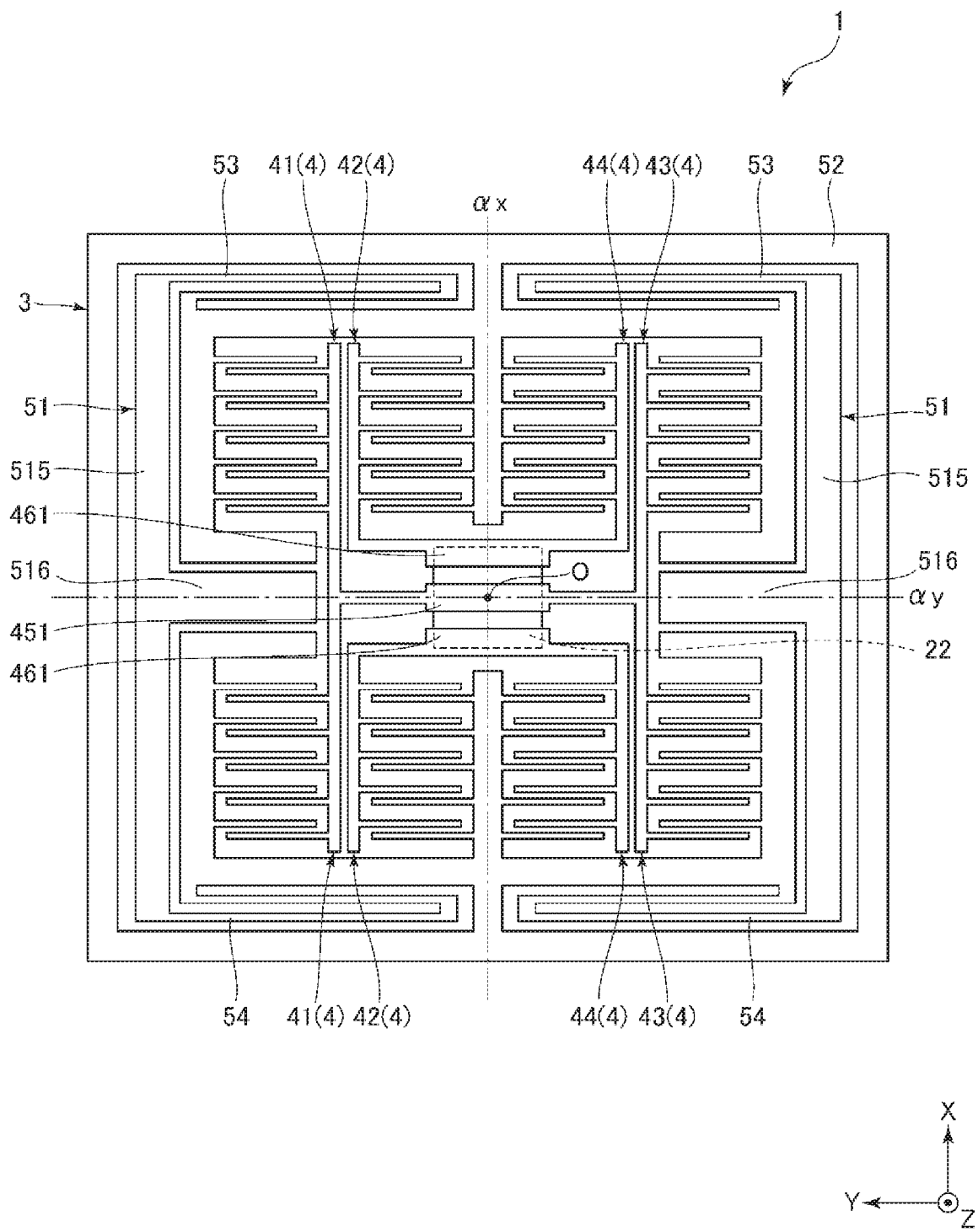
FIG. 19 is a plan view illustrating a modification example of an element unit illustrated in FIG. 18.

FIG. 18 is a plan view illustrating the physical quantity sensor according to the fourteenth embodiment. FIG. 19 is a plan view illustrating a modification example of an element unit illustrated in FIG. 18. For easy descriptions, in FIG. 18, illustrations of the substrate 2 and the lid 8 are omitted, and only the element unit 3 is illustrated.

A physical quantity sensor 1 in this embodiment is similar to the above-described physical quantity sensor 1 according to the twelfth embodiment except that, mainly, a configuration of the element unit 3 is different from that in the twelfth embodiment. In the following descriptions, the physical quantity sensor 1 in the fourteenth embodiment will be described focusing on a difference from the above-described twelfth embodiment, and descriptions of the similar items will not be repeated. In FIG. 18, the same components as those in the above-described twelfth embodiment are denoted by the same reference signs.

As illustrated in FIG. 18, a pair of support portions 51 are provided on the inner side of the movable body 52. One support portion 51 is positioned on the positive side of the central axis αx in the Y-axis direction. The other support portion 51 is positioned on the negative side of the central axis αx in the Y-axis direction. Each of the support portions 51 includes a base portion 515 extending in the X-axis direction and an extension portion 516 which extends from the center portion of the base portion 515 toward the center O of the element unit 3 in the Y-axis direction. Each of the support portions 51 has a T-like shape. Tip portions (end portions on the center O side) of the extension portions 516 are bonded to the mount 22.

With such a fourteenth embodiment, it is also possible to exhibit effects similar to those in the above-described first embodiment. For example, as illustrated in FIG. 19, two fixation portions 451 may be integrated.

Fifteenth Embodiment

Next, a physical quantity sensor according to a fifteenth embodiment will be described.

Figure 20:
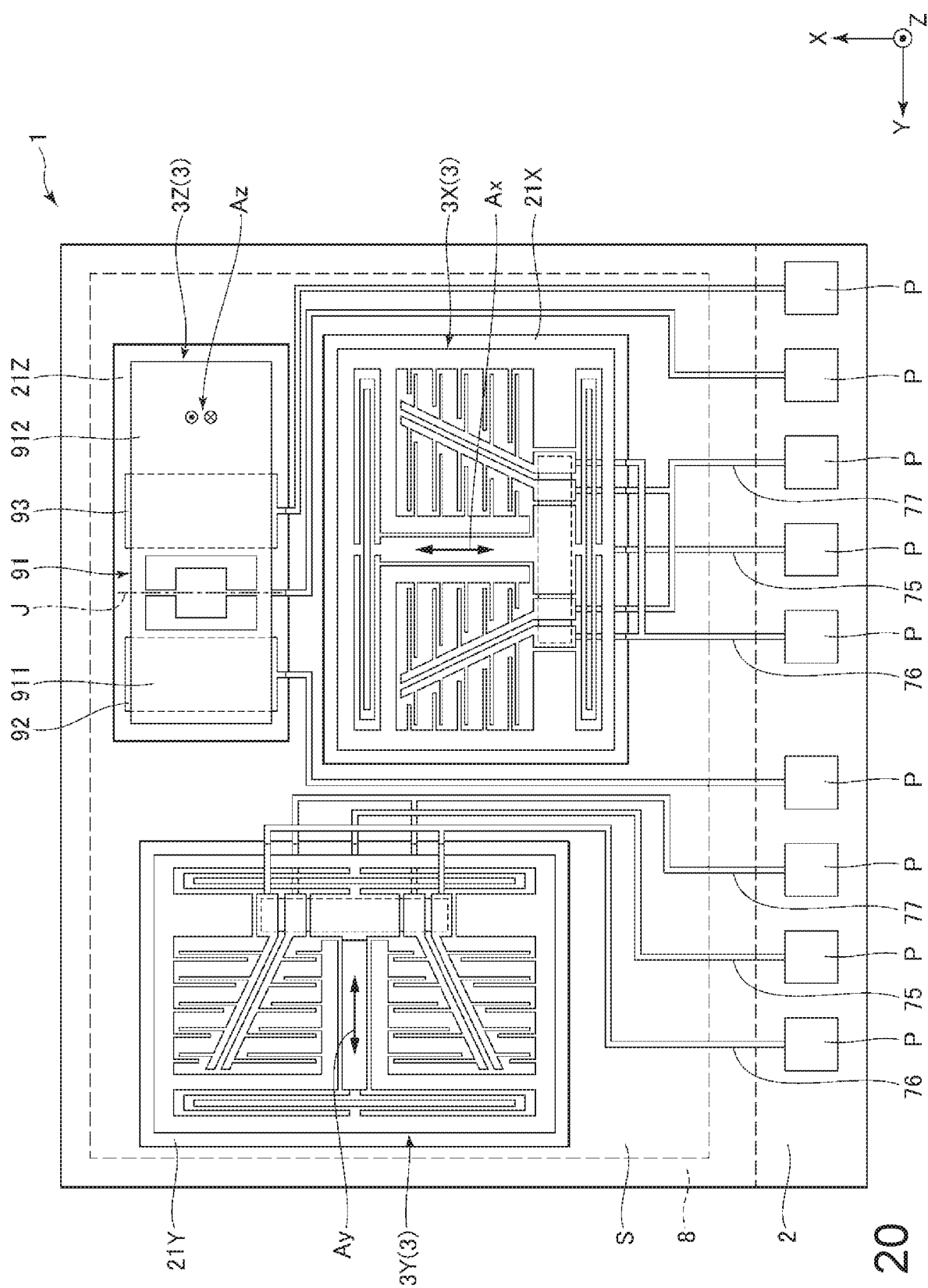
FIG. 20 is a plan view illustrating a physical quantity sensor according to a fifteenth embodiment.

FIG. 20 is a plan view illustrating the physical quantity sensor according to the fifteenth embodiment.

A physical quantity sensor 1 in this embodiment is similar to the above-described physical quantity sensor 1 according to the first embodiment except that, mainly, three element units 3X, 3Y, and 3Z are provided. In the following descriptions, the physical quantity sensor 1 in the fifteenth embodiment will be described focusing on a difference from the above-described first embodiment, and descriptions of the similar items will not be repeated. In FIG. 20, the same components as those in the above-described first embodiment are denoted by the same reference signs.

As illustrated in FIG. 20, three recess portions 21X, 21Y, and 21Z are provided in the substrate 2. The element unit 3X is disposed to overlap the recess portion 21X. The element unit 3Y is disposed to overlap the recess portion 21Y. The element unit 3Z is disposed to overlap the recess portion 21Z. The element unit 3X is a sensor element that has the same configuration as that in the above-described first embodiment and is capable of detecting an acceleration Az in the X-axis direction. The element unit 3Y is a sensor element that has the same configuration as that in the above-described first embodiment except that the attitude thereof rotates by 90° about the Z axis, and is capable of detecting the acceleration Ay in the Y-axis direction. The element unit 3Z is a sensor element capable of detecting the acceleration Az in the Z-axis direction.

Briefly describing the element unit 3Z, the element unit 3Z includes a movable body 91 capable of rolling around a rolling axis J, like a seesaw. The movable body 91 includes a first movable unit 911 positioned on one side of the rolling axis J and a second movable unit 912 positioned on the other side thereof. The turning moment of the first movable unit 911 is different from the turning moment of the second movable unit 912. A first fixed electrode 92 is disposed on the bottom surface of the recess portion 21Z, so as to face the first movable unit 911. A second fixed electrode 93 is disposed on the bottom surface of the recess portion 21Z, so as to face the second movable unit 912. Electrostatic capacitance Cc is formed between the first movable unit 911 and the first fixed electrode 92. Electrostatic capacitance Cd is formed between the second movable unit 912 and the second fixed electrode 93. If the acceleration Az is applied to the physical quantity sensor 1, the movable body 91 rolls around the rolling axis J, like a seesaw. Thus, the electrostatic capacitance Cc and Cd changes, and thus it is possible to detect the acceleration Az based on the change of the electrostatic capacitance Cc and Cd.

According to such a physical quantity sensor 1, it is possible to detect accelerations of three axes which are orthogonal to each other.

Sixteenth Embodiment

Next, a physical quantity sensor device according to a sixteenth embodiment will be described.

Figure 21:
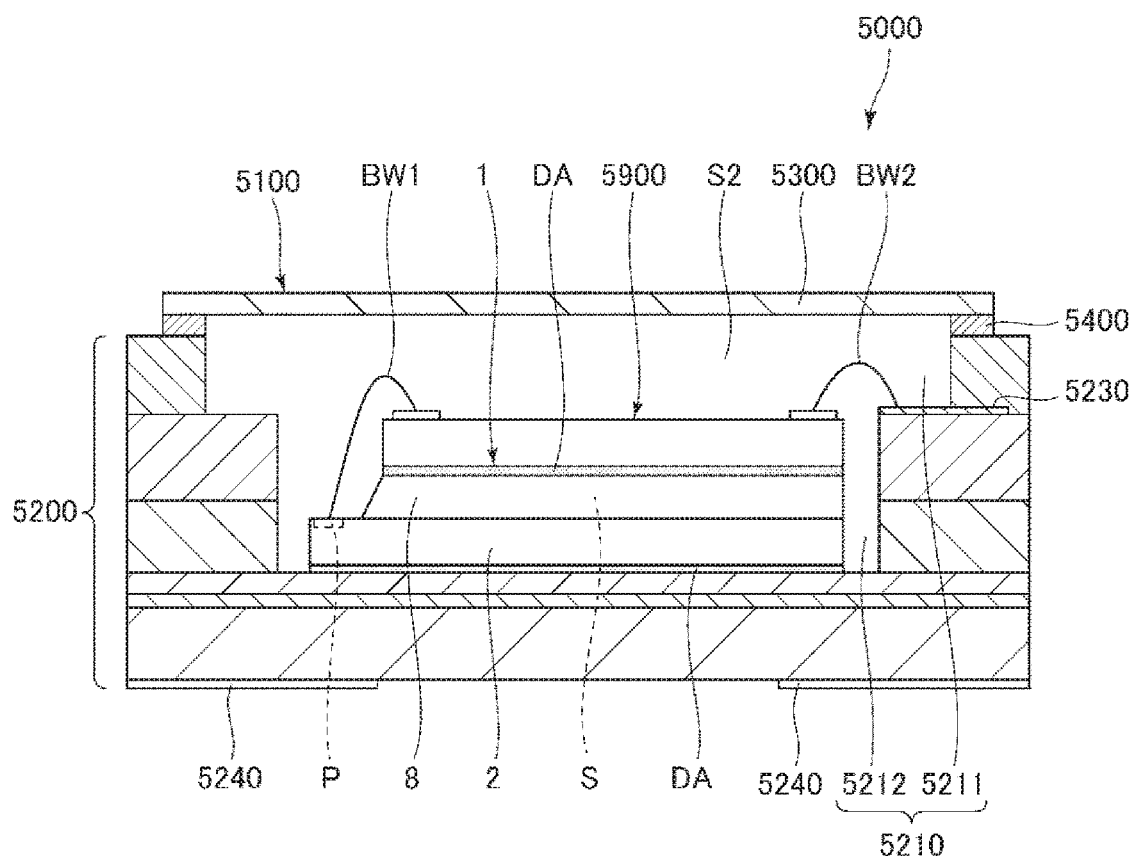
FIG. 21 is a sectional view illustrating a physical quantity sensor device according to a sixteenth embodiment.

FIG. 21 is a sectional view illustrating the physical quantity sensor device according to the sixteenth embodiment.

As illustrated in FIG. 21, the physical quantity sensor device 5000 includes a package 5100, a physical quantity sensor 1, and a semiconductor element (circuit element) 5900. The physical quantity sensor and the semiconductor element are stored in the package 5100. For example, the physical quantity sensor in any of the above-described embodiments can be used as the physical quantity sensor 1.

The package 5100 includes a cavity-like base (substrate) 5200 and a lid 5300 bonded to the upper surface of the base 5200. The base 5200 includes a recess portion 5210 which opens to the upper surface thereof. The recess portion 5210 includes a first recess portion 5211 which opens to the upper surface of the base 5200 and a second recess portion 5212 which opens to the bottom surface of the first recess portion 5211.

The lid 5300 has a plate shape and is bonded to the upper surface of the base 5200 so as to close the opening of the recess portion 5210. A storage space S2 is formed in the package 5100 by the lid 5300 closing the opening of the recess portion 5210 in this manner, and thus the physical quantity sensor 1 and the semiconductor element 5900 are stored in the storage space S2. Therefore, it is possible to properly protect the physical quantity sensor 1 and the semiconductor element 5900 from an impact, dust, heat, moisture, and the like, by the package 5100. A method of bonding the base 5200 and the lid 5300 to each other is not particularly limited. In this embodiment, seam welding using a seam ring 5400 is used.

The storage space S2 is airtightly sealed. The atmosphere of the storage space S2 is not particularly limited. For example, the atmosphere of the storage space S2 is preferably set to be the same as the atmosphere of the storage space S of the physical quantity sensor 1. Thus, it is possible to maintain the atmosphere of the storage space S as it is, even if airtightness of the storage space S collapses, and the storage spaces S and S2 communicate with each other. Therefore, it is possible to reduce variation in acceleration detection characteristics of the physical quantity sensor 1, which occurs by changing the atmosphere of the storage space S, and to exhibit the stable acceleration detection characteristics.

A material for forming the base 5200 is not particularly limited. For example, various ceramics such as alumina, zirconia, and titania can be used. A material for forming the lid 5300 is not particularly limited. For example, a material having a linear expansion coefficient which is approximate to that of the material for forming the base 5200 may be provided. For example, in a case where the above-described ceramic is provided as the material for forming the base 5200, alloys with cobalt and the like are preferably used.

The base 5200 includes a plurality of internal terminals 5230 arranged in the storage space S2 (on the bottom surface of the first recess portion 5211) and a plurality of external terminals 5240 arranged on the bottom surface of the base. Each of the internal terminals 5230 is electrically connected to the predetermined external terminal 5240 via an internal interconnection (not illustrated) disposed in the base 5200.

The physical quantity sensor 1 is fixed to the bottom surface of the recess portion 5210 via a die-attach material DA. In addition, the semiconductor element 5900 is disposed on the upper surface of the physical quantity sensor 1 with a die-attach material DA interposed between the semiconductor element and the upper surface of the physical quantity sensor. Thus, the physical quantity sensor 1 and the semiconductor element 5900 are electrically connected to each other via the bonding wiring BW1, and the semiconductor element 5900 and the internal terminal 5230 are electrically connected to each other via a bonding wiring BW2.

If necessary, the semiconductor element 5900 includes, for example, a driving circuit that applies a driving voltage to the element units 3X, 3Y, and 3Z, a detection circuit that detects the accelerations Ax, Ay, and Az based on outputs from the element units 3X, 3Y, and 3Z, or an output circuit that converts a signal from the detection circuit into a predetermined signal and outputs the predetermined signal.

Hitherto, the physical quantity sensor device 5000 is described. Such a physical quantity sensor device 5000 includes the physical quantity sensor 1 and the semiconductor element (circuit element) 5900. Therefore, a physical quantity sensor device 5000 which is capable of exhibiting the effect of the physical quantity sensor 1 and has high reliability is obtained.

As described above, the physical quantity sensor device 5000 includes the base (base substrate) 5200 and the lid 5300 bonded to the base 5200 so as to form the storage space S2 between the lid 5300 and the base 5200. The physical quantity sensor 1 and the semiconductor element 5900 are stored in the storage space S2. Thus, it is possible to properly protect the physical quantity sensor 1 and the semiconductor element 5900 from an impact, dust, heat, moisture, and the like.

As described above, the physical quantity sensor 1 is mounted on the base 5200, and the semiconductor element 5900 is mounted on the physical quantity sensor 1. For example, as in this embodiment, in a case where the planar size of the semiconductor element 5900 is smaller than the planar size of the physical quantity sensor 1, if such an arrangement is performed, it is possible to arrange the physical quantity sensor 1 and the semiconductor element 5900 with high balance.

Seventeenth Embodiment

Next, a physical quantity sensor device according to a seventeenth embodiment will be described.

Figure 22:
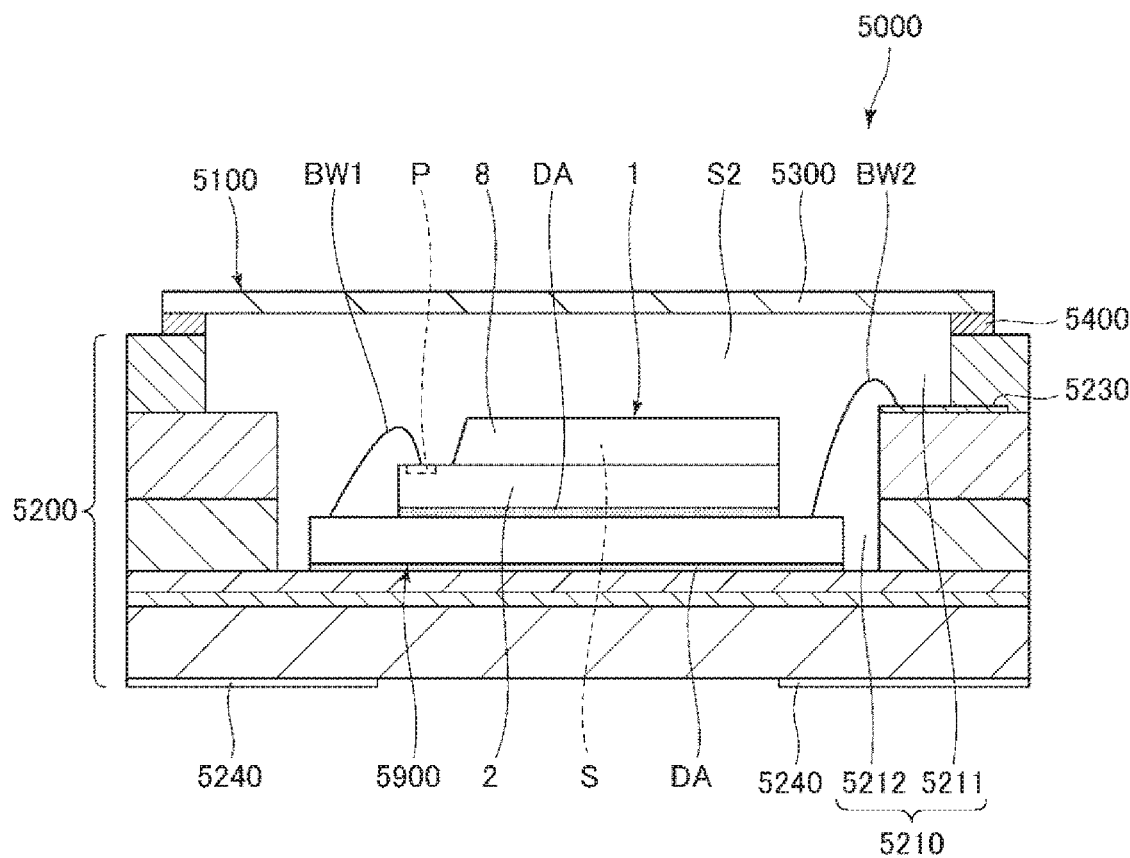
FIG. 22 is a sectional view illustrating a physical quantity sensor device according to a seventeenth embodiment.

FIG. 22 is a sectional view illustrating the physical quantity sensor device according to the seventeenth embodiment.

A physical quantity sensor device 5000 in this embodiment is similar to the above-described physical quantity sensor device 5000 according to the sixteenth embodiment except that the arrangement of the physical quantity sensor 1 and the semiconductor element 5900 is reversed. In the following descriptions, the physical quantity sensor device 5000 in the seventeenth embodiment will be described focusing on a difference from the above-described sixteenth embodiment, and descriptions of the similar items will not be repeated. In FIG. 22, the same components as those in the above-described sixteenth embodiment are denoted by the same reference signs.

As illustrated in FIG. 22, in the physical quantity sensor device 5000 in this embodiment, the semiconductor element 5900 is fixed to the bottom surface of the recess portion 5210 of the base 5200 with a die-attach material DA. The physical quantity sensor 1 is fixed to the upper surface of the semiconductor element 5900 with a die-attach material DA. That is, the semiconductor element (circuit element) 5900 is mounted on the base (substrate) 5200, and the physical quantity sensor 1 is mounted on the semiconductor element 5900. For example, as in this embodiment, in a case where the planar size of the physical quantity sensor 1 is smaller than the planar size of the semiconductor element 5900, if such an arrangement is performed, it is possible to arrange the physical quantity sensor 1 and the semiconductor element 5900 with high balance.

Eighteenth Embodiment

Next, a complex sensor device according to an eighteenth embodiment will be described.

Figure 23:
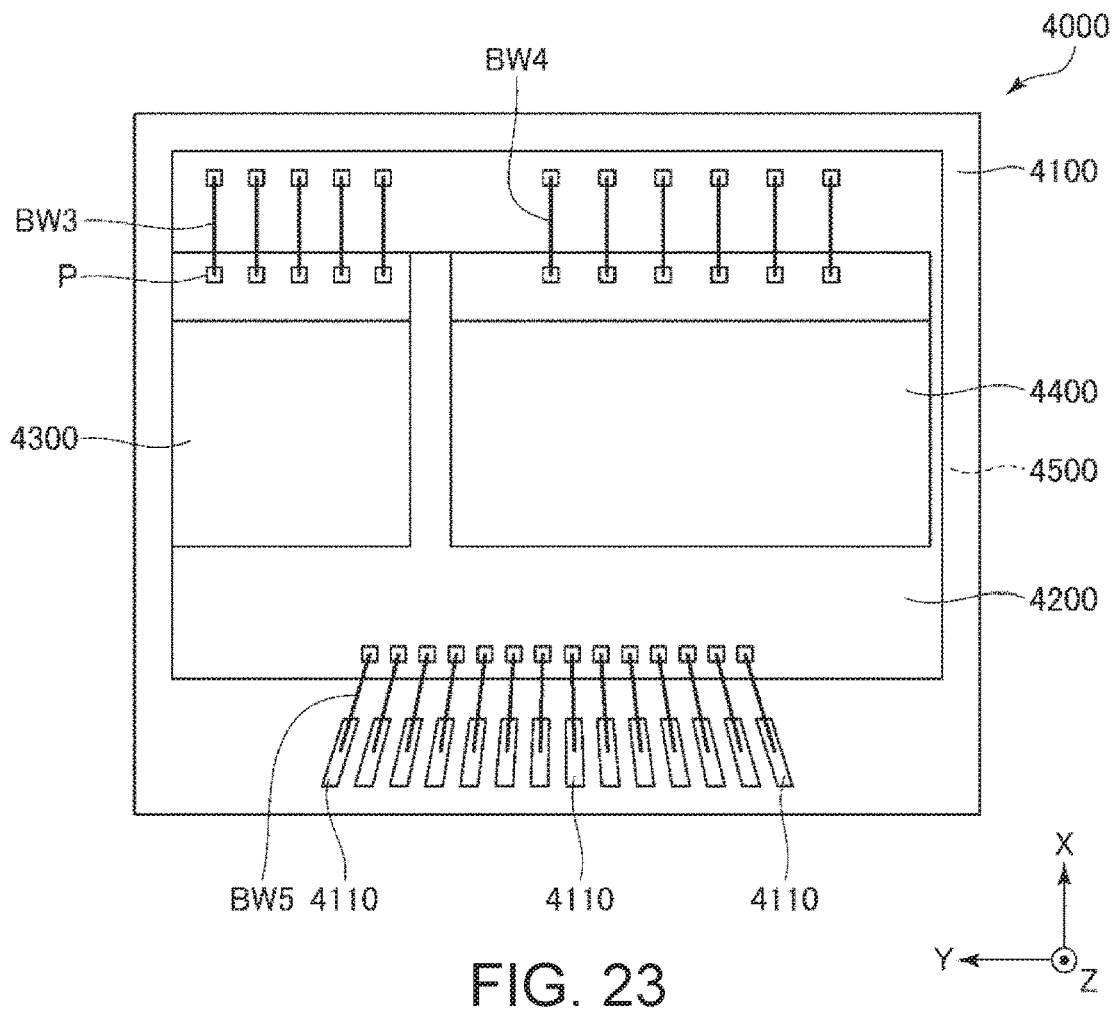
FIG. 23 is a plan view illustrating a complex sensor device according to an eighteenth embodiment.

FIG. 23 is a plan view illustrating the complex sensor device according to the eighteenth embodiment. FIG. 1 is a sectional view illustrating the complex sensor device illustrated in FIG. 23.

Figure 24:
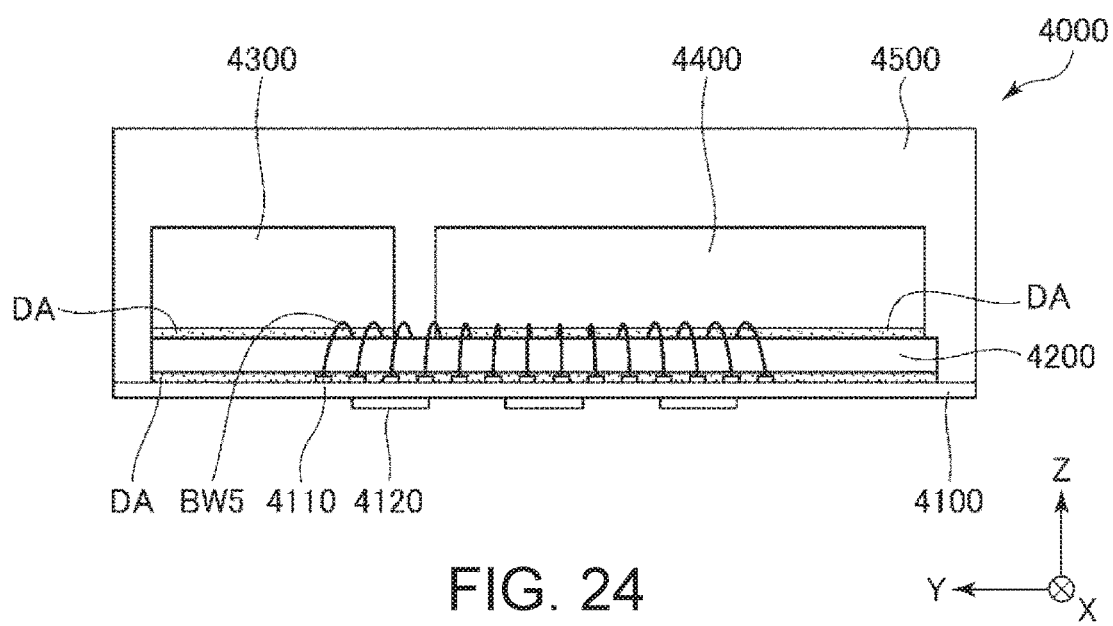
FIG. 24 is a sectional view illustrating the complex sensor device illustrated in FIG. 23.

As illustrated in FIGS. 23 and 24, a complex sensor device 4000 includes a base substrate 4100, a semiconductor element (circuit element) 4200, an acceleration sensor (first physical quantity sensor) 4300, an angular rate sensor (second physical quantity sensor) 4400, and a resin package 4500. The semiconductor element is mounted on the upper surface of the base substrate 4100 with a die-attach material (resin adhesive) DA. The acceleration sensor and the angular rate sensor are mounted on the upper surface of the semiconductor element 4200 with a die-attach material. The resin package 4500 covers the semiconductor element 4200, the acceleration sensor 4300, and the angular rate sensor 4400. The acceleration sensor 4300 is a three-axis acceleration sensor capable of independently detecting an acceleration of each of three axes (X axis, Y axis, and Z axis) which are orthogonal to each other. For example, the physical quantity sensor 1 in the above-described fifteenth embodiment can be applied as the acceleration sensor. The angular rate sensor 4400 is a three-axis angular rate sensor capable of independently detecting an angular rate of each of three axes (X axis, Y axis, and Z axis) which are orthogonal to each other. For example, a vibration gyro sensor using the Coriolis force can be used as the angular rate sensor.

The base substrate 4100 includes a plurality of connection terminals 4110 provided on the upper surface of the base substrate and a plurality of external terminals 4120 provided on the lower surface thereof. Each of the connection terminals 4110 is electrically connected to the corresponding external terminal 4120 via an internal interconnection (not illustrated) disposed in the base substrate 4100. The semiconductor element 4200 is disposed on the upper surface of such a base substrate 4100.

If necessary, the semiconductor element 4200 includes a driving circuit, an acceleration detection circuit, an angular-rate detection circuit, an output circuit, and the like. The driving circuit drives the acceleration sensor 4300 and the angular rate sensor 4400. The acceleration detection circuit independently detects each of an acceleration in the X-axis direction, an acceleration in the Y-axis direction, and an acceleration in the Z-axis direction based on an output from the acceleration sensor 4300. The angular-rate detection circuit independently detects each of an angular rate about the X axis, an angular rate about the Y axis, and an angular rate about the Z axis based on the output from the angular rate sensor 4400. The output circuit converts signals from the acceleration detection circuit and the angular-rate detection circuit into predetermined signals, and outputs the predetermined signals.

Such a semiconductor element 4200 is electrically connected to the acceleration sensor 4300 via a bonding wiring BW3, is electrically connected to the angular rate sensor 4400 via a bonding wiring BW4, and is electrically connected to the connection terminal 4110 of the base substrate 4100 via a bonding wiring BW5. The acceleration sensor 4300 and the angular rate sensor 4400 are disposed on the upper surface of such a semiconductor element 4200, in parallel.

Hitherto, the complex sensor device 4000 is described. As described above, such a complex sensor device 4000 includes the acceleration sensor (first physical quantity sensor) 4300 and the angular rate sensor (second physical quantity sensor) 4400 that detects a physical quantity different from that in the acceleration sensor 4300. Thus, a complex sensor device 4000 which is capable of detecting physical quantities having different types and has high convenience is obtained. In particular, in this embodiment, the first physical quantity sensor is the acceleration sensor 4300 capable of detecting an acceleration, and the second physical quantity sensor is the angular rate sensor 4400 capable of detecting the angular rate. Therefore, a complex sensor device 4000 which is capable of being suitably used as, for example, a motion sensor and has very high convenience is obtained.

Nineteenth Embodiment

Next, a complex sensor device according to a nineteenth embodiment will be described.

Figure 25:
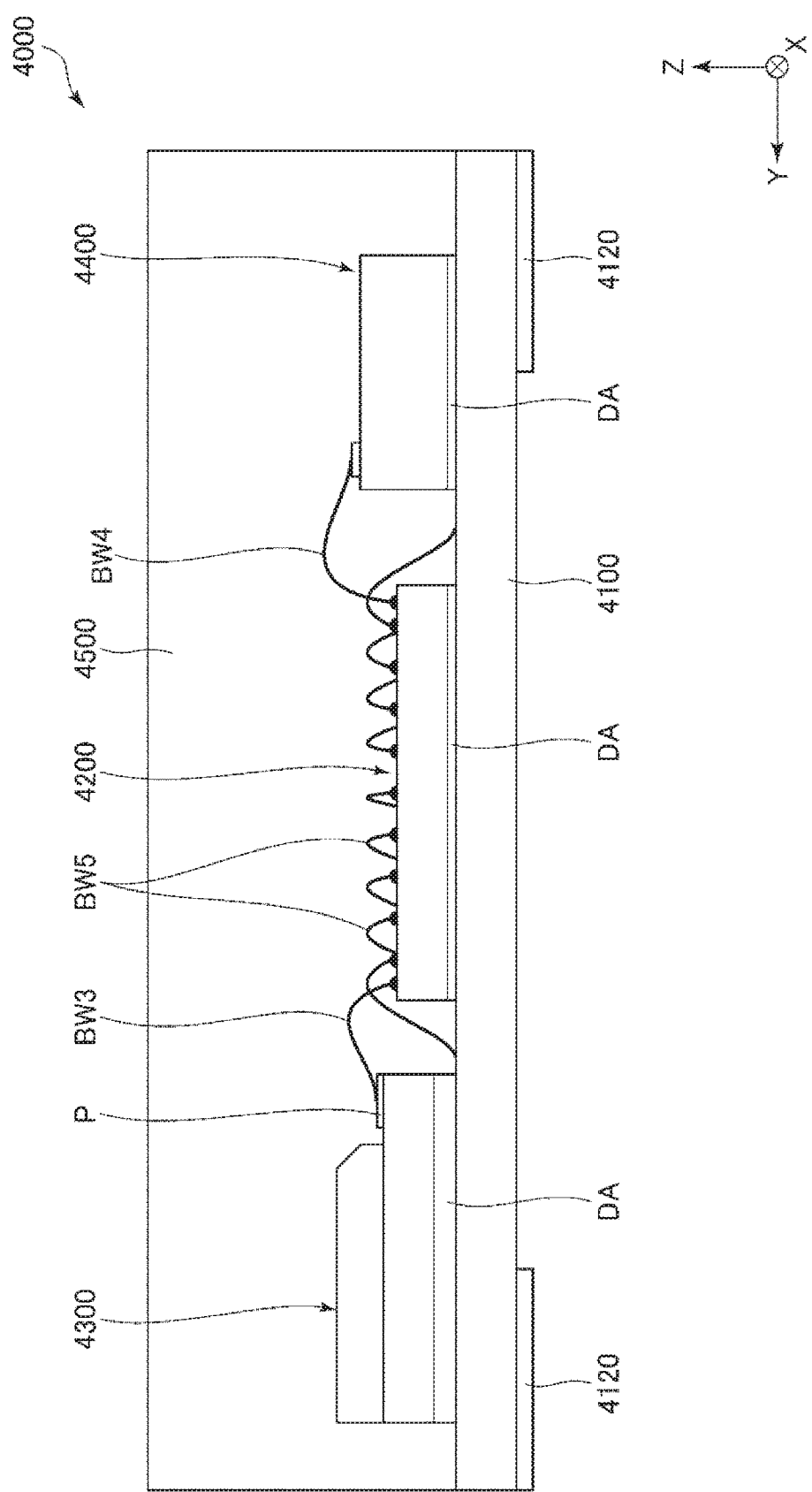
FIG. 25 is a sectional view illustrating a complex sensor device according to a nineteenth embodiment.

FIG. 25 is a sectional view illustrating the complex sensor device according to the nineteenth embodiment.

A complex sensor device 4000 in this embodiment is similar to the above-described complex sensor device 4000 according to the eighteenth embodiment except that, mainly, the arrangement of the acceleration sensor 4300 and the angular rate sensor 4400 is different from that in the eighteenth embodiment. In the following descriptions, the complex sensor device 4000 in the nineteenth embodiment will be described focusing on a difference from the above-described eighteenth embodiment, and descriptions of the similar items will not be repeated. In FIG. 25, the same components as those in the above-described eighteenth embodiment are denoted by the same reference signs.

As illustrated in FIG. 25, the acceleration sensor 4300 and the angular rate sensor 4400 are mounted on the upper surface of the base substrate 4100 in a manner that the semiconductor element 4200 is interposed between the acceleration sensor 4300 and the angular rate sensor 4400. With such a configuration, it is possible to reduce the height of the complex sensor device 4000.

Twentieth Embodiment

Next, an inertial measurement unit according to a twentieth embodiment will be described.

Figure 26:
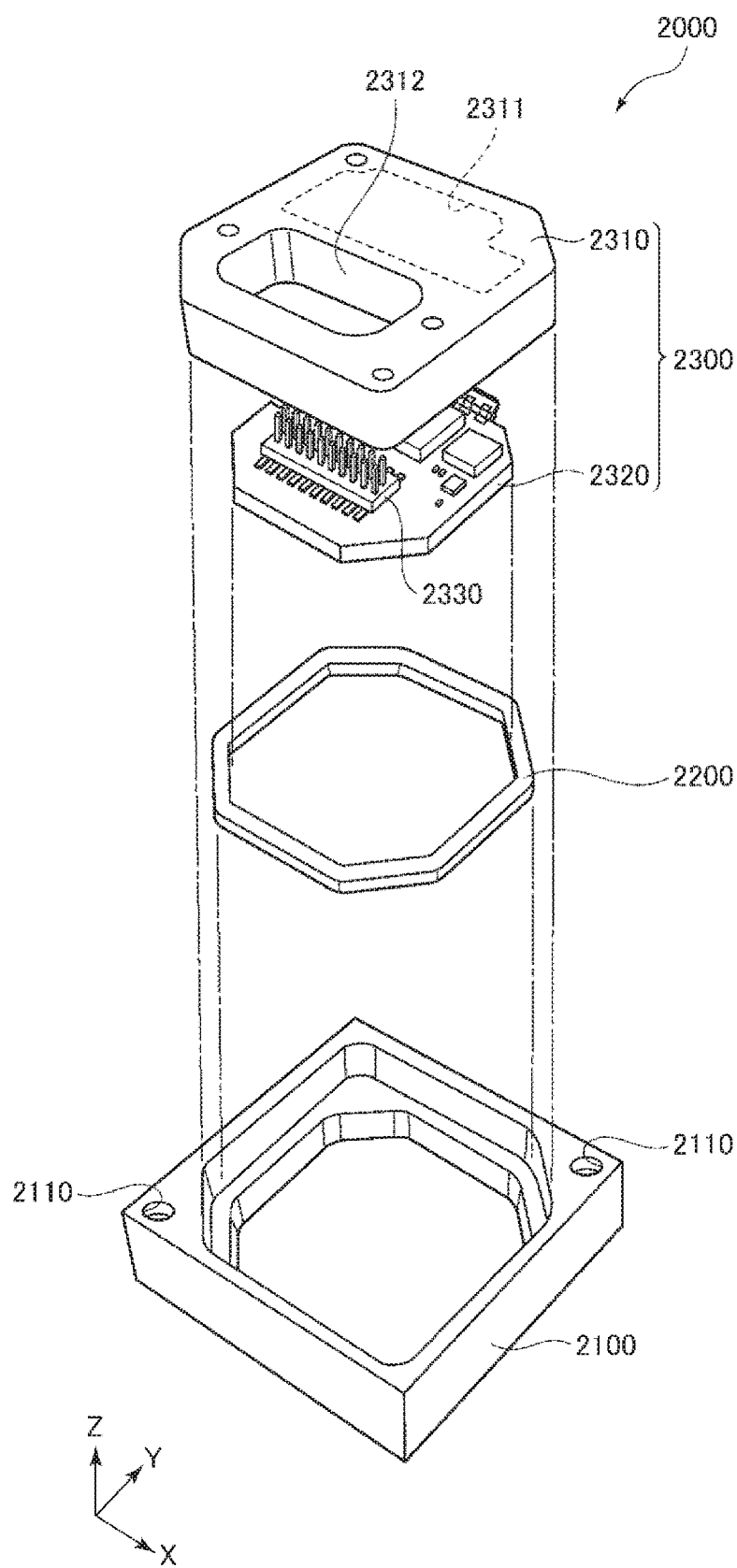
FIG. 26 is an exploded perspective view illustrating an inertial measurement unit according to a twentieth embodiment.
Figure 27:
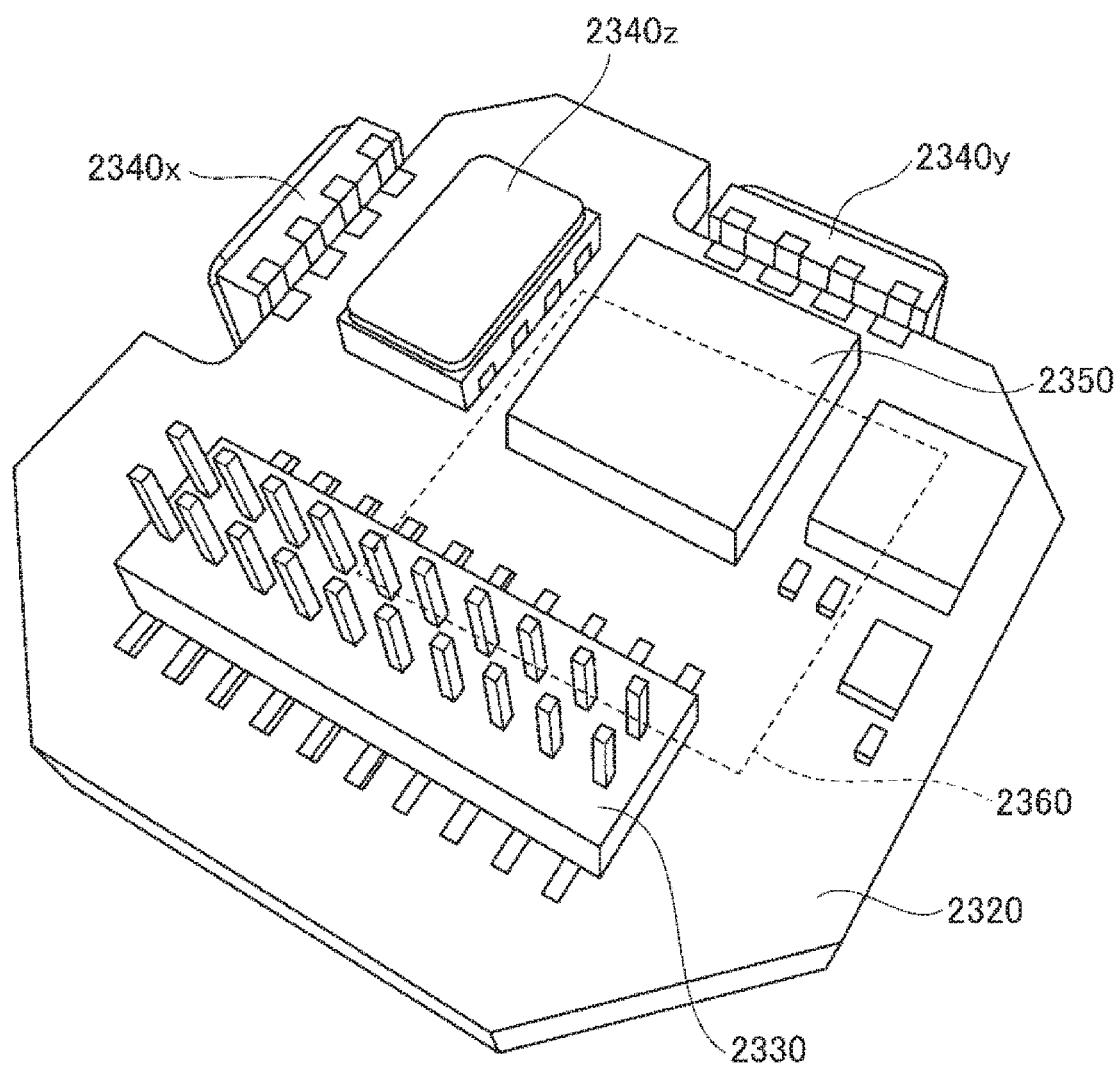
FIG. 27 is a perspective view illustrating a substrate provided in the inertial measurement unit illustrated in FIG. 26.

FIG. 26 is an exploded perspective view illustrating the inertial measurement unit according to the twentieth embodiment. FIG. 27 is a perspective view illustrating a substrate provided in the inertial measurement unit illustrated in FIG. 26.

The inertial measurement unit (IMU) 2000 illustrated in FIG. 26 is an inertial measurement unit that detects an attitude or a movement (inertial momentum) of a vehicle (device in which the unit is mounted) such as an automobile or a robot. The inertial measurement unit 2000 functions as a so-called six-axis motion sensor which includes a three-axis acceleration sensor and a three-axis angular rate sensor.

The inertial measurement unit 2000 is a rectangular parallelepiped having a planar shape which is roughly square. Screw holes 2110 as the fixation portions are formed in the vicinity of two vertices positioned in a diagonal direction of the square. The inertial measurement unit 2000 can be fixed to a mounting target surface of a mounting target object such as an automobile by causing two screws to pass through the two screw holes 2110. The size thereof can be reduced to a size as small as can be mounted in, for example, a smartphone or a digital camera, by selecting components or changing a design.

The inertial measurement unit 2000 includes an outer case 2100, a bonding member 2200, and a sensor module 2300. The inertial measurement unit 2000 has a configuration in which the sensor module 2300 is inserted into the outer case 2100 with the bonding member 2200 interposed between the outer case 2100 and the sensor module 2300. The sensor module 2300 includes an inner case 2310 and a substrate 2320.

The appearance of the outer case 2100 is a rectangular parallelepiped having a planar shape which is roughly square, similar to the entire shape of the above-described inertial measurement unit 2000. The screws hole 2110 are formed in the vicinity of two vertices positioned in a diagonal direction of the square. The outer case 2100 has a box shape, and the sensor module 2300 is stored in the outer case 2100.

The inner case 2310 is a member that supports the substrate 2320 and has a shape that fits in the outer case 2100. A recess portion 2311 for preventing a contact with the substrate 2320 or an opening 2312 for exposing a connector 2330 (which will be described later) is formed in the inner case 2310. Such an inner case 2310 is bonded to the outer case 2100 with the bonding member 2200 (for example, packing in which an adhesive has been impregnated). The substrate 2320 is bonded to the lower surface of the inner case 2310 with an adhesive.

As illustrated in FIG. 27, the connector 2330, an angular rate sensor 2340z that detects an angular rate about the Z axis, an acceleration sensor 2350 that detects an acceleration in each axis direction of the X axis, the Y axis, and the Z axis, and the like are mounted on the upper surface of the substrate 2320. An angular rate sensor 2340x that detects an angular rate about the X axis and an angular rate sensor 2340y that detects an angular rate about the Y axis are mounted on the side surface of the substrate 2320. For example, the physical quantity sensor 1 in the above-described fifteenth embodiment can be used as the acceleration sensor 2350. The angular rate sensors 2340z, 2340x, and 2340y are not particularly limited. For example, a vibration gyro sensor using the Coriolis force can be used as the angular rate sensor.

A control IC 2360 is mounted on the lower surface of the substrate 2320. The control IC 2360 is a micro-controller unit (MCU). The control IC includes a storage unit including a non-volatile memory, an A/D converter, and the like mounted therein, and controls the components of the inertial measurement unit 2000. The storage unit stores a program in which the procedure and the details for detecting an acceleration and an angular rate have been specified, a program of digitizing detection data and incorporating the data into packet data, accompanying data, and the like. In addition, a plurality of electronic components is mounted on the substrate 2320.

Hitherto, the inertial measurement unit 2000 is described. Such an inertial measurement unit 2000 includes the angular rate sensors 2340z, 2340x, and 2340y, and the acceleration sensor 2350 as the physical quantity sensors and the control IC (control circuit) 2360 that controls driving of each of the sensors 2340z, 2340x, 2340y, and 2350. Thus, an inertial measurement unit 2000 which is capable of exhibiting the effect of the physical quantity sensor according to the invention and has high reliability is obtained.

Twenty-First Embodiment

Next, a vehicle positioning device according to a twenty-first embodiment will be described.

Figure 28:
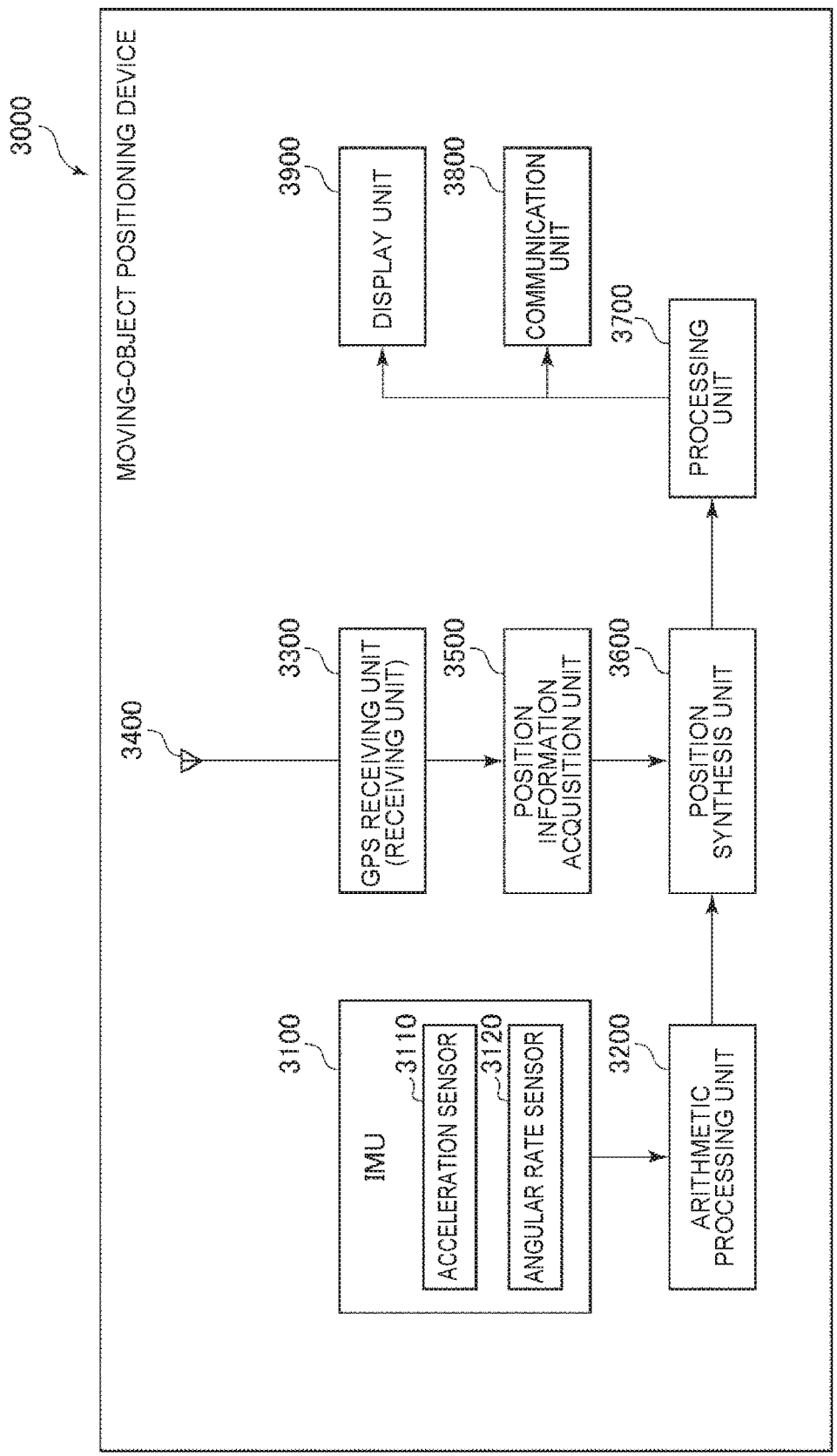
FIG. 28 is a block diagram illustrating an entire system of a vehicle positioning device according to a twenty-first embodiment.
Figure 29:
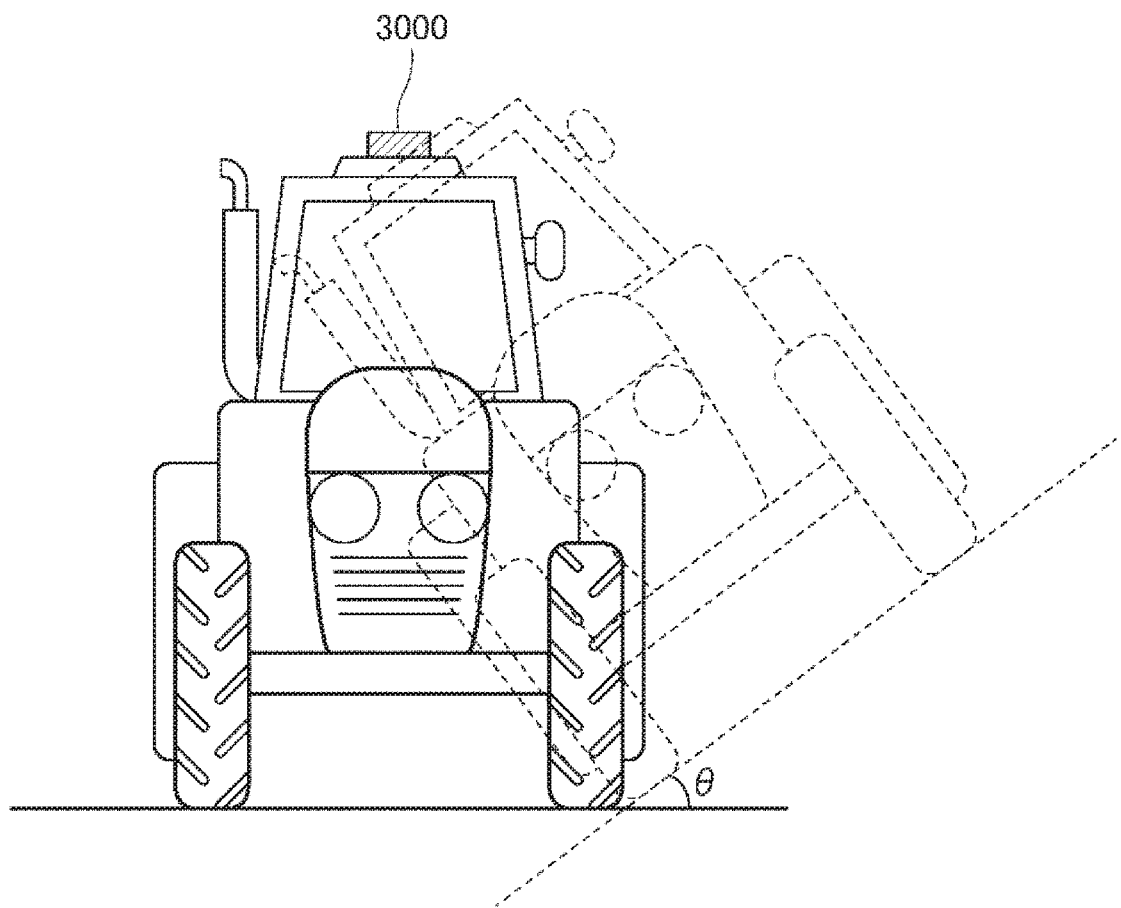
FIG. 29 is a diagram illustrating an action of the vehicle positioning device illustrated in FIG. 28.

FIG. 28 is a block diagram illustrating the entire system of the vehicle positioning device according to the twenty-first embodiment. FIG. 29 is a diagram illustrating an action of the vehicle positioning device illustrated in FIG. 28.

A vehicle positioning device 3000 illustrated in FIG. 28 is a device which is used in a state of being mounted in a vehicle and is used for positioning the vehicle. The vehicle is not particularly limited. Any of bicycles, automobiles (including four-wheeled vehicles and bikes), trains, airplanes, ships, and the like may be provided. In this embodiment, descriptions will be made on the assumption that the vehicle is a four-wheeled vehicle. The vehicle positioning device 3000 includes an inertial measurement unit (IMU) 3100, an arithmetic processing unit (processor) 3200, a GPS receiving unit (receiver) 3300, a receiving antenna 3400, a position information acquisition unit 3500, a position synthesis unit (synthesizer) 3600, a processing unit (processor) 3700, a communication unit 3800, and a display unit 3900. For example, the above-described inertial measurement unit 2000 can be used as the inertial measurement unit 3100.

The inertial measurement unit 3100 includes a three-axis acceleration sensor 3110 and a three-axis angular rate sensor 3120. The arithmetic processing unit (processor) 3200 receives acceleration data from the acceleration sensor 3110 and angular rate data from the angular rate sensor 3120. The arithmetic processing unit (processor) 3200 performs inertial navigation arithmetic processing on the received data, and thus outputs inertial navigation positioning data (data including an acceleration and an attitude of the vehicle).

The GPS receiving unit (receiver) 3300 receives a signal (GPS carrier wave, satellite signal on which position information is superimposed) from a GPS satellite through the receiving antenna 3400. The position information acquisition unit 3500 outputs GPS positioning data indicating the position (latitude, longitude, and altitude), the speed, and the azimuth of the vehicle positioning device (vehicle) 3000, based on the signal received from the GPS receiving unit 3300 (receiver). The GPS positioning data also includes status data indicating a reception state, a reception time point, or the like.

The position synthesis unit (synthesizer) 3600 calculates the position of the vehicle, specifically, the position of the vehicle travelling on a map, based on inertial navigation positioning data output from the arithmetic processing unit (processor) 3200 and GPS positioning data output from the position information acquisition unit 3500. For example, if the attitude of the vehicle is different by an influence of the inclination of a map, as illustrated in FIG. 29, even though the position of the vehicle, which is included in the GPS positioning data is the same, the vehicle seems to travel at a different position on the map. Therefore, calculating the precise position of the vehicle only with GPS positioning data is not possible. The position synthesis unit (synthesizer) 3600 calculates the position of the vehicle travelling on the map, by using the inertial navigation positioning data (in particular, data regarding the attitude of the vehicle). The determination can be performed relatively easily by calculation using a trigonometric function (inclination θ with respect to the vertical direction).

The processing unit (processor) 3700 performs predetermined processing on position data output from the position synthesis unit (synthesizer) 3600. The resultant is displayed, as a result of the positioning, in the display unit 3900. The position data may be transmitted to an external device by the communication unit 3800.

Hitherto, the vehicle positioning device 3000 is described. As described above, such a vehicle positioning device 3000 includes the inertial measurement unit 3100, the GPS receiving unit (receiving unit (receiver)) 3300 that receives a satellite signal on which position information has been superimposed, from a positioning satellite, the position information acquisition unit (acquisition unit) 3500 that acquires position information of the GPS receiving unit (receiver) 3300 based on the received satellite signal, the arithmetic processing unit (processor) (computation unit) 3200 that calculates the attitude of the vehicle based on inertial navigation positioning data (inertial data) output from the inertial measurement unit 3100, and the position synthesis unit (synthesizer) (calculation unit) 3600 that calculates the position of the vehicle by correcting the position information based on the calculated attitude. Thus, a vehicle positioning device 3000 which is capable of exhibiting the effect of the above-described inertial measurement unit 2000 and has high reliability is obtained.

Twenty-Second Embodiment

Next, an electronic device according to a twenty-second embodiment will be described.

Figure 30:
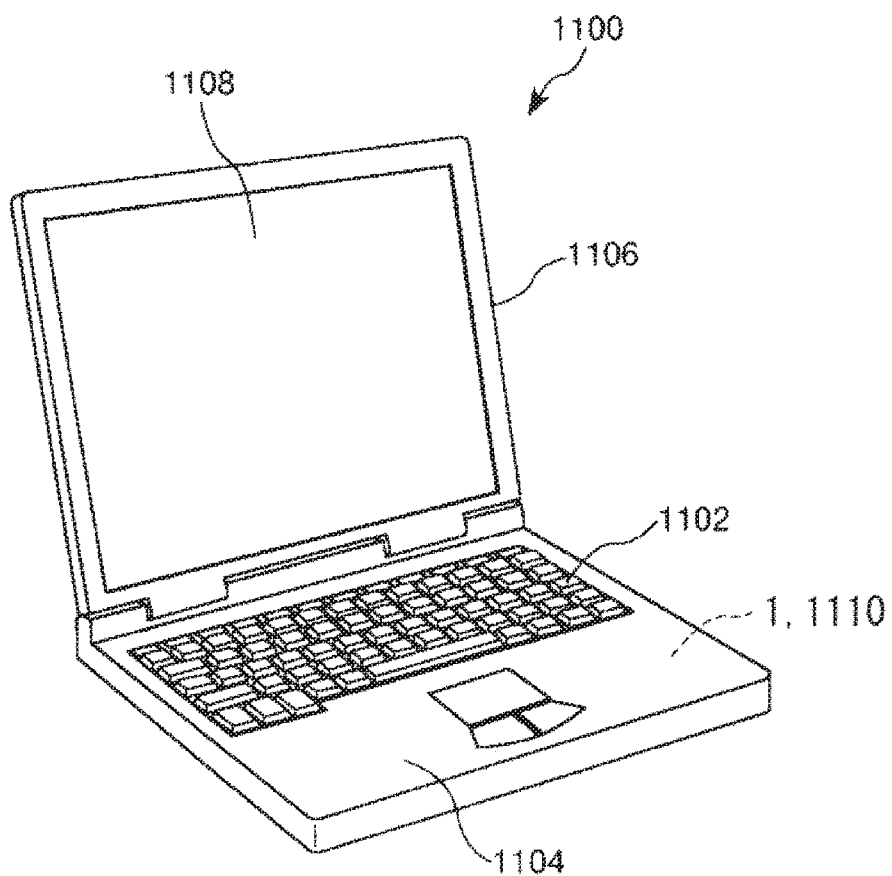
FIG. 30 is a perspective view illustrating an electronic device according to a twenty-second embodiment.

FIG. 30 is a perspective view illustrating the electronic device according to the twenty-second embodiment.

The electronic device in this embodiment is applied to a mobile type (or notebook type) personal computer 1100 illustrated in FIG. 30. The personal computer 1100 includes a main body 1104 including a keyboard 1102 and a display device 1106 including a display unit 1108. The display device 1106 is supported to be allowed to rotate around the main body 1104 by a hinge structure portion. A physical quantity sensor 1 and a control circuit (control unit (controller)) 1110 are mounted in the personal computer 1100. The control circuit 1110 performs control based on a detection signal output from the physical quantity sensor 1. For example, the physical quantity sensor in any of the above-described embodiments can be used as the physical quantity sensor 1.

Such a personal computer (electronic device) 1100 includes the physical quantity sensor 1 and the control circuit (control unit (controller)) 1110 that performs control based on a detection signal output from the physical quantity sensor 1. Therefore, it is possible to exhibit the effect of the above-described physical quantity sensor 1 and to exhibit high reliability.

Twenty-Third Embodiment

Next, an electronic device according to a twenty-third embodiment will be described.

Figure 31:
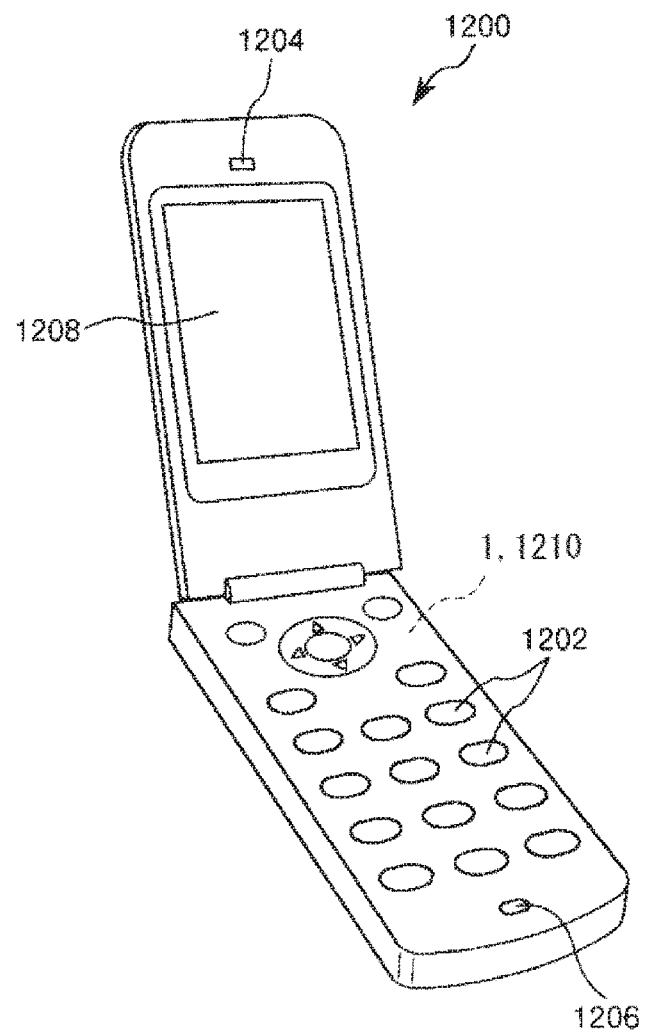
FIG. 31 is a perspective view illustrating an electronic device according to a twenty-third embodiment.

FIG. 31 is a perspective view illustrating the electronic device according to the twenty-third embodiment.

The electronic device in this embodiment is applied to a portable phone 1200 (including a PHS) illustrated in FIG. 31. The portable phone 1200 includes an antenna (not illustrated), a plurality of operation buttons 1202, an earpiece 1204, and a mouthpiece 1206. A display unit 1208 is disposed between the operation button 1202 and the earpiece 1204. A physical quantity sensor 1 and a control circuit (control unit (controller)) 1210 are mounted in the portable phone 1200. The control circuit 1210 performs control based on a detection signal output from the physical quantity sensor 1.

Such a portable phone (electronic device) 1200 includes the physical quantity sensor 1 and the control circuit (control unit (controller)) 1210 that performs control based on a detection signal output from the physical quantity sensor 1. Therefore, it is possible to exhibit the effect of the above-described physical quantity sensor 1 and to exhibit high reliability.

Twenty-Fourth Embodiment

Next, an electronic device according to a twenty-fourth embodiment will be described.

Figure 32:
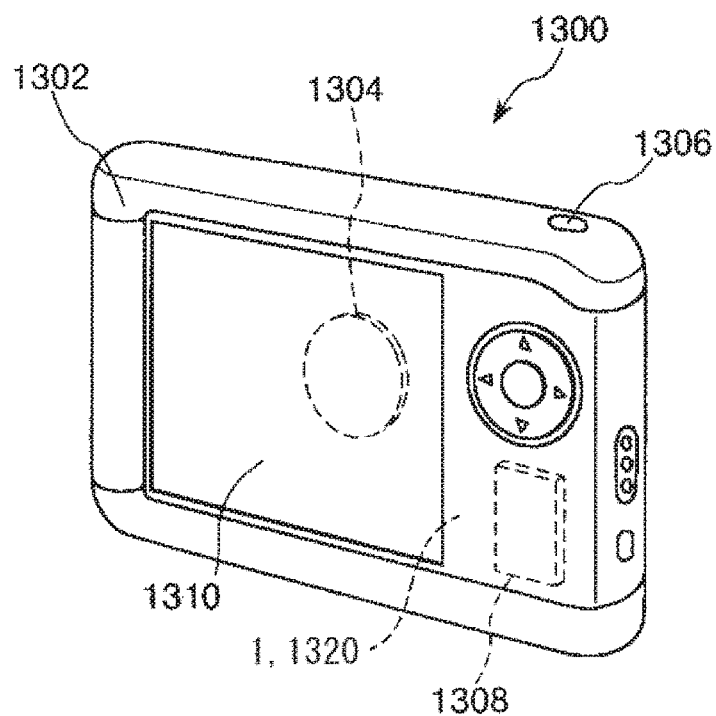
FIG. 32 is a perspective view illustrating an electronic device according to a twenty-fourth embodiment.

FIG. 32 is a perspective view illustrating the electronic device according to the twenty-fourth embodiment.

The electronic device in this embodiment is applied to a digital still camera 1300 illustrated in FIG. 32. The digital still camera 1300 includes a case 1302. A display unit 1310 is provided on the back surface of the case 1302. The display unit 1310 has a configuration in which display is performed based on an imaging signal obtained by a CCD. The display unit 1310 functions as a viewfinder that displays a subject in a form of an electronic image. A light receiving unit (receiver) 1304 that includes an optical lens (optical imaging system), the CCD, and the like is provided on the front surface side (rear surface side in FIG. 36) of the case 1302. If a photographer checks a subject displayed in the display unit 1310 and pushes the shutter button 1306, an imaging signal at this time is transferred from the CCD and stored in the memory 1308. A physical quantity sensor 1 and a control circuit (control unit (controller)) 1320 are mounted in the digital still camera 1300. The control circuit 1320 performs control based on a detection signal output from the physical quantity sensor 1. The physical quantity sensor 1 is used in image stabilization, for example.

Such a digital still camera (electronic device) 1300 includes the physical quantity sensor 1 and the control circuit (control unit (controller)) 1320 that performs control based on a detection signal output from the physical quantity sensor 1. Therefore, it is possible to exhibit the effect of the above-described physical quantity sensor 1 and to exhibit high reliability.

The electronic device can be applied to, for example, devices as follows in addition to the personal computer and the portable phone in the above-described embodiments and the digital still camera in this embodiment: a smartphone, a tablet terminal, a clock (including a smart watch), an ink jet ejecting apparatus (for example, ink jet printer), a laptop type personal computer, a television, a wearable terminal such as a head mount display (HMD), a video camera, a video tape recorder, a car navigation system, a pager, an electronic notebook (including a type having a communication function), electronic dictionary, an electronic calculator, an electronic game machine, a word processor, a workstation, a video phone, a security television monitor, electronic binoculars, a POS terminal, medical equipment (for example, a clinical electronic thermometer, a blood pressure monitor, a blood glucose meter, an electrocardiogram measuring device, an ultrasonic diagnostic device, and an electronic endoscope), a fish finder, various measuring instruments, equipment for a vehicle terminal and a base station, instruments (for example, instruments of vehicles, aircrafts, ships), a flight simulator, a network server, and the like.

Twenty-Fifth Embodiment

Next, a portable electronic device according to a twenty-fifth embodiment will be described.

Figure 33:
FIG. 33 is a plan view illustrating a portable electronic device according to a twenty-fifth embodiment.
Figure 34:
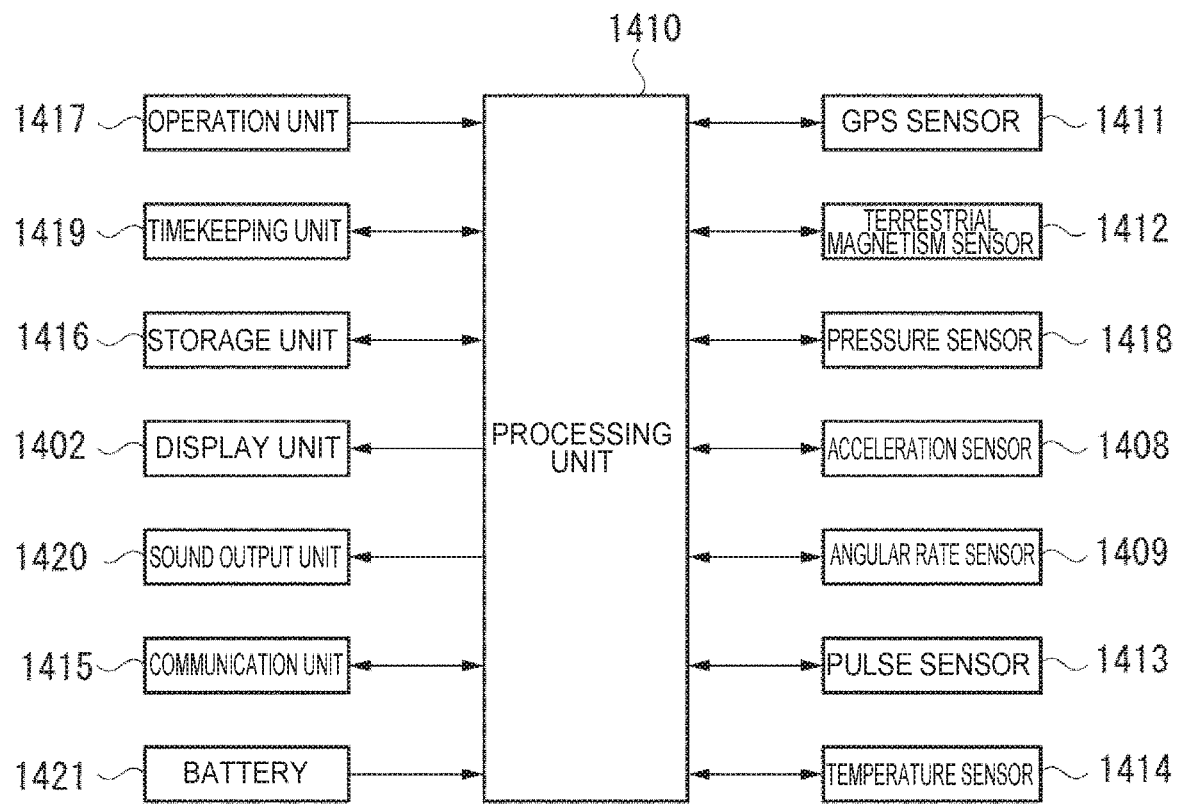
FIG. 34 is a functional block diagram schematically illustrating a configuration of the portable electronic device illustrated in FIG. 33.

FIG. 33 is a plan view illustrating the portable electronic device according to the twenty-fifth embodiment. FIG. 34 is a functional block diagram schematically illustrating a configuration of the portable electronic device illustrated in FIG. 33.

A wristwatch type activity meter (active tracker) 1400 illustrated in FIG. 33 is a wrist device to which the portable electronic device in this embodiment has been applied. The activity meter 1400 is mounted on a part (such as a wrist) (detection target) of a user by a band 1401. The activity meter 1400 includes a display unit 1402 in a manner of digital display and is capable of wireless communication. The above-described physical quantity sensor 1 according to the invention is incorporated into the activity meter 1400, as a sensor that measures an acceleration and a sensor that measures an angular rate.

The activity meter 1400 includes a case 1403 in which the physical quantity sensor 1 is accommodated, a processing unit (processor) 1410 which is accommodated in the case 1403 and processes output data from the physical quantity sensor 1, a display unit 1402 accommodated in the case 1403, and a translucent cover 1404 that closes the opening portion of the case 1403. A bezel 1405 is provided on the outside of the translucent cover 1404. A plurality of operation buttons 1406 and 1407 is provided on the side surface of the case 1403.

As illustrated in FIG. 34, an acceleration sensor 1408 as the physical quantity sensor 1 detects an acceleration in each of three axis directions which intersect each other (ideally, orthogonal to each other), and outputs a signal (acceleration signal) depending on the magnitudes and the directions of the detected accelerations in the three axes. An angular rate sensor 1409 detects an angular rate in each of three axis directions which intersect each other (ideally, orthogonal to each other), and outputs a signal (angular rate signal) depending on the magnitudes and the directions of the detected angular rates in the three axes.

In a liquid crystal display (LCD) constituting the display unit 1402, various types of information as follows are displayed in accordance with various detection modes: for example, position information or the movement quantity obtained by using a GPS sensor 1411 or a terrestrial magnetism sensor 1412; motion information such as the momentum, which has been obtained by using the acceleration sensor 1408, the angular rate sensor 1409, or the like; biometric information regarding a pulse rate obtained by using a pulse sensor 1413 or the like; and time information on the current time. An environmental temperature obtained by a temperature sensor 1414 can also be displayed.

A communication unit 1415 performs various controls for establishing a communication between a user terminal and an information terminal (not illustrated). The communication unit 1415 includes, for example, a transmitter-receiver compatible with short-range wireless communication standards such as Bluetooth (registered trademark) (including Bluetooth Low Energy (BTLE)), Wi-Fi (Wireless Fidelity) (registered trademark), Zigbee (registered trademark), NFC (Near field communication), and ANT+(registered trademark) and a connector compatible with a communication bus standard such as a universal serial bus (USB).

The processing unit (processor) 1410 is configured with, for example, a micro-processing unit (MPU), a digital signal processor (DSP), and an application specific integrated circuit (ASIC). The processing unit (processor) 1410 performs various kinds of processing based on a program stored in a storage unit 1416 and a signal input from an operation unit 1417 (For example, operation buttons 1406 and 1407). The processing performed by the processing unit (processor) 1410 includes data processing on output signals from the GPS sensor 1411, the terrestrial magnetism sensor 1412, the pressure sensor 1418, the acceleration sensor 1408, the angular rate sensor 1409, the pulse sensor 1413, the temperature sensor 1414, and a timekeeping unit 1419, display processing of displaying an image in the display unit 1402, sound output processing of outputting sound to a sound output unit 1420, communication processing of performing a communication with an information terminal via the communication unit 1415, power control processing of supplying power from a battery 1421 to the units, and the like.

Such an activity meter 1400 can have at least functions as follows.

1. Distance: measure the total distance from a point in which measuring starts, by a GPS function having high precision 2. Pace: display the current travel pace through pace distance measurement 3. Average speed: calculate an average speed from a point in which traveling at the average speed start to the current point, and display the calculated average speed 4. Altitude: measure and display the altitude by the GPS function 5. Stride: measure and display the stride even in a tunnel where GPS radio waves do not reach 6. Pitch: measure and display the number of steps per one minute 7. Heart rate: measure and display the heart rate by the pulse sensor 8. Gradient: measure and display the gradient of the ground in training and trail runs in the mountains 9. Auto lap: automatically measure lap time when travelling for a predetermined distance or for a predetermined time 10. Exercise consumed calorie: display calories consumed 11. Number of steps: display the total number of steps from when starting an exercise Such an activity meter (portable electronic device) 1400 includes the physical quantity sensor 1, the case 1403 in which the physical quantity sensor 1 is accommodated, the processing unit (processor) 1410 which is accommodated in the case 1403 and processes output data from the physical quantity sensor 1, the display unit 1402 accommodated in the case 1403, and the translucent cover 1404 that closes the opening portion of the case 1403. Therefore, it is possible to exhibit the effect of the above-described physical quantity sensor 1 and to exhibit high reliability.

As described above, the activity meter 1400 includes the GPS sensor (satellite positioning system) 1411, and thus can measure a movement distance or a movement trajectory of a user. Therefore, an activity meter 1400 having high convenience is obtained.

The activity meter 1400 can be widely applied to a running watch, a runner's watch, a runner's watch for multisports such as duathlon and triathlon, an outdoor watch, and a GPS watch equipped with a satellite positioning system, for example, a GPS.

The above descriptions are made by using a global positioning system (GPS) as the satellite positioning system. However, other global navigation satellite systems (GNSS) may be used. For example, one, or two or more of satellite positioning systems such as the European geostationary-satellite navigation overlay service (EGNOS), the quasi-zenith satellite system (QZSS), the global navigation satellite system (GLONASS), GALILEO, and the BeiDou navigation satellite system (BeiDou) may be used. A geostationary-satellite type satellite-based augmentation system (SBAS) such as the wide area augmentation system (WAAS) and the European geostationary-satellite navigation overlay service (EGNOS) may be used as at least one satellite positioning system.

Twenty-Sixth Embodiment

Next, a vehicle according to a twenty-sixth embodiment will be described.

Figure 35:
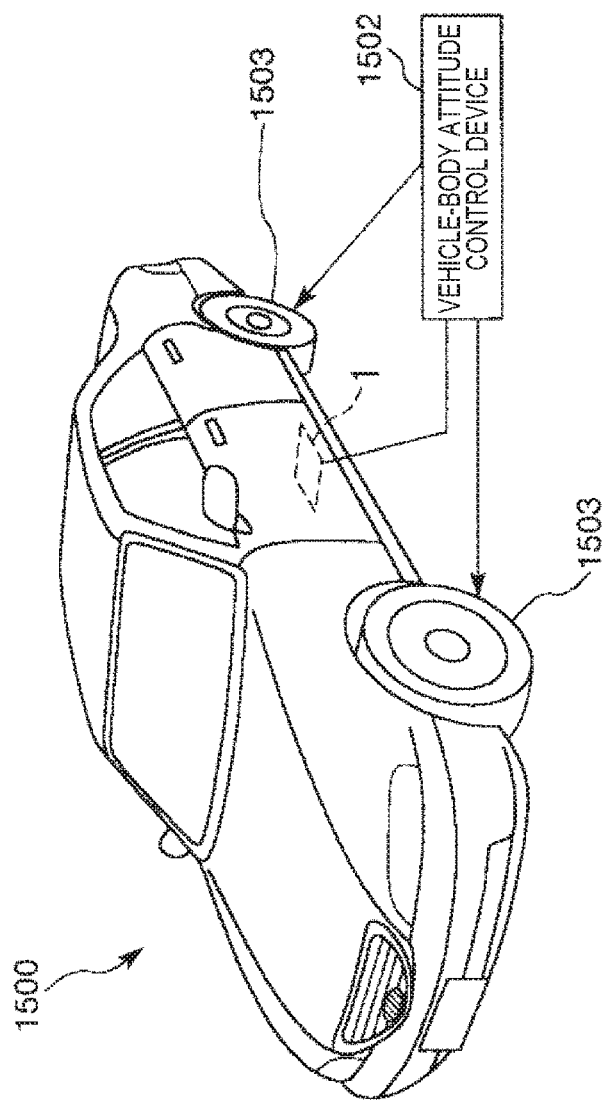
FIG. 35 is a perspective view illustrating a vehicle according to a twenty-sixth embodiment.

FIG. 35 is a perspective view illustrating the vehicle according to the twenty-sixth embodiment.

An automobile 1500 illustrated in FIG. 35 is an automobile to which the vehicle in this embodiment has been applied. In FIG. 35, the automobile 1500 includes a system 1510 which is at least one of an engine system, a brake system, and a keyless entry system. A physical quantity sensor 1 is mounted in the automobile 1500. A detection signal of the physical quantity sensor 1 is supplied to a control device 1502, and the control device 1502 can control the system 1510 based on the detection signal.

Such an automobile (vehicle) 1500 includes the physical quantity sensor 1 and the control device (control unit (controller)) 1502 that performs control based on a detection signal output from the physical quantity sensor 1. Therefore, it is possible to exhibit the effect of the above-described physical quantity sensor 1 and to exhibit high reliability. The automobile 1500 includes the system 1510 which is at least one of the engine system, the brake system, and the keyless entry system. The control device 1502 controls the system 1510 based on the detection signal. Thus, it is possible to control the system 1510 with high precision.

In addition, the physical quantity sensor 1 can be widely applied to an electronic control unit (ECU) in a car navigation system, a car air conditioner, an antilocking brake system (ABS), an air bag, a tire pressure monitoring system (TPMS), an engine controller, a battery monitor of a hybrid automobile or an electric automobile, and the like.

The vehicle is not limited to the automobile 1500. For example, the vehicle can also be applied to airplanes, rockets, artificial satellites, ships, automated guided vehicles (AGV), bipedal walking robots, and unmanned aircrafts such as drones.

Hitherto, the physical quantity sensor, the physical quantity sensor device, the complex sensor device, the inertial measurement unit, the vehicle positioning device, the portable electronic device, the electronic device, and the vehicle are described based on the embodiments in the drawings. However, the invention is not limited thereto. The components can be substituted with any components having the same functions. Any other constituent may be added to the invention. The above-described embodiments may be appropriately combined.

In the above-described embodiments, the configuration in which the physical quantity sensor detects an acceleration is described. However, the physical quantity detected by the physical quantity sensor is not particularly limited. For example, an angular rate or pressure may be detected. The physical quantity sensor may be capable of detecting a plurality of physical quantities. The plurality of physical quantities may be physical quantities having the same type and different detection axes (for example, an acceleration in the X-axis direction, an acceleration in the Y-axis direction, and an acceleration in the Z-axis direction, or an angular rate about the X axis, an angular rate about the Y axis, and an angular rate about the Z axis), or may be physical quantities different from each other (for example, an angular rate about the X axis and an acceleration in the X-axis direction).

What is claimed is:

1. A physical quantity sensor comprising:
    a substrate;
    a support portion fixed to the substrate;
    a movable body which is displaceable in a first direction with respect to the support portion and has a movable electrode; and
    a fixed electrode fixed to the substrate,
    wherein the fixed electrode includes a first fixed electrode, a second fixed electrode, a third fixed electrode, and a fourth fixed electrode,
    the first fixed electrode is positioned on one side of a second direction orthogonal to the first direction with respect to the support portion, and the first fixed electrode includes:

a first fixed electrode finger;

a first fixation portion fixed to the substrate; and a first trunk portion supported by the first fixation portion, the first fixed electrode finger extends from a first part of the first trunk portion such that a longitudinal direction of the first fixed electrode finger is directed along the second direction, and the first trunk portion is located closer to the support portion than the first fixed electrode finger, the second fixed electrode is provided to be separated from the first fixed electrode, and the second fixed electrode includes:

a second fixed electrode finger;

a second fixation portion fixed to the substrate; and a second trunk portion supported by the second fixation portion, the second fixed electrode finger extends from a second part of the second trunk portion such that a longitudinal direction of the second fixed electrode finger is directed along the second direction, the second fixed electrode finger is located closer to the support portion than the second trunk portion, and the second part of the second trunk portion is located closer to the support portion than the first part of the first trunk portion, the third fixed electrode is positioned on the other side of the second direction with respect to the support portion, and the third fixed electrode includes:

a third fixed electrode finger;

a third fixation portion fixed to the substrate; and a third trunk portion supported by the third fixation portion, the third fixed electrode finger extends from a third part of the third trunk portion such that a longitudinal direction of the third fixed electrode finger is directed along the second direction, and the third trunk portion is located closer to the support portion than the third fixed electrode finger, the fourth fixed electrode is provided to be separated from the third fixed electrode, and the fourth fixed electrode includes:

a fourth fixed electrode finger;

a fourth fixation portion fixed to the substrate; and a fourth trunk portion supported by the fourth fixation portion, the fourth fixed electrode finger extends from a fourth part of the fourth trunk portion such that a longitudinal direction of the fourth fixed electrode finger is directed along the second direction, the fourth fixed electrode finger is located closer to the support portion than the fourth trunk portion, and the fourth part of the fourth trunk portion is located closer to the support portion than the third part of the third trunk portion, the movable electrode includes a first movable electrode, a second movable electrode, a third movable electrode, and a fourth movable electrode, the first movable electrode has a first movable electrode finger provided to face the first fixed electrode finger in the first direction, the second movable electrode has a second movable electrode finger provided to face the second fixed electrode finger in the first direction, the third movable electrode has a third movable electrode finger provided to face the third fixed electrode finger in the first direction, and the fourth movable electrode has a fourth movable electrode finger provided to face the fourth fixed electrode finger in the first direction.

2. The physical quantity sensor according to claim 1, further comprising:

a spring that connects the support portion and the movable body.

3. The physical quantity sensor according to claim 2, wherein the first movable electrode finger faces toward the first fixed electrode finger from one side of the first direction, the second movable electrode finger faces toward the second fixed electrode finger from the other side of the first direction, the third movable electrode finger faces toward the third fixed electrode finger from the one side of the first direction, and the fourth movable electrode finger faces toward the fourth fixed electrode finger from the other side of the first direction.

4. The physical quantity sensor according to claim 3, wherein the first fixed electrode and the third fixed electrode are disposed symmetrically with respect to the support portion, and the second fixed electrode and the fourth fixed electrode are disposed symmetrically with respect to the support portion.

5. The physical quantity sensor according to claim 1, wherein the first movable electrode finger faces toward the first fixed electrode finger from one side of the first direction, the second movable electrode finger faces toward the second fixed electrode finger from the other side of the first direction, the third movable electrode finger faces toward the third fixed electrode finger from the one side of the first direction, and the fourth movable electrode finger faces toward the fourth fixed electrode finger from the other side of the first direction.

6. The physical quantity sensor according to claim 5, wherein the first fixed electrode and the third fixed electrode are disposed symmetrically with respect to the support portion, and the second fixed electrode and the fourth fixed electrode are disposed symmetrically with respect to the support portion.

7. The physical quantity sensor according to claim 6, wherein the first fixed electrode finger and the third fixed electrode finger are electrically connected to each other, and the second fixed electrode finger and the fourth fixed electrode finger are electrically connected to each other.

8. The physical quantity sensor according to claim 5, wherein the first movable electrode and the third movable electrode are disposed symmetrically with respect to the support portion, and the second movable electrode and the fourth movable electrode are disposed symmetrically with respect to the support portion.

9. The physical quantity sensor according to claim 1, wherein the first fixation portion and the second fixation portion are disposed adjacent to each other in the second direction.

10. The physical quantity sensor according to claim 1, wherein the third fixation portion and the fourth fixation portion are disposed adjacent to each other in the second direction.

11. A complex sensor device comprising:
a first physical quantity sensor being the physical quantity sensor according to claim 1; and
a second physical quantity sensor that detects a physical quantity different from that detected by the first physical quantity sensor.

12. An electronic device comprising:
the physical quantity sensor according to claim 1; and
a controller that performs a control based on a detection signal output from the physical quantity sensor.

13. A vehicle comprising:
the physical quantity sensor according to claim 1; and
a controller that performs a control based on a detection signal output from the physical quantity sensor.

14. A physical quantity sensor device comprising:
a physical quantity sensor, the physical quantity sensor being configured with:
a substrate;
a support portion fixed to the substrate;
a movable body which is displaceable in a first direction with respect to the support portion and has a movable electrode; and
a fixed electrode fixed to the substrate; and
a circuit element,
wherein the fixed electrode includes a first fixed electrode, a second fixed electrode, a third fixed electrode, and a fourth fixed electrode,
the first fixed electrode is positioned on one side of a second direction orthogonal to the first direction with respect to the support portion, and the first fixed electrode includes:
a first fixed electrode finger;
a first fixation portion fixed to the substrate; and
a first trunk portion supported by the first fixation portion, the first fixed electrode finger extends from a first part of the first trunk portion such that a longitudinal direction of the first fixed electrode finger is directed along the second direction, and the first trunk portion is located closer to the support portion than the first fixed electrode finger,
the second fixed electrode is provided to be separated from the first fixed electrode, and the second fixed electrode includes:
a second fixed electrode finger;
a second fixation portion fixed to the substrate; and
a second trunk portion supported by the second fixation portion, the second fixed electrode finger extends from a second part of the second trunk portion such that a longitudinal direction of the second fixed electrode finger is directed along the second direction, the second fixed electrode finger is located closer to the support portion than the second trunk portion, and the second part of the second trunk portion is located closer to the support portion than the first part of the first trunk portion,
the third fixed electrode is positioned on the other side of the second direction with respect to the support portion, and the third fixed electrode includes:
a third fixed electrode finger;
a third fixation portion fixed to the substrate; and
a third trunk portion supported by the third fixation portion, the third fixed electrode finger extends from a third part of the third trunk portion such that a longitudinal direction of the third fixed electrode finger is directed along the second direction, and the third trunk portion is located closer to the support portion than the third fixed electrode finger,
the fourth fixed electrode is provided to be separated from the third fixed electrode, and the fourth fixed electrode includes:
a fourth fixed electrode finger;
a fourth fixation portion fixed to the substrate; and
a fourth trunk portion supported by the fourth fixation portion, the fourth fixed electrode finger extends from a fourth part of the fourth trunk portion such that a longitudinal direction of the fourth fixed electrode finger is directed along the second direction, the fourth fixed electrode finger is located closer to the support portion than the fourth trunk portion, and the fourth part of the fourth trunk portion is located closer to the support portion than the third part of the third trunk portion,
the movable electrode includes a first movable electrode, a second movable electrode, a third movable electrode, and a fourth movable electrode,
the first movable electrode has a first movable electrode finger provided to face the first fixed electrode finger in the first direction,
the second movable electrode has a second movable electrode finger provided to face the second fixed electrode finger in the first direction,
the third movable electrode has a third movable electrode finger provided to face the third fixed electrode finger in the first direction, and
the fourth movable electrode has a fourth movable electrode finger provided to face the fourth fixed electrode finger in the first direction.

15. An inertial measurement unit comprising:
a physical quantity sensor, the physical quantity sensor being configured with:
a substrate;
a support portion fixed to the substrate;
a movable body which is displaceable in a first direction with respect to the support portion and has a movable electrode; and
a fixed electrode fixed to the substrate; and
a control circuit that controls driving of the physical quantity sensor,
wherein the fixed electrode includes a first fixed electrode, a second fixed electrode, a third fixed electrode, and a fourth fixed electrode,
the first fixed electrode is positioned on one side of a second direction orthogonal to the first direction with respect to the support portion, and the first fixed electrode includes:
a first fixed electrode finger;
a first fixation portion fixed to the substrate; and
a first trunk portion supported by the first fixation portion, the first fixed electrode finger extends from a first part of the first trunk portion such that a longitudinal direction of the first fixed electrode finger is directed along the second direction, and the first trunk portion is located closer to the support portion than the first fixed electrode finger,
the second fixed electrode is provided to be separated from the first fixed electrode, and the second fixed electrode includes:
a second fixed electrode finger;
a second fixation portion fixed to the substrate; and
a second trunk portion supported by the second fixation portion, the second fixed electrode finger extends from a second part of the second trunk portion such that a longitudinal direction of the second fixed electrode finger is directed along the second direction, the second fixed electrode finger is located closer to the support portion than the second trunk portion, and the second part of the second trunk portion is located closer to the support portion than the first part of the first trunk portion, the third fixed electrode is positioned on the other side of the second direction with respect to the support portion, and the third fixed electrode includes:
- a third fixed electrode finger;
- a third fixation portion fixed to the substrate; and
- a third trunk portion supported by the third fixation portion, the third fixed electrode finger extends from a third part of the third trunk portion such that a longitudinal direction of the third fixed electrode finger is directed along the second direction, and the third trunk portion is located closer to the support portion than the third fixed electrode finger, the fourth fixed electrode is provided to be separated from the third fixed electrode, and the fourth fixed electrode includes:
- a fourth fixed electrode finger;
- a fourth fixation portion fixed to the substrate; and
- a fourth trunk portion supported by the fourth fixation portion, the fourth fixed electrode finger extends from a fourth part of the fourth trunk portion such that a longitudinal direction of the fourth fixed electrode finger is directed along the second direction, the fourth fixed electrode finger is located closer to the support portion than the fourth trunk portion, and the fourth part of the fourth trunk portion is located closer to the support portion than the third part of the third trunk portion, the movable electrode includes a first movable electrode, a second movable electrode, a third movable electrode, and a fourth movable electrode, the first movable electrode has a first movable electrode finger provided to face the first fixed electrode finger in the first direction, the second movable electrode has a second movable electrode finger provided to face the second fixed electrode finger in the first direction, the third movable electrode has a third movable electrode finger provided to face the third fixed electrode finger in the first direction, and the fourth movable electrode has a fourth movable electrode finger provided to face the fourth fixed electrode finger in the first direction.

* * * * *